(12) United States Patent
Yamazaki et al.

(10) Patent No.: US 9,601,635 B2
(45) Date of Patent: Mar. 21, 2017

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Masahiro Takahashi, Kanagawa (JP); Hideyuki Kishida, Kanagawa (JP); Akiharu Miyanaga, Kanagawa (JP); Junpei Sugao, Kanagawa (JP); Hideki Uochi, Kanagawa (JP); Yasuo Nakamura, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/924,857

(22) Filed: Oct. 28, 2015

(65) Prior Publication Data

US 2016/0049520 A1 Feb. 18, 2016

Related U.S. Application Data

(60) Continuation of application No. 14/467,142, filed on Aug. 25, 2014, now Pat. No. 9,177,855, which is a
(Continued)

(30) Foreign Application Priority Data

Oct. 9, 2009 (JP) .................................. 2009-235791

(51) Int. Cl.
*H01L 29/04* (2006.01)
*H01L 29/786* (2006.01)
(Continued)

(52) U.S. Cl.
CPC ...... *H01L 29/7869* (2013.01); *H01L 21/0217* (2013.01); *H01L 21/02164* (2013.01);
(Continued)

(58) Field of Classification Search
CPC .................................................. H01L 29/78606
(Continued)

(56) References Cited

U.S. PATENT DOCUMENTS

| 4,447,272 A | 5/1984 | Saks |
| 5,415,920 A | 5/1995 | Satoh et al. |

(Continued)

FOREIGN PATENT DOCUMENTS

| CN | 001614776 A | 5/2005 |
| CN | 001967803 A | 5/2007 |

(Continued)

OTHER PUBLICATIONS

Nomura.K et al., "Room-Temperature Fabrication of Transparent Flexible Thin-Film Transistors using Amorphous Oxide Semiconductors", Nature, Nov. 25, 2004, vol. 432, pp. 488-492.
(Continued)

*Primary Examiner* — Chandra Chaudhari
(74) *Attorney, Agent, or Firm* — Fish & Richardson P.C.

(57) ABSTRACT

By using a conductive layer including Cu as a long lead wiring, increase in wiring resistance is suppressed. Further, the conductive layer including Cu is provided in such a manner that it does not overlap with the oxide semiconductor layer in which a channel region of a TFT is formed, and is surrounded by insulating layers including silicon nitride, whereby diffusion of Cu can be prevented; thus, a highly reliable semiconductor device can be manufactured. Specifically, a display device which is one embodiment of a
(Continued)

semiconductor device can have high display quality and operate stably even when the size or definition thereof is increased.

12 Claims, 48 Drawing Sheets

Related U.S. Application Data division of application No. 12/898,357, filed on Oct. 5, 2010, now Pat. No. 8,816,349.

(51) Int. Cl.

| | |
|---|---|
| *H01L 21/768* | (2006.01) |
| *H01L 27/12* | (2006.01) |
| *H01L 29/45* | (2006.01) |
| *H01L 29/49* | (2006.01) |
| *H01L 29/66* | (2006.01) |
| *H01L 21/324* | (2006.01) |
| *H01L 21/02* | (2006.01) |

(52) U.S. Cl.
CPC ...... *H01L 21/324* (2013.01); *H01L 21/76801* (2013.01); *H01L 21/76828* (2013.01); *H01L 21/76838* (2013.01); *H01L 27/124* (2013.01); *H01L 27/1225* (2013.01); *H01L 29/45* (2013.01); *H01L 29/4908* (2013.01); *H01L 29/66742* (2013.01); *H01L 29/66969* (2013.01); *H01L 29/78606* (2013.01); *H01L 21/02554* (2013.01); *H01L 21/02565* (2013.01); *H01L 21/02631* (2013.01)

(58) Field of Classification Search
USPC .......................................................... 257/72
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,492,190 B2 | 12/2002 | Yamanaka et al. | |
| 6,563,174 B2 | 5/2003 | Kawasaki et al. | |
| 6,573,564 B2 | 6/2003 | Yamazaki et al. | |
| 6,727,522 B1 | 4/2004 | Kawasaki et al. | |
| 6,987,059 B1 | 1/2006 | Burke et al. | |
| 7,049,190 B2 | 5/2006 | Takeda et al. | |
| 7,061,014 B2 | 6/2006 | Hosono et al. | |
| 7,061,565 B2 | 6/2006 | Kwon et al. | |
| 7,064,346 B2 | 6/2006 | Kawasaki et al. | |
| 7,105,868 B2 | 9/2006 | Nause et al. | |
| 7,170,176 B2 | 1/2007 | Ishikawa et al. | |
| 7,189,992 B2 | 3/2007 | Wager, III et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,187 B2 | 3/2008 | Wager, III et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,435,631 B2 * | 10/2008 | Yang ................... | H01L 27/1288 257/E27.111 |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,524,709 B2 | 4/2009 | Ishikawa et al. | |
| 7,615,495 B2 | 11/2009 | Fujikawa et al. | |
| 7,652,740 B2 | 1/2010 | Hwang et al. | |
| 7,674,650 B2 | 3/2010 | Akimoto et al. | |
| 7,732,819 B2 | 6/2010 | Akimoto et al. | |
| 7,888,207 B2 | 2/2011 | Wager, III et al. | |
| 7,977,169 B2 | 7/2011 | Hirao et al. | |
| 8,202,365 B2 | 6/2012 | Umeda et al. | |
| 8,344,379 B2 | 1/2013 | Fujikawa et al. | |
| 8,415,198 B2 | 4/2013 | Itagaki et al. | |
| 8,502,217 B2 | 8/2013 | Sato et al. | |
| 8,563,977 B2 | 10/2013 | Shimada et al. | |
| 8,642,402 B2 | 2/2014 | Yano et al. | |
| 2001/0046027 A1 | 11/2001 | Tai et al. | |
| 2002/0056838 A1 | 5/2002 | Ogawa | |
| 2002/0119606 A1 | 8/2002 | Hamada et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0039670 A1 | 2/2005 | Hosono et al. | |
| 2005/0127380 A1 | 6/2005 | Kawasaki et al. | |
| 2005/0140265 A1 | 6/2005 | Hirakata | |
| 2005/0151276 A1 | 7/2005 | Jang et al. | |
| 2005/0199959 A1 | 9/2005 | Chiang et al. | |
| 2005/0250308 A1 | 11/2005 | Yamaguchi et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108587 A1 | 5/2006 | Lee et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0148141 A1 | 7/2006 | Seo et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108198 A1 | 5/2008 | Wager, III et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197350 A1 | 8/2008 | Park et al. | |
| 2008/0203387 A1 | 8/2008 | Kang et al. | |
| 2008/0224133 A1 | 9/2008 | Park et al. | |
| 2008/0254569 A1 | 10/2008 | Hoffman et al. | |

(56) References Cited

U.S. PATENT DOCUMENTS

| | | |
|---|---|---|
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2009/0008638 A1 | 1/2009 | Kang et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0180045 A1 | 7/2009 | Yoon et al. |
| 2009/0278122 A1 | 11/2009 | Hosono et al. |
| 2009/0280065 A1 | 11/2009 | Hosono et al. |
| 2010/0025675 A1 | 2/2010 | Yamazaki et al. |
| 2010/0025679 A1 | 2/2010 | Yamazaki et al. |
| 2010/0051934 A1 | 3/2010 | Choung et al. |
| 2010/0051937 A1 | 3/2010 | Kaji et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0049518 A1 | 3/2011 | Noda |
| 2011/0084268 A1 | 4/2011 | Yamazaki et al. |
| 2011/0092017 A1 | 4/2011 | Akimoto et al. |
| 2012/0132911 A1 | 5/2012 | Shimada et al. |

FOREIGN PATENT DOCUMENTS

| | | |
|---|---|---|
| EP | 1737044 A | 12/2006 |
| EP | 1770788 A | 4/2007 |
| EP | 1788633 A | 5/2007 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-326756 A | 12/1995 |
| JP | 08-264794 A | 10/1996 |
| JP | 10-229200 A | 8/1998 |
| JP | 11-505377 | 5/1999 |
| JP | 11-274504 A | 10/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-133422 A | 4/2004 |
| JP | 2004-163901 A | 6/2004 |
| JP | 2004-273614 A | 9/2004 |
| JP | 2004-273732 A | 9/2004 |
| JP | 2005-049832 A | 2/2005 |
| JP | 2005-159326 A | 6/2005 |
| JP | 2006-502597 | 1/2006 |
| JP | 2006-108169 A | 4/2006 |
| JP | 2007-073705 A | 3/2007 |
| JP | 2007-096055 A | 4/2007 |
| JP | 2007-123861 A | 5/2007 |
| JP | 2007-150158 A | 6/2007 |
| JP | 2007-165860 A | 6/2007 |
| JP | 2008-053356 A | 3/2008 |
| JP | 2008-533693 | 8/2008 |
| JP | 2009-099944 A | 5/2009 |
| JP | 2009-141002 A | 6/2009 |
| JP | 2009-158940 A | 7/2009 |
| JP | 2009-167087 A | 7/2009 |
| JP | 2009-231664 A | 10/2009 |
| WO | WO-2004/038757 | 5/2004 |
| WO | WO-2004/114391 | 12/2004 |
| WO | WO-2007/094501 | 8/2007 |
| WO | WO-2008/023553 | 2/2008 |
| WO | WO-2008/096768 | 8/2008 |
| WO | WO-2009/041544 | 4/2009 |
| WO | WO-2009/072532 | 6/2009 |

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nakamura.M et al., "Syntheses and crystal structures of new homologous compounds, indium iron zinc oxides($InFeO_3(ZnO)m$) (m natural number) and related compounds", Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor", Science, May 23, 2003, vol. 300, No. 5623, pp. 1269-1272.

International Search Report (Application No. PCT/JP2010/066463) Dated Dec. 21, 2010.

Written Opinion (Application No. PCT/JP2010/066463) Dated Dec. 21, 2010.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,$YBFE_2O_4$, and $YB_2FE_3O_7$ Types of Structures for Compounds in the $In_2O_3$ and $Sc_2O_3$—$A_2O_3$—BO Systems [A; Fe, Ga, Or Al; B: Mg, Mn, Fe, Ni, Cu, OR Zn]at Temeperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Chern.H et al., "An Analytical Model for the Above-Threshold Characteristics of Polysilicon Thin-Flim Transistors", IEEE Transactions on Electron Devices, Jul. 1, 1995, vol. 42, No. 7, pp. 1240-1246.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007 vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-IN. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 IN. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 Inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma treatment", Appl. Phys. Lett. (Applied Physics letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

(56) References Cited

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Taiwanese Office Action (Application No. 099133862) Dated Apr. 24, 2015.

\* cited by examiner

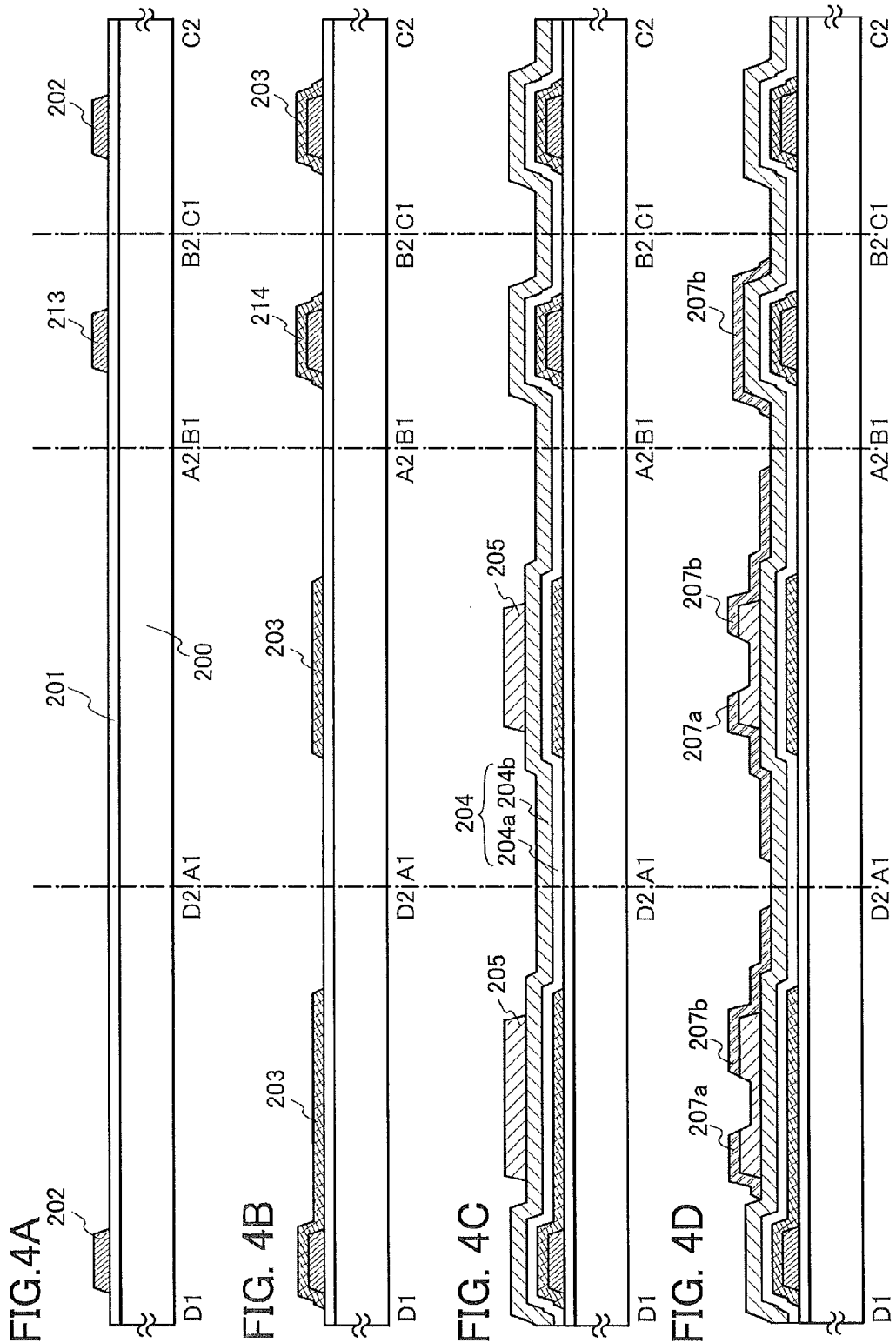

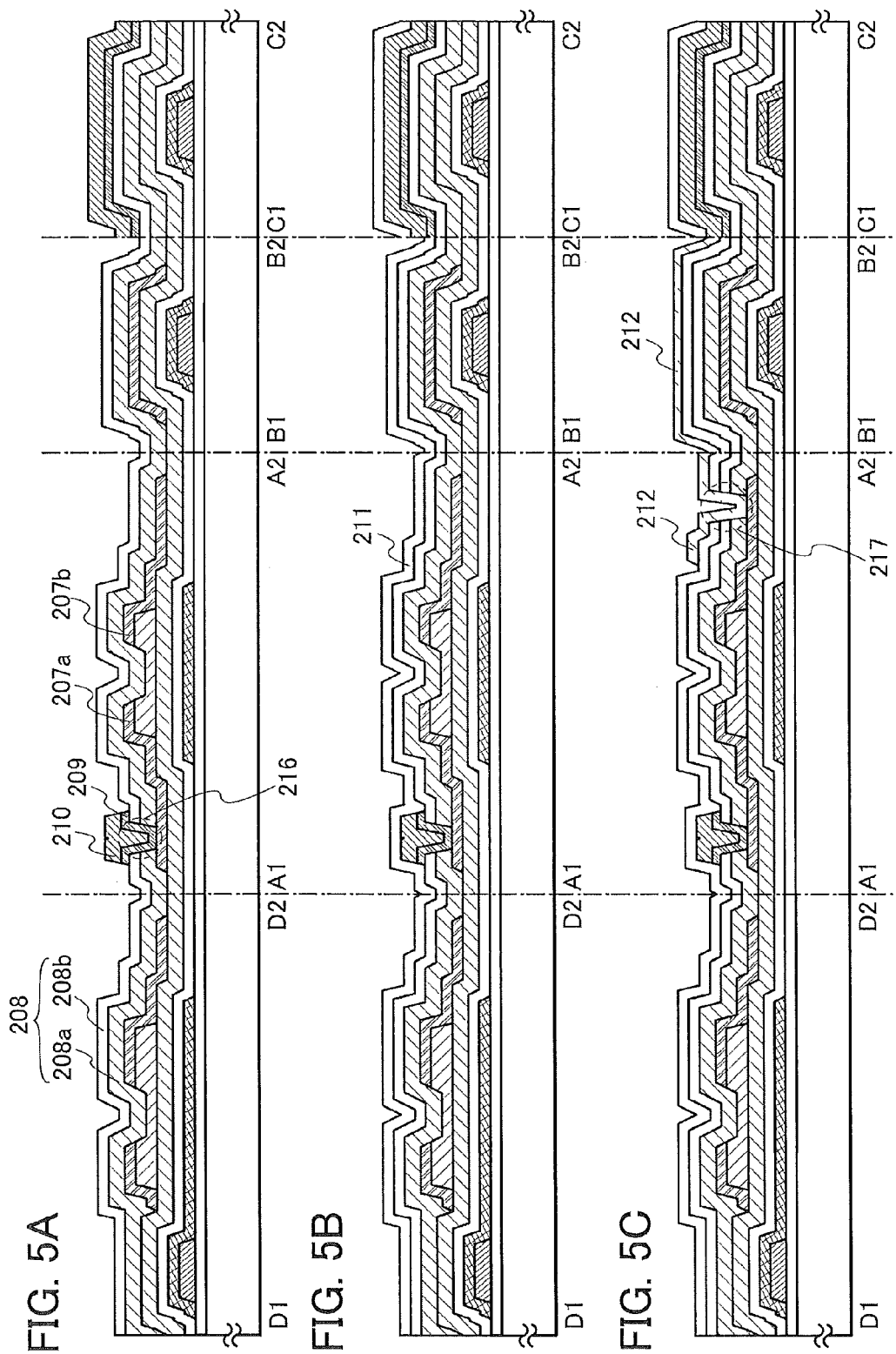

FIG. 12A1
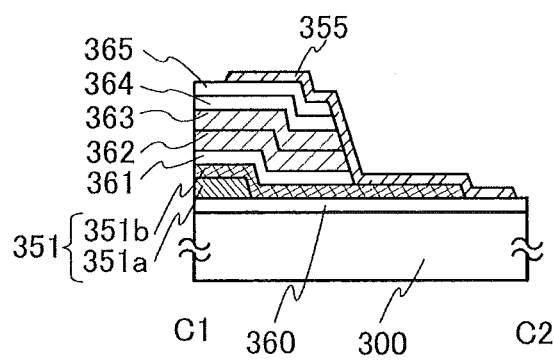
FIG. 12A2
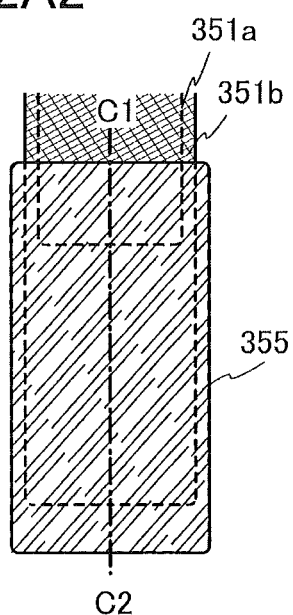
FIG. 12B1
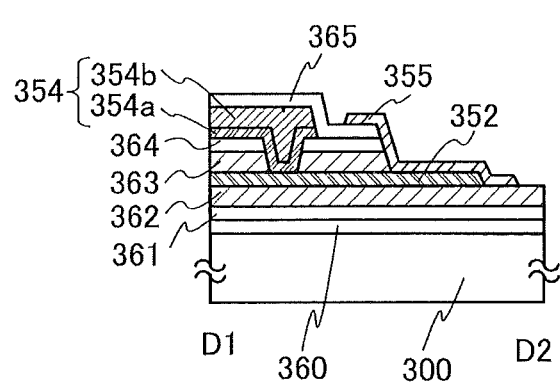
FIG. 12B2
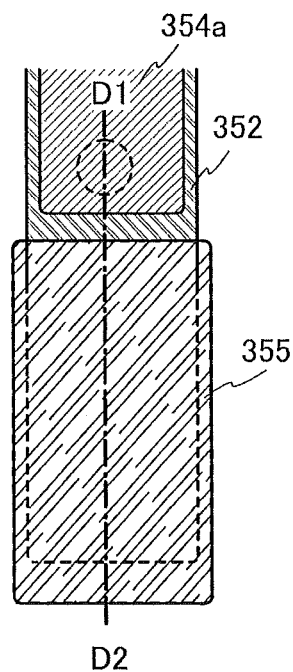

FIG. 13A1
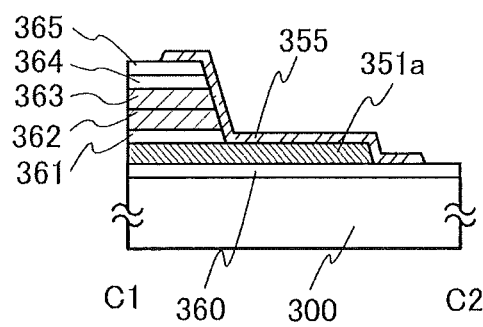
FIG. 13A2
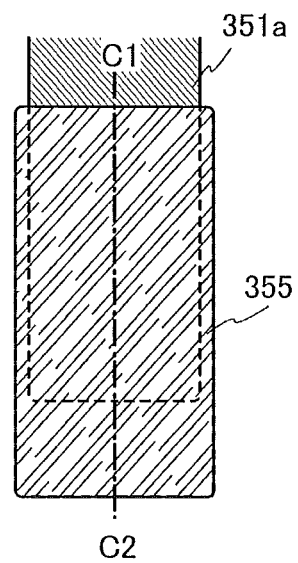
FIG. 13B1
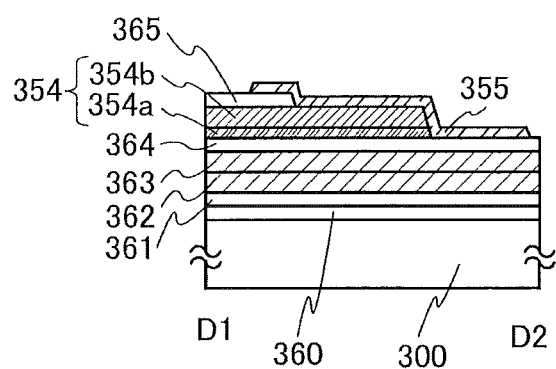
FIG. 13B2
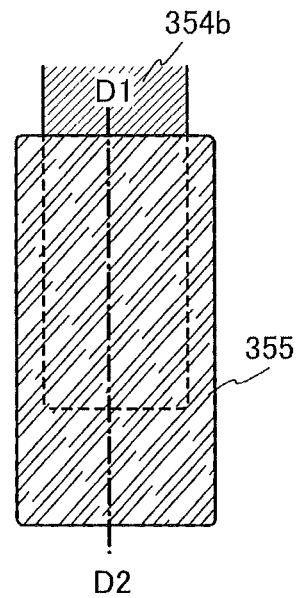

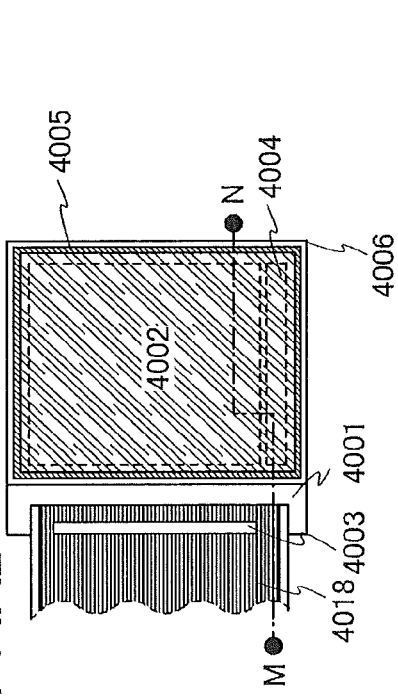
FIG. 14A1
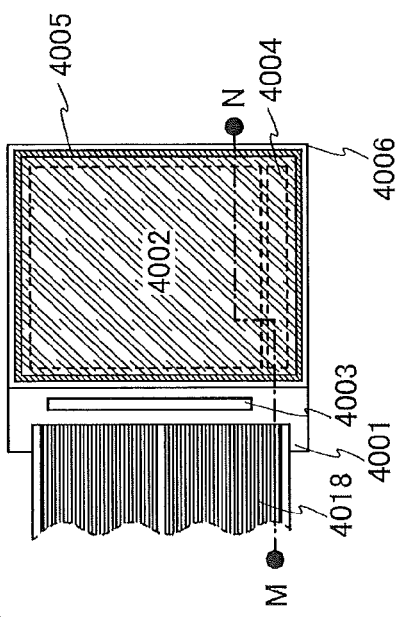
FIG. 14A2
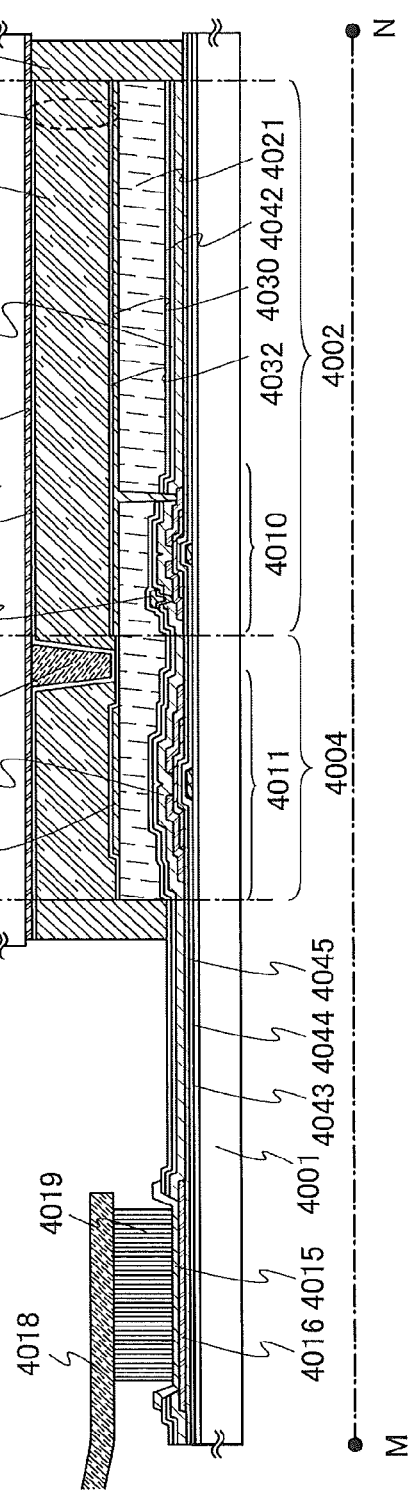
FIG. 14B

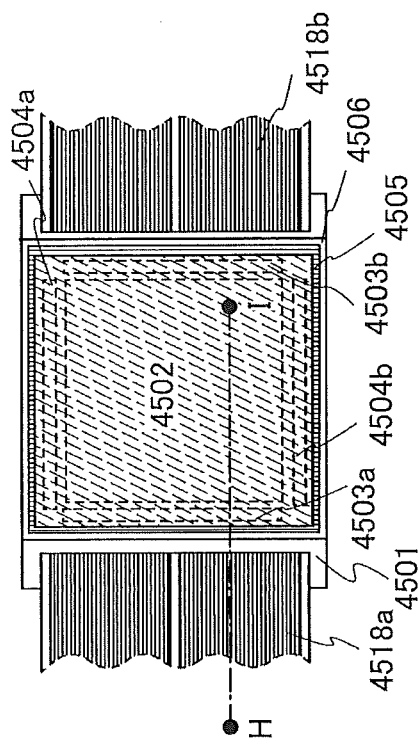
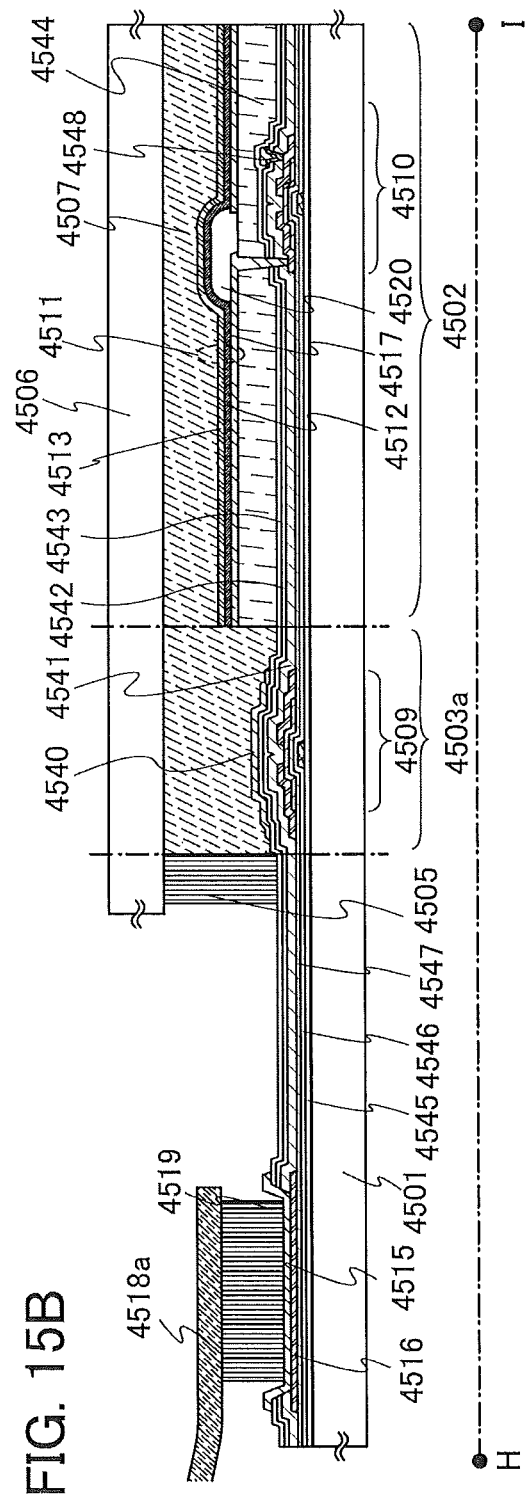
FIG. 15A
FIG. 15B

SEMICONDUCTOR DEVICE AND METHOD FOR MANUFACTURING THE SAME

CROSS-REFERENCE TO RELATED APPLICATIONS

This application is a continuation of U.S. application Ser. No. 14/467,142, filed Aug. 25, 2014, now allowed, which is a divisional of U.S. application Ser. No. 12/898,357, filed Oct. 5, 2010, now U.S. Pat. No. 8,816,349, which claims the benefit of a foreign priority application filed in Japan as Serial No. 2009-235791 on Oct. 9, 2009, all of which are incorporated by reference.

TECHNICAL HELD

The present invention relates to a semiconductor device that includes a thin film transistor (hereinafter also referred to as a TFT) using an oxide semiconductor film and to a method for manufacturing the semiconductor device.

In this specification, a semiconductor device generally means a device which can function by utilizing semiconductor characteristics, and an electro-optical device, a semiconductor circuit, and an electronic appliance are all semiconductor devices.

BACKGROUND ART

In recent years, a technique for forming a thin film transistor (TFT) by using a semiconductor thin film (having a thickness of approximately several nanometers to several hundreds of nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. Various metal oxides are used for a variety of applications. For example, indium oxide is a well-known material and used as a material of a transparent electrode which is needed in a liquid crystal display or the like.

Some metal oxides have semiconductor characteristics. Examples of such metal oxides having semiconductor characteristics include tungsten oxide, tin oxide, indium oxide, zinc oxide, and the like. Thin film transistors in which a channel formation region is formed using such metal oxides having semiconductor characteristics are known (Patent Documents 1 and 2).

Moreover, there is a trend in an active matrix semiconductor device typified by a liquid crystal display device towards a larger screen, e.g., a 60-inch diagonal screen, and further, the development of an active matrix semiconductor device is aimed even at a screen size of a diagonal of 120 inches or more. In addition, a trend in resolution of a screen is toward higher definition, e.g., high-definition (HD) image quality (1366×768) or full high-definition (FHD) image quality (1920×1080), and prompt development of a so-called 4K Digital Cinema display device, which has a resolution of 3840×2048 or 4096×2180, is also pushed.

Increase in screen size or definition tends to increase wiring resistance in a display portion. Increase in wiring resistance causes delay of signal transmission to an end portion of a signal line, drop in voltage of a power supply line, or the like. As a result, deterioration of display quality, such as display unevenness or a defect in grayscale, or increase in power consumption is caused.

In order to suppress increase in wiring resistance, a technique of forming a low-resistance wiring layer with the use of copper (Cu) is considered (e.g., see Patent Documents 3 and 4).

REFERENCE

Patent Document

[Patent Document 1] Japanese Published Patent Application No. 2007-123861
[Patent Document 2] Japanese Published Patent Application No. 2007-96055
[Patent Document 3] Japanese Published Patent Application No. 2004-133422
[Patent Document 4] Japanese Published Patent Application No. 2004-163901

DISCLOSURE OF INVENTION

In order to prevent increase in wiring resistance, the technique of forming a low-resistance wiring layer with the use of copper (Cu) is considered. However, since Cu easily diffuses into a semiconductor or silicon oxide, the operation of a semiconductor device might be unstable and yield might be significantly reduced.

An object of one embodiment of the present invention is to provide a semiconductor device typified by a display device having higher display quality, in which an adverse effect such as voltage drop, a defect in signal writing to a pixel, a defect in grayscale, and the like due to wiring resistance are prevented.

Another object of one embodiment of the present invention is to realize high speed operation of a semiconductor device.

Another object of one embodiment of the present invention is to realize reduction in power consumption of a semiconductor device.

Another object of one embodiment of the present invention is to realize improvement in definition of a semiconductor device.

Another object of one embodiment of the present invention is to provide a thin film transistor which includes an oxide semiconductor film and operates stably and a semiconductor device which includes the thin film transistor.

One embodiment of the present invention disclosed in this specification is a semiconductor device including: a first insulating layer including silicon nitride over a substrate; a first conductive layer including Cu over the first insulating layer; a second conductive layer which is provided over the first conductive layer and covers the first conductive layer; a second insulating layer including silicon nitride over the second conductive layer; a third insulating layer including silicon oxide over the second insulating layer; an island-like oxide semiconductor layer over the third insulating layer; third conductive layers which are provided over the oxide semiconductor layer and function as a source electrode and a drain electrode; a fourth insulating layer including silicon oxide over the third conductive layers; a fifth insulating layer including silicon nitride over the fourth insulating layer; a fourth conductive layer which is electrically connected to one of the third conductive layers functioning as the source electrode and the drain electrode through an opening provided in the fourth insulating layer and the fifth insulating layer; a fifth conductive layer which and includes Cu and overlaps with the fourth conductive layer; a sixth insulating layer including silicon nitride which covers the fifth conductive layer; and a sixth conductive layer which is electrically connected to the other of the third conductive layers functioning as the source electrode and the drain electrode through an opening provided in the fourth insulating layer, the fifth insulating layer, and the sixth insulating layer, wherein the first conductive layer and the fifth conductive layer do not overlap with the oxide semiconductor layer.

Note that the first conductive layer or the fifth conductive layer preferably includes at least one element selected from W, Ta, Mo, Ti, Cr, Zr, and Ca. In addition, the second conductive layer preferably includes an element with a higher meting point than Cu.

Another embodiment of the present invention disclosed in this specification is a method for manufacturing a semiconductor device, including the steps of: forming a first insulating layer including silicon nitride over a substrate; forming a first conductive layer including Cu over the first insulating layer; forming a second conductive layer over the first conductive layer to cover the first conductive layer; forming a second insulating layer including silicon nitride over the second conductive layer; forming a third insulating layer including silicon oxide over the second insulating layer; forming an island-like oxide semiconductor layer over the third insulating layer; forming third conductive layers functioning as a source electrode and a drain electrode over the island-like oxide semiconductor layer; forming a fourth insulating layer including silicon oxide over the third conductive layers; forming a fifth insulating layer including silicon nitride over the fourth insulating layer; forming a fourth conductive layer which is electrically connected to one of the third conductive layers functioning as the source electrode and the drain electrode through an opening provided in the fourth insulating layer and the fifth insulating layer; forming a fifth conductive layer including Cu which overlaps with the fourth conductive layer; forming a sixth insulating layer including silicon nitride which covers the fifth conductive layer; and forming a sixth conductive layer which is electrically connected to the other of the third conductive layers functioning as the source electrode and the drain electrode through an opening provided in the fourth insulating layer, the fifth insulating layer, and the sixth insulating layer, wherein the oxide semiconductor layer is dehydrated or dehydrogenated by first heat treatment after the oxide semiconductor layer is formed, and wherein the first conductive layer and the fifth conductive layer do not overlap with the oxide semiconductor layer.

Note that it is preferable that the first heat treatment be performed by an RTA method at a temperature of higher than or equal to 400° C. and lower than 750° C. in a rare gas or nitrogen atmosphere. In addition, it is preferable that second heat treatment be performed at a temperature lower than that of the first heat treatment after the fourth insulating layer is formed.

Another embodiment of the present invention disclosed in this specification is a semiconductor device including: a base insulating layer including silicon nitride over a substrate; a gate wiring formed over the base insulating layer and formed using a stack of a conductive layer including Cu and a conductive layer which includes metal with a high melting point and covers the conductive layer including Cu; a gate insulating layer formed over the gate wiring and formed using a stack of an insulating layer including silicon nitride and an insulating layer including silicon oxide; an island-like oxide semiconductor layer over the gate insulating layer; a source electrode and a drain electrode over the island-like semiconductor layer; an interlayer insulating layer formed over the source electrode and the drain electrode and formed using a stack of an insulating layer including silicon oxide and an insulating layer including silicon nitride; a source wiring formed over the interlayer insulating layer and formed using a stack of a barrier layer having conductivity and a conductive layer including Cu which is provided over the barrier layer, wherein the source wiring is electrically connected to the source electrode through an opening provided in the interlayer insulating layer; a passivation layer including silicon nitride over the source wiring; and a conductive layer which is electrically connected to the drain electrode through an opening provided in the passivation layer and the interlayer insulating layer, over the passivation layer, wherein the conductive layer including Cu in the gate wiring and the conductive layer including Cu in the source wiring do not overlap with the semiconductor layer where a channel of a thin film transistor is formed.

Another embodiment of the present invention disclosed in this specification is a semiconductor device including: an active matrix circuit, a driver circuit, and a protection circuit over a substrate, wherein a source wiring, a gate wiring, a common potential wiring, and a power supply line in the active matrix circuit include a wiring layer including Cu, wherein the wiring layer including Cu does not overlap with a semiconductor layer of a thin film transistor in the active matrix circuit, wherein thin film transistors in the driver circuit and the protection circuit are connected without using the wiring layer including Cu, and wherein the wiring layer including Cu is sandwiched between insulating layers including silicon nitride.

For the semiconductor layer, an oxide semiconductor expressed by $InMO_3(ZnO)_m$ (m>0 and m is not a natural number) can be used. Note that M denotes one metal element or a plurality of metal elements selected from Ga, Fe, Ni, Mn, and Co. For example, any of the following is used: an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, and a Zn—O-based oxide semiconductor film.

By using a conductive layer including Cu for a long lead wiring such as a source wiring that transmits a video signal to each pixel TFT, a gate wiring that controls on/off of each pixel TFT, a storage capacitor line, a power supply line which are provided in an active matrix circuit, a power supply line, a common potential line, and a lead line from a terminal portion that performs signal input and output to and from an external portion which are provided in a driver circuit, increase in wiring resistance can be suppressed.

By providing the conductive layer including Cu in such a manner that it does not overlap with the semiconductor layer where a channel region of the TFT is formed, an adverse effect due to diffusion of Cu can be prevented.

By providing insulating layers including silicon nitride over and under the conductive layer including Cu so that the conductive layer including Cu is sandwiched between or surrounded by the insulating layers, diffusion of Cu can be prevented.

Note that a gate in this specification refers to the entire gate electrode and gate wiring or part thereof. The gate wiring is a wiring for electrically connecting a gate electrode of at least one transistor to another electrode or another wiring, and includes a scan line in a display device in its category, for example.

A source refers to the entire source region, source electrode, and source wiring or part thereof. The source region indicates a region in a semiconductor layer, where the resistivity is less than or equal to a given value. The source electrode indicates part of a conductive layer, which is connected to the source region. The source wiring is a wiring for electrically connecting a source electrode of at least one transistor to another electrode or another wiring. For example, in the case where a signal line in a display device is electrically connected to a source electrode, the source wiring includes the signal line in its category.

A drain refers to the entire drain region, drain electrode, and drain wiring or part thereof. The drain region indicates a region in a semiconductor layer, where the resistivity is less than or equal to a given value. The drain electrode indicates part of a conductive layer, which is connected to the drain region. The drain wiring is a wiring for electrically connecting a drain electrode of at least one transistor to another electrode or another wiring. For example, in the case where a signal line in a display device is electrically connected to a drain electrode, the drain wiring includes the signal line in its category.

In addition, in this document (the specification, the scope of claims, the drawings, and the like), a source and a drain of a transistor interchange depending on the structure, the operating conditions, or the like of the transistor; therefore, it is difficult to determine which is the source and which is the drain. Therefore, in this document (the specification, the scope of claims, the drawings, and the like), one terminal which is freely selected from the source and the drain is referred to as one of the source and the drain, whereas the other terminal is referred to as the other of the source and the drain.

Note that a light-emitting device in this specification means an image display device, a light-emitting device, or a light source (including a lighting device). In addition, the light-emitting device includes the following modules in its category: a module in which a connector such as a flexible printed circuit (FPC), a tape automated bonding (TAB) tape, or a tape carrier package (TCP) is attached to a light-emitting device; a module having a TAB tape or a TCP at the tip of which a printed wiring board is provided; and a module in which an integrated circuit (IC) is directly mounted on a substrate provided with a light-emitting element by a chip on glass (COG) method.

In a semiconductor device typified by a display device, by using a highly reliable thin film transistor which includes an oxide semiconductor film and has favorable electric characteristics and a source wiring and a gate wiring which are formed using a conductive layer including Cu, favorable display can be performed even on a large-sized screen in which the area of a pixel portion is increased. According to an embodiment of the present invention, wiring resistance in the pixel portion can be largely reduced; thus, an embodiment of the present invention can be applied to even a large-sized screen such as a 60-inch diagonal screen or a 120-inch diagonal screen. Moreover, an embodiment of the present invention can also be applied to a high-definition screen of full high-definition or 4K Digital Cinema.

BRIEF DESCRIPTION OF DRAWINGS

In the accompanying drawings:

FIGS. 4A to 4D are cross-sectional process views illustrating an embodiment of the present invention;

FIGS. 5A to 5C are cross-sectional process views illustrating an embodiment of the present invention;

FIGS. 12A1 and 12B1 are cross-sectional views and FIGS. 12A2 and 12B2 are plan views illustrating an embodiment of the present invention;

FIGS. 13A1 and 13B1 are cross-sectional views and FIGS. 13A2 and 13B2 are plan views illustrating an embodiment of the present invention;

FIGS. 14A1, 14A2, and 14B illustrate a semiconductor device;

FIGS. 15A and 15B illustrate a semiconductor device;

BEST MODE FOR CARRYING OUT THE INVENTION

Figure 1A:
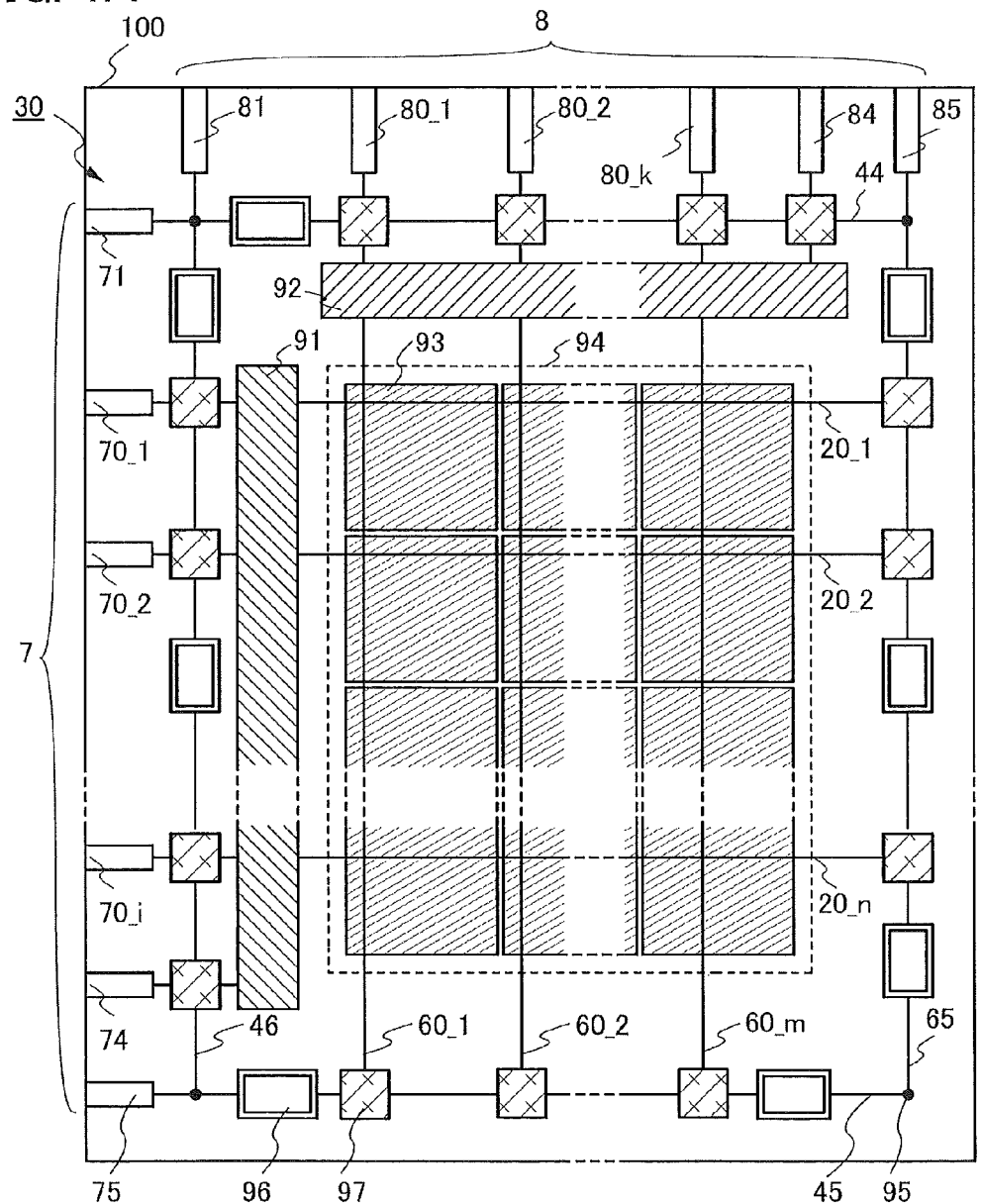
FIG. 1A is a plan view and FIG. 1B is a circuit diagram illustrating an embodiment of the present invention.

Embodiments will be described in detail with reference to the drawings. Note that the present invention is not limited to the following description, and it is easily understood by those skilled in the art that the mode and detail can be changed in various ways without departing from the spirit and scope of the present invention. Therefore, the present invention should not be construed as being limited to the description in the embodiments below. Note that in the structures of the invention described below, the same portions or portions having similar functions are denoted by the same reference numerals in different drawings, and description of such portions is not repeated.

Embodiment 1

In this embodiment, one embodiment of a display device where semiconductor elements that include an oxide semiconductor and are provided in the pixel and the periphery of the pixel portion are formed will be described with reference to FIGS. 1A and 1B.

FIG. 1A illustrates a structure of a display device 30. The display device 30 includes a gate terminal portion 7 and a source terminal portion 8 over a substrate 100. The display device 30 is provided with gate wirings (20_1 to 20_n (note that n is a natural number)) including the gate wiring 20_1 and the gate wiring 202, and source wirings (60_1 to 60_m (note that m is a natural number)) including the source wiring 60_1 and the source wiring 602. Further, in a pixel region 94 of the display device 30, pixels 93 are arranged in matrix. Note that each of the pixels 93 is connected to at least one gate wiring and one source wiring.

Further, the display device 30 includes a common wiring 44, a common wiring 45, a common wiring 46, and a common wiring 65. For example, the common wiring 45 is connected to the common wiring 65 through a connection portion 95. The common wirings are electrically connected to each other to have the same potential.

In addition, the common wiring 44, the common wiring 45, the common wiring 46, and the common wiring 65 are connected to a terminal 71, a terminal 75, a terminal 81, and a terminal 85. The common wirings each include a common connection portion 96 which can be electrically connected to a counter substrate.

Further, each of gate signal line terminals (70_1 to 70_i (note that i is a natural number)) of the gate terminal portion 7 is connected to a gate driver circuit 91 (hereinafter also referred to as a scan line driver circuit) and connected to the common wiring 46 through a protection circuit 97. In addition, a terminal 74 is connected to the gate driver circuit 91 and connects an external power source (not illustrated) to the gate driver circuit 91. Note that each of the gate wirings (20_1 to 20_n (note that n is a natural number)) is connected to the common wiring 65 through the protection circuit 97.

Further, each of source signal line terminals (80_1 to 80_k (note that k is a natural number)) of the source terminal portion 8 is connected to a source driver circuit 92 (hereinafter also referred to as a signal line driver circuit), and connected to the common wiring 44 through the protection circuit 97. In addition, a terminal 84 is connected to the source driver circuit 92 and connects an external power source (not illustrated) to the source driver circuit 92. Each of the source wirings (60_1 to 60_m (note that m is a natural number)) is connected to the common wiring 45 through the protection circuit 97.

The gate driver circuit and the source driver circuit can be formed at the same time as the pixel with the use of a thin film transistor disclosed in this specification. Moreover, one or both of the gate driver circuit and the source driver circuit may be formed over a substrate which is separately prepared with the use of a single crystal semiconductor film or a polycrystalline semiconductor film, and then mounted by a COG method, a wire bonding method, a TAB method, or the like.

Figure 1B:
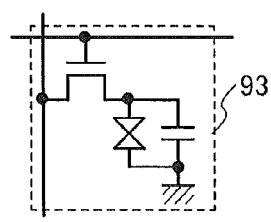

An example of an equivalent circuit that can be applied to the pixel 93 is illustrated in FIG. 1B. The equivalent circuit illustrated in FIG. 1B is an example in the case where a liquid crystal element is used as a display element in the pixel 93.

Figure 2A:
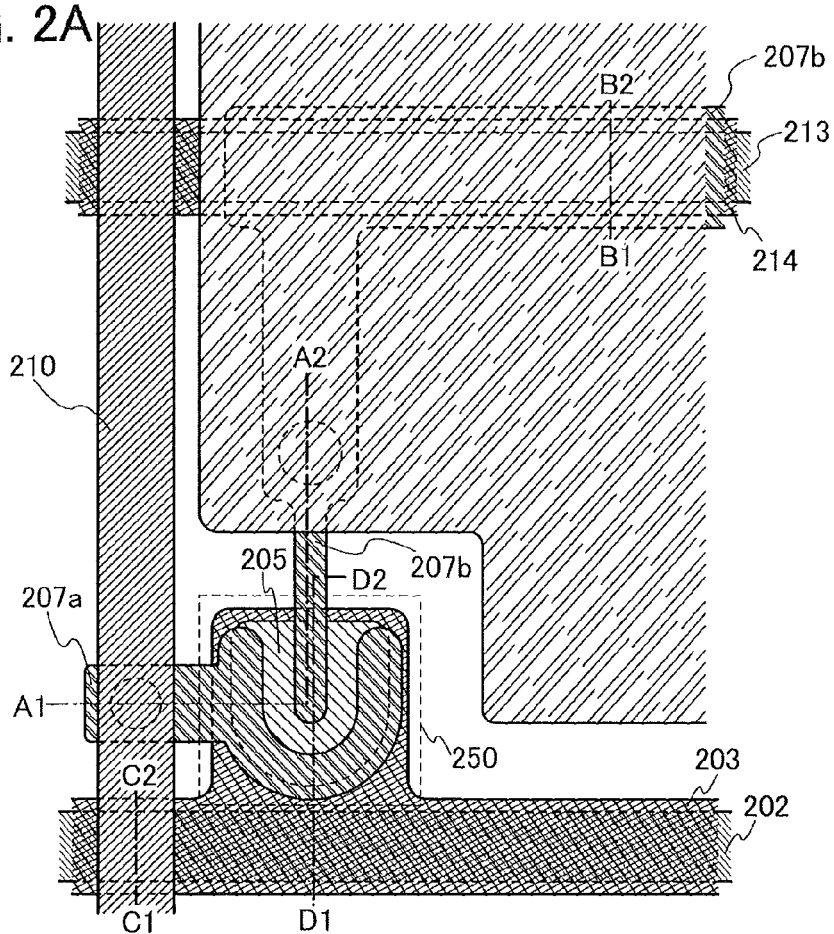
FIG. 2A is a plan view and FIGS. 2B and 2C are cross-sectional views illustrating an embodiment of the present invention.
Figure 2B:
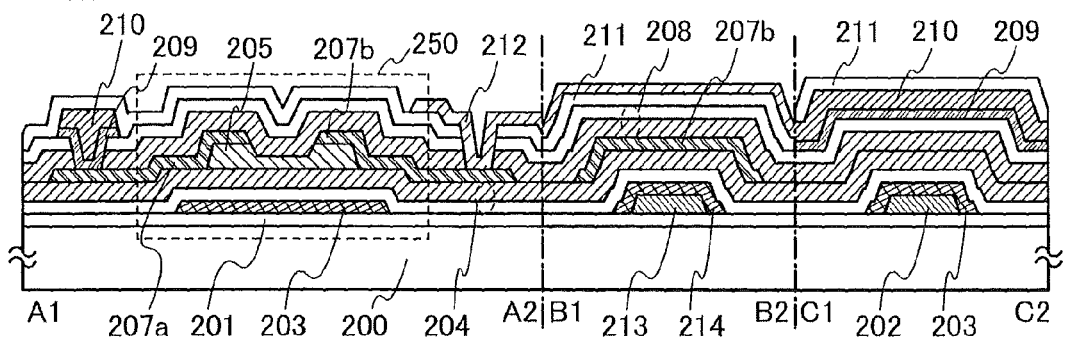
Figure 2C:
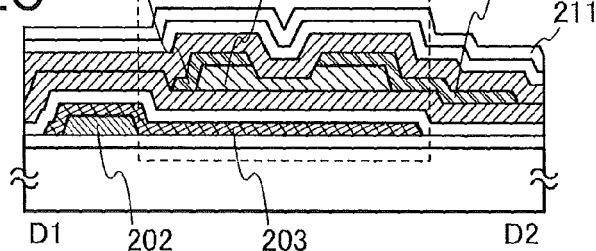

Next, an example of a pixel structure of the display device illustrated in FIGS. 1A and 1B is described with reference to FIGS. 2A to 2C. FIG. 2A is a plan view illustrating a plan structure of the pixel, and FIGS. 2B and 2C are cross-sectional views each illustrating a stacked-layer structure of the pixel. Note that chain lines A1-A2, B1-B2, and C1-C2 in FIG. 2A correspond to cross sections A1-A2, B1-B2, and C1-C2 in FIG. 2B, respectively. Chain line D1-D2 in FIG. 2A corresponds to cross section D1-D2 in FIG. 2C.

In cross section A1-A2 and cross section D1-D2, stacked-layer structures of a thin film transistor 250 used in the pixel portion are illustrated. The thin film transistor 250 is one embodiment of a thin film transistor having a bottom gate structure.

In cross section A1-A2 and cross section D1-D2, an insulating layer 201 provided over a substrate 200, a gate wiring 202 provided over the insulating layer 201, a gate wiring 203 provided over the gate wiring 202, an insulating layer 204 provided over the gate wiring 203, a semiconductor layer 205 provided over the insulating layer 204, a pair of electrodes 207a and 207b provided over the semiconductor layer 205, an insulating layer 208 provided over the electrode 207a, the electrode 207b, and the semiconductor layer 205, a source wiring 209 which is in contact with the electrode 207a through an opening provided in the insulating layer 208, a source wiring 210 provided over the source wiring 209, an insulating layer 211 provided over the source wiring 210, and an electrode 212 which is in contact with the electrode 207b through an opening provided in the insulating layer 211 and the insulating layer 208 are illustrated.

Further, in cross section B1-B2, a stacked-layer structure of a storage capacitor (also referred to as a Cs capacitor) is illustrated. In cross section B1-B2, the insulating layer 201 over the substrate 200, a storage capacitor wiring 213 over the insulating layer 201, a storage capacitor wiring 214 over the storage capacitor wiring 213, the insulating layer 204 over the storage capacitor wiring 214, the electrode 207b over the insulating layer 204, the insulating layer 208 over the electrode 207b, the insulating layer 211 over the insulating layer 208, and the electrode 212 over the insulating layer 211 are illustrated. Here, an oxide semiconductor is preferably used as the semiconductor layer 205. For the details of the oxide semiconductor used for the semiconductor layer 205, Embodiment 2 can be referred to.

Further, in cross section C1-C2, a stacked-layer structure in a wiring intersection of the gate wiring and the source wiring is illustrated. In cross section C1-C2, the insulating layer 201 over the substrate 200, the gate wiring 202 over the insulating layer 201, the gate wiring 203 over the gate wiring 202, the insulating layer 204 over the gate wiring 203, the insulating layer 208 over the insulating layer 204, the source wiring 209 over the insulating layer 208, the source wiring 210 over the source wiring 209, and the insulating layer 211 over the source wiring 210 are illustrated.

Note that Embodiment 2 can be referred to for details of a material and the like of each portion.

Note that in the wiring intersection, a semiconductor layer may be formed between the insulating layer 204 and the insulating layer 208. With such a structure, the distance in the film thickness direction between the gate wiring and the source wiring can be increased, and thus parasitic capacitance in the wiring intersection can be reduced.

Figure 3:
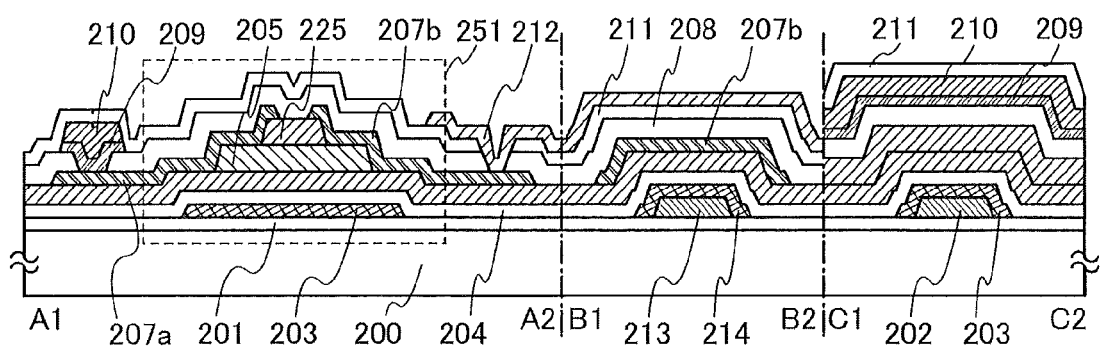
FIG. 3 is a cross-sectional view illustrating an embodiment of the present invention.

In addition, one embodiment of the present invention is not limited to the pixel structure illustrated in FIG. 2B. FIG. 3 illustrates an example of a pixel structure different from that of FIG. 2B. A thin film transistor 251 illustrated in FIG. 3 is one embodiment of a thin film transistor having a bottom gate structure and can be called a channel protective thin film transistor.

The thin film transistor 251 includes the insulating layer 201 provided over the substrate 200, the gate wiring 202 provided over the insulating layer 201, the gate wiring 203 provided over the gate wiring 202, the insulating layer 204 provided over the gate wiring 203, the semiconductor layer 205 provided over the insulating layer 204, a channel protective layer 225 provided over the semiconductor layer 205, the pair of electrodes 207a and 207b provided over the channel protective layer 225 and the semiconductor layer 205, the insulating layer 208 provided over the electrode 207a, the electrode 207b, and the semiconductor layer 205, the source wiring 209 which is in contact with the electrode 207a through an opening provided in the insulating layer 208, the source wiring 210 provided over the source wiring 209, the insulating layer 211 provided over the source wiring 210, and the electrode 212 which is in contact with the electrode 207b through an opening provided in the insulating layer 211 and the insulating layer 208.

A storage capacitor of the pixel which is described as an example in this embodiment is formed so that the insulating layer 204 is sandwiched between the electrode 207b and the storage capacitor wirings 213 and 214 which are formed using the same layers as the gate wirings. Since the electrode 207b is close to the storage capacitor wirings 213 and 214 in the thickness direction as compared to the electrode 212 and the source wiring 210, the electrode 207b is suitable for the storage capacitor.

By forming the gate wiring 202 and the source wiring 210 with the use of a conductive material including Cu, increase in wiring resistance can be prevented. Further, when the gate wiring 203 is formed using a conductive material including an element with a higher melting point than Cu, such as W, Ta, Mo, Ti, or Cr, so as to be in contact with and cover the gate wiring 202, migration of the gate wiring 202 is suppressed and reliability of the semiconductor device can be improved. Furthermore, by providing insulating layers including silicon nitride as the insulating layers over and under the gate wiring 202 including Cu so that the gate wiring 202 including Cu may be sandwiched between or surrounded by the insulating layers, diffusion of Cu included in the gate wiring 202 can be prevented.

In addition, the gate wiring 202 is provided in such a manner that it does not overlap with the semiconductor layer 205 in which a channel of the thin film transistor is formed, and part of the gate wiring 203 which is in contact with the gate wiring 202 is extended to overlap with the semiconductor layer 205 and function as a gate electrode. With such a structure, an influence of Cu included in the gate wiring 202 on the thin film transistor including the semiconductor layer comprising the oxide semiconductor can be further reduced.

At least the insulating layer 204 and the insulating layer 208 are sandwiched between the gate wiring and the source wiring in the wiring intersection, whereby the distance in the thickness direction between the wirings can be increased. As a result, parasitic capacitance in the wiring intersection can be reduced.

Note that this embodiment can be combined with any of the other embodiments in this specification as appropriate.

Embodiment 2

In this embodiment, a manufacturing process of a pixel portion in the display device described in Embodiment 1 will be described with reference to FIGS. 4A to 4D and FIGS. 5A to 5C. Note that cross section A1-A2, cross section B1-B2, cross section C1-C2, and cross section D1-D2 in FIGS. 4A to 4D and FIGS. 5A to 5C are cross-sectional views taken along chain lines A1-A2, B1-B2, C1-C2, and D1-D2 in FIG. 2A, respectively.

First, as a base insulating layer, the insulating layer 201 including silicon nitride is formed to a thickness of greater than or equal to 50 nm and less than or equal to 300 nm, preferably greater than or equal to 100 nm and less than or equal to 200 nm, over the substrate 200. As the substrate 200, in addition to a glass substrate and a ceramic substrate, a plastic substrate or the like with heat resistance to withstand a process temperature in this manufacturing process can be used. In the case where the substrate does not need a light-transmitting property, a metal substrate, such as a stainless steel alloy substrate, provided with an insulating film on its surface may be used. As a glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Further, as the substrate 200, a glass substrate with any of the following sizes can be used: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2950 mm×3400 mm). In this embodiment, aluminoborosilicate glass is used for the substrate 200.

The insulating layer 201 can be formed as a single layer or a stacked layer of a silicon nitride film and/or a silicon nitride oxide film. Note that in this specification, silicon nitride oxide refers to silicon that includes more nitrogen than oxygen and, in the case where measurements are performed using Rutherford backscattering spectrometry (RBS) and hydrogen forward scattering spectrometry (HFS), includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. The insulating layer 201 can be formed by a sputtering method, a CVD method, a coating method, a printing method, or the like as appropriate. In this embodiment, a 100-nm-thick silicon nitride film is formed as the insulating layer 201. Note that the film may be doped with phosphorus (P) or boron (B).

Then, a conductive film including Cu is formed to a thickness of greater than or equal to 100 nm and less than or equal to 500 nm, preferably greater than or equal to 200 nm and less than or equal to 300 nm, over the insulating layer 201 by a sputtering method, a vacuum evaporation method, or a plating method. A mask is formed over the conductive film by a photolithography method, an inkjet method, or the like and the conductive film is etched using the mask; thus, the gate wiring 202 and the storage capacitor wiring 213 can be formed.

In order to improve adhesion of the gate wiring 202, a metal layer including W, Ta, Mo, Ti, Cr, or the like, an alloy layer including any of these in combination, or a layer of a nitride or an oxide of any of these may be formed between the insulating layer 201 and the gate wiring 202.

Further, in the formation of the conductive film including Cu by a sputtering method, a target material is not limited to a pure Cu material, and a Cu alloy material in which an element such as W, Ta, Mo, Ti, Cr, Al, Zr, or Ca is added alone or in combination to Cu at 10 weight % or less, preferably 2 weight % or less, can be used. By using a Cu alloy material, adhesion of a Cu wiring can be improved or migration such as hillocks can be less likely to occur.

A rare gas typified by Ar can be used as a sputtering gas; if a rare gas to which oxygen is added is used as a sputtering gas, Cu oxide is formed at the interface with the underlying layer, whereby adhesion can be improved. At this time, by using a target material to which an element which is oxidized more easily than Cu is added, adhesion can be further improved. Note that since Cu oxide has higher resistance than Cu, it is preferable that a rare gas to which oxygen is added be used as a sputtering gas only at the beginning of sputtering, and then only a rare gas be used for sputtering.

Note that a photomask is not used when the resist mask is formed by an inkjet method, which results in reducing manufacturing cost. Further, when a conductive nanopaste of copper or the like is discharged over the substrate by an inkjet method and baked, the gate wiring 202 and the storage capacitor wiring 213 can be formed at low cost.

In this embodiment, a 250-nm-thick Cu film is formed by a sputtering method over the insulating layer 201 and the Cu film is selectively etched using a resist mask formed by a first photolithography step, whereby the gate wiring 202 and the storage capacitor wiring 213 are formed (see FIG. 4A).

Then, a conductive film of an element such as W, Ta, Mo, Ti, or Cr, which has a higher melting point than Cu, or an alloy or the like including a combination of any of these elements is formed to a thickness of greater than or equal to 5 nm and less than or equal to 200 nm, preferably greater than or equal to 10 nm and less than or equal to 100 nm, by a sputtering method, a vacuum evaporation method, or the like over the gate wiring 202. The conductive film is not limited to a single-layer film including any of the above elements and can be a stacked-layer film of two or more layers. In this embodiment, a 200-nm-thick single layer of tungsten is formed as the conductive film. Note that it is preferable that the conductive film have enough heat resistance to withstand at least first heat treatment and second heat treatment performed later.

Further, a transparent conductive oxide including any of indium, tin, and zinc may be used for the conductive film. For example, indium oxide ($In_2O_3$) or an indium oxide-tin oxide alloy ($In_2O_3$—$SnO_2$, abbreviated to ITO) is preferably used. Alternatively, a transparent conductive oxide to which an insulating oxide such as silicon oxide is added may be used. When a transparent conductive oxide is used for the conductive film, the aperture ratio of the display device can be improved.

Then, a mask is formed over the conductive film by a photolithography method, an inkjet method, or the like, and then the conductive film is etched using the mask; thus, the gate wiring 203 and the storage capacitor wiring 214 can be formed. In this embodiment, the conductive film is selectively etched using a resist mask formed by a second photolithography step, whereby the gate wiring 203 and the storage capacitor wiring 214 are formed (see FIG. 4B).

A gate wiring and a storage capacitor wiring are formed to have a structure in which a conductive layer including an element having a higher melting point than Cu covers a conductive layer including Cu. With such a structure, migration of the layer including Cu is suppressed and thus reliability of the semiconductor device can be improved. In particular, when a gate wiring of a bottom gate thin film transistor, which is easily affected by heat load of the following steps or stress of stacked films, has the above structure so as to be less affected by them, the reliability of the semiconductor device can be improved.

Then, the insulating layer 204 functioning as a gate insulating layer is formed to a thickness of greater than or equal to 50 nm and less than or equal to 800 nm, preferably greater than or equal to 100 nm and less than or equal to 600 nm, over the gate wiring 203. In this embodiment, the insulating layer 204 is formed by stacking an insulating layer 204a and an insulating layer 204b in this order. A silicon nitride ($SiN_y$ (y>0)) layer is formed as the insulating layer 204a by a sputtering method, and a silicon oxide ($SiO_x$ (x>0)) layer is formed over the insulating layer 204a as the insulating layer 204b; thus, the insulating layer 204 with a thickness of 100 nm is formed.

The insulating layer 204 also functions as a protective layer. By providing insulating layers including silicon nitride as the insulating layer 201 and the insulating layer 204a which are insulating layers located over and under the gate wiring 202 including Cu so that the gate wiring 202 including Cu may be sandwiched between or surrounded by the insulating layers, diffusion of Cu included in the gate wiring 202 can be prevented.

Next, the semiconductor layer 205 is formed over the insulating layer 204. As an oxide semiconductor film to be the semiconductor layer 205, an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. In addition, the oxide semiconductor film can be formed by a sputtering method in a rare gas (typically argon) atmosphere, an oxygen atmosphere, or a mixed atmosphere of a rare gas (typically argon) and oxygen.

In the case of using a sputtering method, deposition may be performed using a target including silicon oxide ($SiO_2$) at greater than or equal to 2 weight % and less than or equal to 10 weight % so that $SiO_x$ (x>0) which inhibits crystallization may be included in the oxide semiconductor film.

Here, deposition is performed using a target for forming an oxide semiconductor film including In, Ga, and Zn (composition ratio: $In_2O_3:Ga_2O_3:ZnO=1:1:1$ [mol %], In:Ga:Zn=1:1:0.5 [at. %]) under conditions where the distance between the substrate and the target is 100 mm, the pressure is 0.6 Pa, the direct-current (DC) power is 0.5 kW, and the atmosphere is an oxygen atmosphere (of an oxygen flow rate of 100%). Note that a pulsed direct-current (DC) power source is preferably used because powder substances (also referred to as particles or dust) generated during deposition can be reduced and the film thickness can be uniform. In this embodiment, as the oxide semiconductor film, an In—Ga—Zn—O-based film is formed by a sputtering method with the use of a target for forming an In—Ga—Zn—O-based oxide semiconductor film.

The filling rate of the target for forming the oxide semiconductor film is higher than or equal to 90% and lower than or equal to 100%, preferably higher than or equal to 95% and lower than or equal to 99.9%. With the use of the target for forming the oxide semiconductor film with a high filling rate, a dense oxide semiconductor film is formed.

The oxide semiconductor film preferably has a thickness of greater than or equal to 5 nm and less than or equal to 30 nm. Note that an appropriate thickness differs depending on an oxide semiconductor material, and the thickness may be set as appropriate depending on the material.

In addition, it is preferable that the oxide semiconductor film be successively formed over the insulating layer 204. A multi-chamber sputtering apparatus used here is provided with a target of silicon or silicon oxide (artificial quarts), and the target for forming the oxide semiconductor film. A deposition chamber provided with the target for forming the oxide semiconductor film is further provided with at least a cryopump as an evacuation unit. Note that a turbo molecular pump may be used instead of the cryopump, and a cold trap may be provided so that moisture or the like may be adsorbed onto an inlet of the turbo molecular pump.

In the deposition chamber which is evacuated with the cryopump, a hydrogen atom, a compound including a hydrogen atom such as $H_2O$, a compound including a carbon atom, and the like are removed, whereby the concentration of impurities included in the oxide semiconductor film formed in the deposition chamber can be reduced.

The oxide semiconductor film may be formed in a state where the substrate is heated. At this time, the substrate temperature is set at higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced.

Examples of a sputtering method include an RF sputtering method in which a high-frequency power source is used as a sputtering power source, a DC sputtering method in which a direct-current power source is used, and a pulsed DC sputtering method in which a bias is applied in a pulsed manner. An RF sputtering method is mainly used in the case of forming an insulating film, and a DC sputtering method is mainly used in the case of forming a metal conductive film.

In addition, there is also a multi-source sputtering apparatus in which a plurality of targets of different materials can be set. With the multi-source sputtering apparatus, films of different materials can be formed to be stacked in the same chamber, or a film can be formed by introducing plural kinds of materials and electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which voltage is also applied to a substrate during deposition.

Note that before the oxide semiconductor film is formed by a sputtering method, reverse sputtering in which an argon gas is introduced and plasma is generated is preferably performed to remove dust attaching to a surface of the insulating layer 204. The reverse sputtering refers to a method in which an RF power source is used for application of voltage to a substrate in an argon atmosphere and plasma is generated in the vicinity of the substrate to modify a surface. Note that instead of an argon atmosphere, a nitrogen atmosphere, a helium atmosphere, an oxygen atmosphere, or the like may be used.

Then, a mask is formed over the oxide semiconductor film by a photolithography method, an inkjet method, or the like and the oxide semiconductor film is selectively etched using the mask to provide the semiconductor layer 205 having an island shape. In this embodiment, the oxide semiconductor film is selectively etched using a resist mask formed by a third photolithography step to be the semiconductor layer 205 having an island shape (see FIG. 4C). Here, the semiconductor layer 205 is etched to have a tapered edge, whereby disconnection of a wiring due to a step shape can be prevented. In the etching, organic acid such as citric acid or oxalic acid can be used for an etchant.

Next, the semiconductor layer 205 is subjected to dehydration or dehydrogenation. The temperature of first heat treatment for dehydration or dehydrogenation is higher than or equal to 400° C. and lower than 750° C. For example, a rapid thermal anneal (RTA) treatment can be performed at 400° C. to 700° C. for 1 minute to 10 minutes, preferably at 650° C. for 3 minutes to 6 minutes, approximately. With an RTA method, dehydration or dehydrogenation can be performed in a short time; therefore, treatment can be performed even at a temperature higher than the strain point of a glass substrate.

As a heat treatment apparatus used for an RTA method, for example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed by thermal radiation of light emitted from the above lamp and by conduction of heat from a gas heated by light emitted from a lamp. As the gas, an inert gas which does not react with an object to be processed by heat treatment, such as nitrogen or a rare gas like argon is used. An LRTA apparatus or a GRTA apparatus may be provided with not only a lamp but also a device for heating an object to be processed by heat conduction or heat radiation from a heater such as a resistance heater.

In the case of performing the first heat treatment with the use of an electric furnace or the like, the heat treatment may be performed for 1 hour or shorter when the temperature thereof is higher than or equal to 425° C., although the heat treatment is performed for longer than 1 hour when the temperature is lower than 425° C. In the first heat treatment, the substrate is introduced into an electric furnace, which is one of heat treatment apparatuses, and heat treatment is performed on the oxide semiconductor layer in a nitrogen atmosphere. Then, the same furnace is used from the heating temperature T at which the oxide semiconductor layer is subjected to dehydration or dehydrogenation to a temperature sufficient to prevent water from entering again; specifically, slow cooling is performed in a nitrogen atmosphere until the temperature drops by 100° C. or more from the heating temperature T. Furthermore, without limitation to a nitrogen atmosphere, dehydration or dehydrogenation can be performed in an atmosphere of a rare gas (such as helium, neon, or argon). The oxide semiconductor layer is not exposed to air, which prevents water and hydrogen from entering the oxide semiconductor layer again; thus, the oxide semiconductor layer having a low concentration of hydrogen is obtained.

In the first heat treatment, it is preferable that water, hydrogen, and the like be not included in nitrogen or a rare gas such as helium, neon, or argon. It is preferable that the purity of nitrogen or a rare gas such as helium, neon, or argon which is introduced into a heat treatment apparatus be 6N (99.9999%) or higher, preferably 7N (99.99999%) or higher (that is, the impurity concentration is 1 ppm or lower, preferably 0.1 ppm or lower).

At this time, in a superficial portion of the semiconductor layer 205, a needle-like microcrystalline layer which is c-axis-orientated in a direction perpendicular to a surface of the layer may be formed. An oxide semiconductor layer having such a structure has a dense crystal region including microcrystal of a needle-like crystal group in its superficial portion; therefore, with the use of the oxide semiconductor layer having such a structure, deterioration of electric characteristics due to change to an n-type, which is caused by entry of moisture to the superficial portion or elimination of oxygen from the superficial portion, can be prevented. Further, since the superficial portion of the oxide semiconductor layer is on the back channel side, preventing the oxide semiconductor layer from being changed to an n-type is also effective for suppression of generation of a parasitic channel.

In addition, when the temperature is lowered from the heating temperature T at which dehydration or dehydrogenation is performed, it is important to prevent the dehydrated or dehydrogenated oxide semiconductor layer from being exposed to air by continuously using a furnace in which dehydration or dehydrogenation is performed, so that water or hydrogen is prevented from entering the oxide semiconductor layer. When a transistor is formed using an i-type (high-resistance) oxide semiconductor layer obtained through dehydration or dehydrogenation, the threshold voltage of the thin film transistor can be positive, so that a switching element having a so-called normally-off property can be realized. It is desirable for a display device that a channel be formed with gate threshold voltage that is a positive value and as close to 0 V as possible.

A gas atmosphere in which the heating temperature T is lowered may be switched to a gas atmosphere different from that in which the temperature is raised to the heating temperature T. For example, cooling may be performed in the furnace where dehydration or dehydrogenation is performed while the furnace is filled with a high-purity oxygen gas, a high-purity $N_2O$ gas, or ultra-dry air (having a dew point of −40° C. or lower, preferably −60° C. or lower) without exposure to the air.

By performing the first heat treatment in the above manner, impurities (such as $H_2O$, H, or OH) included in the semiconductor layer 205 formed using the oxide semiconductor film can be reduced and the oxide semiconductor film can be highly purified. Accordingly, a highly reliable thin film transistor having favorable electric characteristics can be formed.

The first heat treatment for the oxide semiconductor layer can be performed before the oxide semiconductor film is processed into the island-like oxide semiconductor layer. In that case, after the first heat treatment, the substrate is taken out of the heating apparatus and the third photolithography step is performed.

Then, although not illustrated in FIGS. 2A to 2C, FIGS. 3A and 3B, FIGS. 4A to 4D, and FIGS. 5A to 5C, an opening (also referred to as a contact hole) for connecting the gate wiring 203 to the electrode 207a or the electrode 207b which will be described later is formed in the insulating layer 204. The contact hole is formed by forming a mask over the insulating layer 204 by a photolithography method, an inkjet method, or the like, and then selectively etching the insulating layer 204 using the mask. Here, the insulating layer 204 is selectively etched using a resist mask formed by a fourth photolithography step, whereby a contact hole is formed.

Note that the contact hole may be formed by the fourth photolithography step after the formation of the insulating layer 204 and before the formation of the semiconductor layer 205.

Then, a conductive film of W, Ta, Mo, Ti, Cr, or the like or a conductive film of an alloy or the like including a combination of any of these elements is formed to a thickness of greater than or equal to 100 nm and less than or equal to 500 nm, preferably greater than or equal to 200 nm and less than or equal to 300 nm by a sputtering method, a vacuum evaporation method, or the like over the semiconductor layer 205. The conductive film is not limited to a single-layer film including any of the above elements and can be a stacked-layer film of two or more layers. Note that the conductive film preferably has enough heat resistance to withstand at least second heat treatment performed later.

Further, a transparent conductive oxide including any of indium, tin, or zinc may be used for the conductive film. For example, indium oxide ($In_2O_3$) or an indium oxide-tin oxide alloy ($In_2O_3$—$SnO_2$, abbreviated to ITO) is preferably used. Alternatively, a transparent conductive oxide to which an insulating oxide such as silicon oxide is added may be used.

When a transparent conductive oxide is used for the conductive film, the aperture ratio of the display device can be improved.

For the conductive film which is in contact with the semiconductor layer 205 formed using the oxide semiconductor film, a material including metal with high oxygen affinity is preferably used.

As the metal with high oxygen affinity, one or more materials selected from titanium (Ti), manganese (Mn), magnesium (Mg), zirconium (Zr), beryllium (Be), and thorium (Th) are preferable. In this embodiment, a titanium film is used.

When the oxide semiconductor layer and the conductive film with high oxygen affinity are formed in contact with each other, the carrier density in the vicinity of the interface is increased and a low-resistance region is formed, whereby the contact resistance between the oxide semiconductor layer and the conductive film can be reduced. This is because the conductive film with high oxygen affinity extracts oxygen from the oxide semiconductor layer and thus either or both of a layer which includes metal in the oxide semiconductor layer in excess (such a layer is referred to as a composite layer) and an oxidized conductive film are formed in the interface between the oxide semiconductor layer and the conductive film. For example, in a structure where an In—Ga—Zn—O-based oxide semiconductor layer is in contact with a titanium film, an indium-excess layer and a titanium oxide layer are formed in the vicinity of the interface where the oxide semiconductor layer is in contact with the titanium film in some cases. In other cases, one of the indium-excess layer and the titanium oxide layer is formed in the vicinity of the interface where the oxide semiconductor layer is in contact with the titanium film. The indium-excess layer which is an oxygen-deficient In—Ga—Zn—O-based oxide semiconductor layer has high electric conductivity; therefore, the contact resistance between the oxide semiconductor layer and the conductive film can be reduced.

Note that a titanium oxide film having conductivity may be used as the conductive film which is in contact with the oxide semiconductor layer. In that case, in the structure where the In—Ga—Zn—O-based oxide semiconductor layer is in contact with the titanium oxide film, an indium-excess layer might be formed in the vicinity of the interface where the oxide semiconductor layer is in contact with the titanium oxide film.

Note that a phenomenon in which, in a thin film transistor using the above In—Ga—Zn—O-based oxide semiconductor layer as an active layer of the thin film transistor, a layer which includes indium at a higher concentration than the other region (an In-rich layer) and a titanium oxide (TiO$_x$) film are formed in the vicinity of the interface between the In—Ga—Zn—O-based oxide semiconductor layer and metal layers used for a source electrode and a drain electrode will be described in detail in Embodiment 14.

As a formation method of the conductive film, an arc discharge ion plating method or a spray method may be employed. Alternatively, the conductive film may be formed by discharging a conductive nanopaste of silver, gold, copper, or the like by a screen printing method, an inkjet method, or the like and baking the nanopaste.

Then, a mask is formed over the conductive film by a photolithography method, an inkjet method, or the like and the conductive film is etched using the mask; thus, the electrode 207a serving as a source electrode and the electrode 207b serving as the drain electrode can be formed. In this embodiment, a 200-nm-thick Ti film is formed by a sputtering method as the conductive film, and then the conductive film is selectively etched by a wet etching method or a dry etching method using a resist mask formed by a fifth photolithography step, whereby the electrodes 207a and 207b are formed.

By the fifth photolithography step, only a portion of the conductive film which is on and in contact with the oxide semiconductor layer is removed. When an ammonia peroxide mixture (hydrogen peroxide at 31 weight %: ammonia at 28 weight %: water=5:2:2 in a weight ratio), or the like is used as an alkaline etchant so that only the portion of the conductive film which is on and in contact with the oxide semiconductor layer is removed, it is possible to remove the metal conductive film selectively and to leave the oxide semiconductor layer including an In—Ga—Zn—O-based oxide semiconductor.

Further, an exposed region of the oxide semiconductor layer is etched by the fifth photolithography step in some cases, depending on the etching condition. In that case, the thickness of the oxide semiconductor layer in a region between the source electrode layer and the drain electrode layer (a region between reference numerals 207a and 207b) is smaller than the thickness of the oxide semiconductor layer in a region overlapping with the source electrode layer over the gate wiring 203 or the thickness of the oxide semiconductor layer in a region overlapping with the drain electrode layer over the gate wiring 203 (see FIG. 4D).

Next, the insulating layer 208 is formed over the insulating layer 204 and the semiconductor layer 205. The insulating layer 208 does not include impurities such as moisture, hydrogen ions, or OH$^-$ and is formed using an inorganic insulating film which prevents entry of these from the outside. In addition, the insulating layer 208 is formed using an inorganic insulating film which suppresses migration of a layer including Cu which is used as a source wiring formed in a subsequent step. In this embodiment, the insulating layer 208 is formed by stacking an insulating layer 208a and an insulating layer 208b in this order.

An oxide insulating film is used for the insulating layer 208a which is in contact with the semiconductor layer 205. The insulating layer 208a can be formed to a thickness of at least 1 nm by a method with which impurities such as water or hydrogen are not mixed into the oxide insulating film, such as a sputtering method, as appropriate. Typically, a single layer or a stacked layer of any of a silicon oxide film, a silicon nitride oxide film, an aluminum oxide film, an aluminum oxynitride film, and the like is used for the formation.

The substrate temperature in the formation of the insulating layer 208a may be higher than or equal to room temperature and lower than or equal to 300° C., and is 100° C. in this embodiment. The silicon oxide film can be formed by a sputtering method in a rare gas (typically argon) atmosphere, an oxygen atmosphere, or a mixed atmosphere of a rare gas (typically argon) and oxygen. Note that an oxide insulating film formed by a sputtering method is distinctively dense and even a single layer of the oxide insulating film can be used as a protective film for suppressing a phenomenon in which impurities are diffused into a layer in contact therewith. In addition, a target doped with phosphorus (P) or boron (B) can be used so that phosphorus (P) or boron (B) is added to the oxide insulating film.

As a target, a silicon oxide target or a silicon target can be used, and a silicon target is particularly preferable. A silicon oxide film formed by a sputtering method in an atmosphere of oxygen and a rare gas with the use of a silicon target includes a large number of dangling bonds of silicon atoms or oxygen atoms.

Since the insulating layer 208a includes many dangling bonds, impurities included in the semiconductor layer 205 are more likely to diffuse into the insulating layer 208a through the interface where the semiconductor layer 205 is in contact with the insulating layer 208a. Specifically, a hydrogen atom, a compound including a hydrogen atom such as $H_2O$, a compound including a carbon atom, or the like in the semiconductor layer 205 is likely to diffuse and move into the insulating layer 208a and fixed in the insulating layer 208a.

In this embodiment, the insulating layer 208a is deposited by a pulsed DC sputtering method using a sputtering gas with a purity of 6N and a columnar polycrystalline silicon target (the resistivity is 0.01 Ωcm) doped with boron under conditions where the distance between substrate and target (T-S distance) is 89 mm, the pressure is 0.4 Pa, the direct-current (DC) power is 6 kW, and the atmosphere is an oxygen atmosphere (of an oxygen flow rate of 100%). The film thickness thereof is 300 nm.

At this stage, a region where the semiconductor layer 205 is in contact with the insulating layer 208a is formed. A region of the semiconductor layer 205, which overlaps with the gate electrode 203 and is sandwiched between and in contact with the insulating layer 204 and the insulating layer 208a, serves as a channel formation region. In addition, the insulating layer 208a functions as a channel protective layer.

An insulating film including nitrogen is used for the insulating layer 208b which is formed over the insulating layer 208a. The insulating layer 208b is formed to a thickness of at least 1 nm by a method with which impurities such as water or hydrogen are not mixed into the insulating film, such as a sputtering method, as appropriate. Typically, a silicon nitride film, a silicon nitride oxide film, an aluminum nitride film, or the like is used. In this embodiment, a silicon nitride film is formed as the protective insulating layer 208b by an RF sputtering method.

In this embodiment, a 400-nm-thick silicon nitride film is formed as the insulating layer 208b.

Next, second heat treatment (preferably at higher than or equal to 200° C. and lower than or equal to 400° C., for example, at higher than or equal to 250° C. and lower than or equal to 350° C.) is performed in an inert gas atmosphere or in a nitrogen gas atmosphere. Note that the second heat treatment is preferably performed at a lower temperature than the first heat treatment.

For example, the second heat treatment is performed in a nitrogen atmosphere at 250° C. for 1 hour. In the second heat treatment, heating is performed in a state where part of the semiconductor layer 205 is in contact with the insulating layer 208a and other part of the semiconductor layer 205 is in contact with the electrode 207a and the electrode 207b.

When the second heat treatment is performed in a state where the semiconductor layer 205 is in contact with the insulating layer 208a, the region of the semiconductor layer 205 in contact with the insulating layer 208a is brought into an oxygen-excess state. As a result, the semiconductor layer 205 is changed into an i-type (high-resistance) oxide semiconductor layer in the depth direction from the region in contact with the insulating layer 208a.

Specifically, in the semiconductor layer 205, an i-type (high-resistance) region is formed from the interface where the semiconductor layer 205 is in contact with the insulating layer 208a to the insulating layer 204.

Since the i-type (high-resistance) oxide semiconductor layer is formed in the channel formation region of the thin film transistor manufactured in this embodiment, the threshold voltage is a positive value and the thin film transistor behaves as an enhancement-type thin film transistor.

When the second heat treatment is performed on the region where the semiconductor layer 205 is in contact with the electrode 207a and the electrode 207b which are formed using the metal conductive film with high oxygen affinity, oxygen easily moves to the metal conductive film side and the oxide semiconductor layer in the region in contact with the metal conductive film with high oxygen affinity is changed into an n-type. As an example of metal with high oxygen affinity, Ti can be given.

By the second heat treatment, impurities (such as $H_2O$, H, or OH) included in the semiconductor layer 205 formed using the oxide semiconductor can be reduced and the oxide semiconductor film can be highly purified. Accordingly, a highly reliable thin film transistor having favorable electric characteristics can be formed.

The timing of the second heat treatment is not limited to immediately after the formation of the insulating layer 208 as long as it is after the formation of the insulating layer 208.

Then, the opening 216 (also referred to as a contact hole) for connecting the electrode 207a to the source wiring 209 is formed in the insulating layer 208. The contact hole is formed by forming a mask over the insulating layer 208 by a photolithography method, an inkjet method, or the like, and then selectively etching the insulating layer 208 using the mask. In this embodiment, the insulating layer 208 is selectively etched using a resist mask formed by a sixth photolithography step, whereby a contact hole is formed.

Then, a conductive film for the formation of the source wiring 209 is formed using an element such as W, Ta, Mo, Ti, or Cr which has a higher melting point than Cu or an alloy or the like including a combination of any of these elements by a sputtering method, a vacuum evaporation method, or the like with a thickness of greater than or equal to 5 nm and less than or equal to 200 nm, preferably greater than or equal to 10 nm and less than or equal to 100 nm. Alternatively, a film of tantalum nitride, titanium nitride, or the like may be formed by a reactive sputtering method.

Then, a conductive film including Cu is formed to a thickness of greater than or equal to 100 nm and less than or equal to 500 nm, preferably greater than or equal to 200 nm and less than or equal to 300 nm by a sputtering method, a vacuum evaporation method, or a plating method. A mask is formed over the conductive film by a photolithography method, an inkjet method, or the like and the conductive film including Cu and the conductive film for the formation of the source wiring 209 are etched using the mask; thus the source wiring 209 and the source wiring 210 including Cu can be formed.

In this embodiment, a 50-nm-thick titanium nitride film is used as the conductive film for the formation of the source wiring 209 and a 250-nm-thick Cu film is used as the conductive film for the formation of the source wiring 210, and the conductive films are selectively etched using a resist mask formed by a seventh photolithography step, whereby the source wiring 209 and the source wiring 210 are formed (see FIG. 5A).

The source wiring 209 also serves as a barrier layer for preventing diffusion of Cu. By forming a source wiring with a stacked-layer structure having a layer including Cu and a layer including an element which has a higher melting point than Cu, migration of the layer including Cu is suppressed; thus, the reliability of the semiconductor device can be improved. Further, a structure is also acceptable in which another layer including an element which has a higher melting point than Cu is formed over the source wiring 210 so that the layer including Cu is sandwiched between the layers including an element which has a higher melting point than Cu. Note that the source wiring may be a single layer including Cu, depending on the usage environment or the usage condition of the semiconductor device. The layer including Cu can be formed by a method similar to the method for forming the gate wiring 202 to have a structure similar to the structure of the gate wiring 202.

Then, the insulating layer 211 is formed to a thickness of greater than or equal to 50 nm and less than or equal to 300 nm, preferably greater than or equal to 100 nm and less than or equal to 200 nm. The insulating layer 211 can be formed by a method similar to the method for forming the insulating layer 201. The insulating layer 211 also serves as a passivation layer which prevents an influence of contamination substances from the outside on thin film transistors. In this embodiment, a 10-nm-thick silicon nitride film is formed as the insulating layer 211. The insulating layer 211 also serves as a protective layer. By providing insulating layers including silicon nitride as the insulating layers over and under the source wiring 210 including Cu so that the source wiring 210 including Cu may be sandwiched between or surrounded by the insulating layers, diffusion of Cu included in the source wiring 210 can be prevented (see FIG. 5B).

Then, a contact hole for connecting the electrode 207b to the electrode 212 serving as a pixel electrode is formed in the insulating layer 211 and the insulating layer 208. The contact hole is formed by forming a mask over the insulating layer 211 by a photolithography method, an inkjet method, or the like, and then selectively etching the insulating layers 211 and 208 using the mask. In this embodiment, the insulating layers 211 and 208 are selectively etched using a resist mask formed by an eighth photolithography step, whereby a contact hole (the opening 217) is formed.

Then, a light-transmitting conductive film is formed to a thickness of greater than or equal to 30 nm and less than or equal to 200 nm, preferably greater than or equal to 50 nm and less than or equal to 100 nm by a sputtering method, a vacuum evaporation method, or the like. A mask is formed over the conductive film by a photolithography method, an inkjet method, or the like, and then the conductive film is etched using the mask; thus, the electrode 212 which serves as a pixel electrode is formed.

For the light-transmitting conductive film, a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide (hereinafter, also referred to as IZO), or indium tin oxide to which silicon oxide is added can be used.

Alternatively, the light-transmitting conductive film can be formed using a conductive composition including a conductive high molecule (also referred to as a conductive polymer). The pixel electrode formed using a conductive composition preferably has a sheet resistance of 10000 Ω/square or less and a light transmittance of 70% or more at a wavelength of 550 nm. Further, the resistivity of the conductive high molecule included in the conductive composition is preferably 0.1 Ω·cm or less.

In this embodiment, an 80-nm-thick ITO film is formed as the light-transmitting conductive film, and then the light-transmitting conductive film is selectively etched using a resist mask formed by a ninth photolithography step, whereby the electrode 212 which serves as a pixel electrode is formed (see FIG. 5C).

In this embodiment, in the case where the insulating layer 204 and the semiconductor layer 205 are not successively formed, the insulating layer 204 is preferably subjected to heat treatment (at higher than or equal to 400° C. and lower than the strain point of the substrate) in an atmosphere of an inert gas (such as nitrogen, helium, neon, or argon). By this heat treatment, impurities such as hydrogen and water included in the insulating layer 204 can be removed before the formation of the oxide semiconductor film.

A silicon oxide layer, a silicon nitride layer, a silicon oxynitride layer, or a silicon nitride oxide layer may be formed by a plasma CVD method instead of a sputtering method. For example, a silicon oxynitride layer may be formed by a plasma CVD method using $SiH_4$, oxygen, and nitrogen as a deposition gas. The thickness of the insulating layer 204 is greater than or equal to 100 nm and less than or equal to 500 nm. In the case of a stacked-layer structure, a first gate insulating layer with a thickness of greater than or equal to 50 nm and less than or equal to 200 nm and a second gate insulating layer with a thickness of greater than or equal to 5 nm and less than or equal to 300 nm are stacked in this order. When the film formed by a plasma CVD method or the like includes an impurity such as hydrogen or water, the above heat treatment is preferably performed so that the impurity is removed, and then the oxide semiconductor film is formed.

Although the gate insulating layer is selectively etched for formation of the contact hole which reaches a gate wiring layer (not illustrated) by the fourth photolithography step in this embodiment, an embodiment of the present invention is not limited to this method. For example, after the insulating layer 204 is formed, a resist mask is formed over the insulating layer 204 and the contact hole reaching the gate wiring layer may be formed.

Note that a photolithography step using a multi-tone mask can also be applied to this embodiment. A photolithography step using a multi-tone mask will be described with reference to FIGS. 6A to 6D and FIGS. 7A to 7E.

A multi-tone mask is a photomask which can perform three levels of light exposure to obtain an exposed portion, a half-exposed portion, and an unexposed portion. Light has a plurality of intensities after passing through a multi-tone mask. One-time light exposure and development process with a multi-tone mask can form a resist mask with regions of plural thicknesses (typically, two kinds of thicknesses). Accordingly, by using a multi-tone mask, the number of photomasks can be reduced.

Figure 6A:
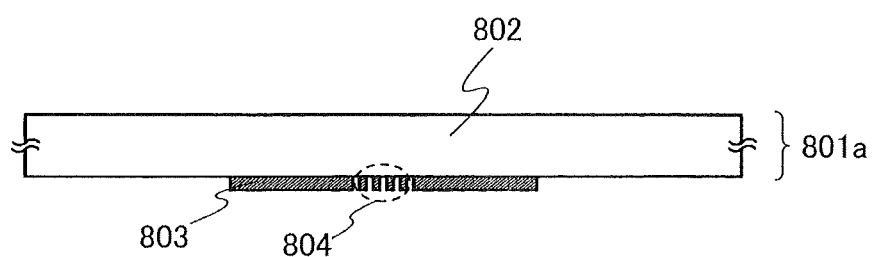
FIGS. 6A to 6D illustrate multi-tone masks.
Figure 6B:
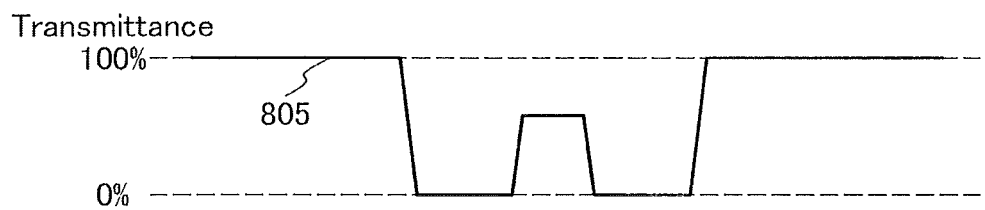
Figure 6C:
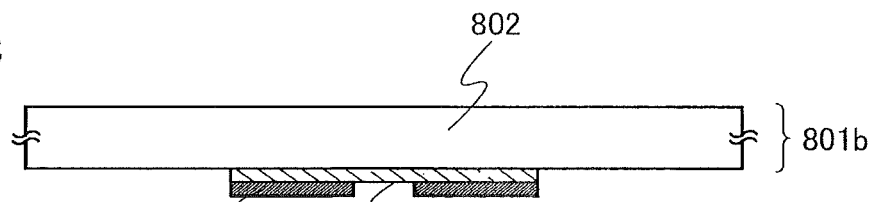

As typical examples of the multi-tone mask, a gray-tone mask 801a illustrated in FIG. 6A and a half-tone mask 801b illustrated in FIG. 6C are given.

As illustrated in FIG. 6A, the gray-tone mask 801a includes a light-transmitting substrate 802, and a light-blocking portion 803 and a diffraction grating 804 which are formed on the light-transmitting substrate 802. The light transmittance of the light-blocking portion 803 is 0%. On the other hand, the diffraction grating 804 has a light-transmitting portion in a slit form, a dot form, a mesh form, or the like with intervals which are equal to or less than the resolution limit of light used for the light exposure; thus, the light transmittance can be controlled. The diffraction grating 804 can have regularly-arranged slits, dots, or meshes, or irregularly-arranged slits, dots, or meshes.

As the light-transmitting substrate 802, a light-transmitting substrate such as a quartz substrate can be used. The light-blocking portion 803 and the diffraction grating 804 can be formed using a light-blocking material which absorbs light, such as chromium or chromium oxide.

When the gray-tone mask 801a is irradiated with light for exposure, a light transmittance 805 of the light-blocking portion 803 is 0% and the light transmittance 805 of a region where neither the light-blocking portion 803 nor the diffraction grating 804 is provided is 100% as shown in FIG. 6B. The light transmittance of the diffraction grating 804 can be controlled in the range of 10% to 70%. The light transmittance of the diffraction grating 804 can be controlled by adjusting the interval and pitch of slits, dots, or meshes of the diffraction grating.

As shown in FIG. 6C, the half-tone mask 801b includes the light-transmitting substrate 802, and a semi-light-transmitting portion 807 and a light-blocking portion 806 which are formed on the light-transmitting substrate 802. The semi-light-transmitting portion 807 can be formed using MoSiN, MoSi, MoSiO, MoSiON, CrSi, or the like. The light-blocking portion 806 can be formed using a light-blocking material which absorbs light, such as chromium or chromium oxide.

Figure 6D:
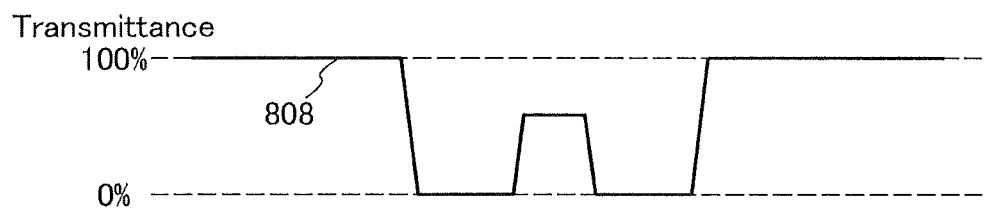

When the half-tone mask 801b is irradiated with light for exposure, a light transmittance 808 of the light-blocking portion 806 is 0% and the light transmittance 808 of a region where neither the light-blocking portion 806 nor the semi-light-transmitting portion 807 is provided is 100% as shown in FIG. 6D. The light transmittance of the semi-light-transmitting portion 807 can be controlled in the range of 10% to 70%. The light transmittance of the semi-light-transmitting portion 807 can be controlled by a material of the semi-light-transmitting portion 807.

Next, with reference to FIGS. 7A to 7E, an example in which the third photolithography step and the fifth photolithography step are replaced with one photolithography step using a multi-tone mask will be described.

By the third photolithography step of this embodiment, the semiconductor layer 205 is formed over the insulating layer 204, and is then processed into an island-like semiconductor layer. In this example, however, the semiconductor layer 205 is not processed into an island-like semiconductor layer and an electrode layer 207 is formed over the semiconductor layer 205 successively to the formation thereof. Then, a resist mask 231 having a depressed portion and a projected portion is formed over the electrode layer 207 using a multi-tone mask (see FIG. 7A).

The resist mask 231 can also be referred to as a resist mask including a plurality of regions (here, two regions) having different thicknesses. In the resist mask 231, a thick region is called a projected portion of the resist mask 231, and a thin region is called a depressed portion of the resist mask 231.

In the resist mask 231, a projected portion is formed in a region where the electrode 207a serving as a source electrode and the electrode 207b serving as a drain electrode which are formed later are formed and a depressed portion is formed in a region between the electrode 207a and the electrode 207b.

Figure 7A:
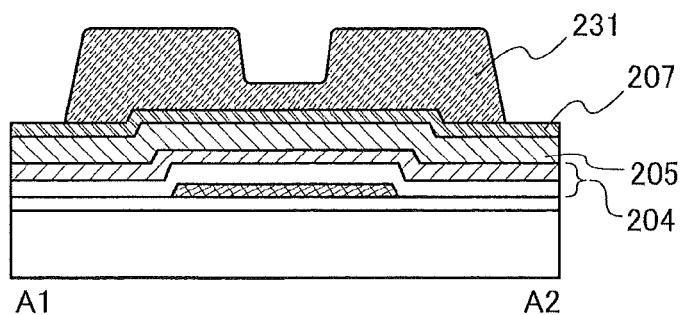
FIGS. 7A to 7E are cross-sectional process views illustrating an embodiment of the present invention.
Figure 7B:
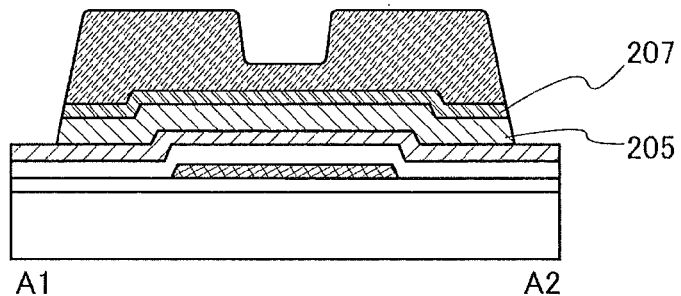
Figure 7C:
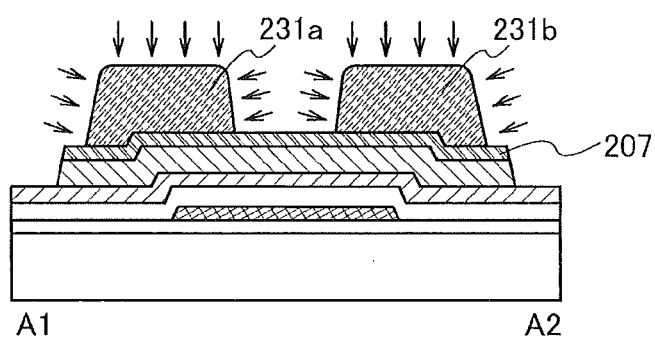
Figure 7D:
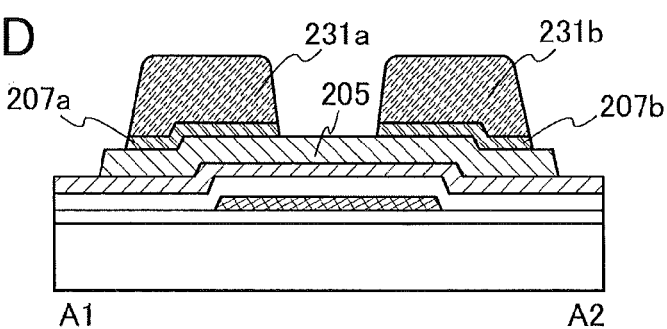
Figure 7E:
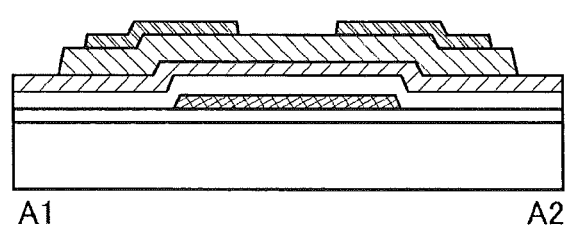

Then, the electrode layer 207 and the semiconductor layer 205 are selectively etched at the same time using the resist mask 231 to form the semiconductor layer 205 having an island shape (see FIG. 7B).

Then, the resist mask 231 is reduced (downsized) to form resist masks 231a and 231b. In order to reduce (downsize) the resist mask, oxygen plasma aching or the like may be performed. When the resist mask is reduced (downsized), part of the electrode layer 207 which is sandwiched between the resist masks 231a and 231b is exposed (see FIG. 7C).

Then, part of the electrode layer 207 which is sandwiched between the resist masks 231a and 231b are selectively etched using the resist masks 231a and 231b to provide the electrode 207a and the electrode 207b. Note that the semiconductor layer 205 is partly etched at this time to be a semiconductor layer having a groove (a depressed portion) in some cases. In addition, edges of the semiconductor layer 205 extend beyond edges of the electrode 207a and the electrode 207b (see FIG. 7D). Then, the resist masks 231a and 231b are removed (see FIG. 7E).

By using the multi-tone mask, a plurality of photolithography steps can be replaced with one photolithography step. Accordingly, the productivity of a semiconductor device can be improved.

In this embodiment, a thin film transistor 252 may be formed to have the following structure. At the time of forming the contact hole for a connection between the electrode 207a and the source wiring 209 by the sixth photolithography step, openings are formed in the insulating layer 204b, the insulating layer 208a, and the insulating layer 208b so as to surround the thin film transistor, and the insulating layer 211 is in contact with the insulating layer 204a through the openings. An example of a cross-sectional view of the thin film transistor 252 is illustrated in FIG. 38.

Figure 38:
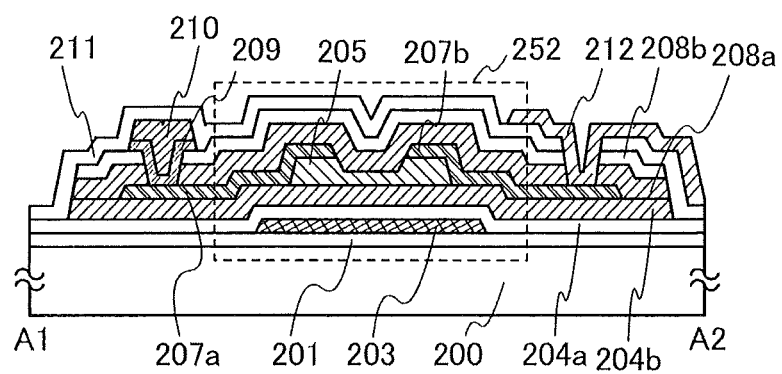
FIG. 38 is a cross-sectional view illustrating an embodiment of the present invention.

The thin film transistor 252 illustrated in FIG. 38 is a channel-etched thin film transistor like the thin film transistor 250 and includes the insulating layer 201 provided over the substrate 200, the gate wiring 202 provided over the insulating layer 201, the gate wiring 203 provided over the gate wiring 202, the insulating layer 204a provided over the gate wiring 203, the insulating layer 204b provided over the insulating layer 204a, the semiconductor layer 205 provided over the insulating layer 204b, the pair of electrodes 207a and 207b provided over the semiconductor layer 205, the insulating layer 208a provided over the electrode 207a, the electrode 207b, and the semiconductor layer 205, the insulating layer 208b provided over the insulating layer 208a, the source wiring 209 which is in contact with the electrode 207a through an opening provided in the insulating layer 208a and the insulating layer 208b, the source wiring 210 provided over the source wiring 209, the insulating layer 211 provided over the source wiring 210, and the electrode 212 which is in contact with the electrode 207b through an opening provided in the insulating layer 211, the insulating layer 208a, and the insulating layer 208b. Note that, although the gate wiring 202 is not illustrated in FIG. 38, the gate wiring 202 of the thin film transistor 252 is also provided in a manner similar to that of the gate wiring 202 of the thin film transistor 250 illustrated in FIGS. 2A to 2C.

Here, in the insulating layer 204b, the insulating layer 208a, and the insulating layer 208b, an opening is selectively formed by the sixth photolithography step so that the insulating layer 204a is exposed, and the insulating layer 211 covers a top surface and a side surface of the insulating layer 208b and side surfaces of the insulating layer 208a and the insulating layer 204b and is in contact with the insulating layer 204a through the opening.

Here, the insulating layer 211 and the insulating layer 204a are formed using insulating films including nitrogen and are inorganic insulating films which do not include an impurity such as moisture, a hydrogen ion, or OH⁻ and block entry of these from the outside.

Thus, with the structure illustrated in FIG. 38, the thin film transistor 252 can be hermetically sealed with the insulating layer 211 and the insulating layer 204a which are formed using the insulating films including nitrogen; consequently, entry of moisture from the outside can be prevented in a manufacturing process after the formation of the insulating layer 211. Further, even after a device is completed as a display device such as a liquid crystal display device, entry of moisture from the outside can be prevented in the long term; therefore, long-term reliability of the device can be improved.

In this embodiment, the structure in which one thin film transistor is surrounded by insulating films including nitrogen is described; however, an embodiment of the present invention is not particularly limited thereto. A plurality of thin film transistors may be surrounded by insulating films including nitrogen, or a plurality of thin film transistors in a pixel portion may be collectively surrounded by insulating films including nitrogen. A region where the insulating layer 211 and the insulating layer 204a are in contact with each other may be formed so that at least the periphery of the pixel portion of the active matrix substrate is surrounded.

Further, a light-transmitting thin film transistor can be provided. Here, the case where, in the thin film transistor provided in the pixel portion of the display device described in Embodiments 1 and 2, the light-transmitting oxide semiconductor layer 205 is used and light-transmitting conductive films are applied to the gate wiring 203, the electrode 207a, and the electrode 207b is described.

When the thin film transistor included in the pixel structure illustrated in FIG. 2B is a light-transmitting thin film transistor, a light-transmitting thin film transistor including the insulating layer 201 provided over the substrate 200, the gate wiring 202 provided over the insulating layer 201, the light-transmitting gate wiring 203 provided over the gate wiring 202, the insulating layer 204 provided over the gate wiring 203, the semiconductor layer 205 provided over the insulating layer 204, the pair of light-transmitting electrodes 207a and 207b provided over the semiconductor layer 205, the insulating layer 208 provided over the electrode 207a, the electrode 207b, and the semiconductor layer 205, the source wiring 209 which is in contact with the electrode 207a through an opening provided in the insulating layer 208, the source wiring 210 provided over the source wiring 209, the insulating layer 211 provided over the source wiring 210, and the electrode 212 which is in contact with the electrode 207b through an opening provided in the insulating layer 211 and the insulating layer 208 can be provided.

Alternatively, a bottom gate thin film transistor including a channel protective layer, which is illustrated as an example in FIG. 3, may be a light-transmitting thin film transistor. Specifically, a light-transmitting thin film transistor including the insulating layer 201 provided over the substrate 200, the gate wiring 202 provided over the insulating layer 201, the light-transmitting gate wiring 203 provided over the gate wiring 202, the insulating layer 204 provided over the light-transmitting gate wiring 203, the semiconductor layer 205 provided over the insulating layer 204, the channel protective layer 225 provided over the semiconductor layer 205, the pair of light-transmitting electrodes 207a and 207b provided over the channel protective layer 225, the insulating layer 208 provided over the electrode 207a, the electrode 207b, and the semiconductor layer 205, the source wiring 209 which is in contact with the electrode 207a through an opening provided in the insulating layer 208, the source wiring 210 provided over the source wiring 209, the insulating layer 211 provided over the source wiring 210, and the electrode 212 which is in contact with the electrode 207b through an opening provided in the insulating layer 211 and the insulating layer 208 can be provided.

Most of the oxide semiconductors that can be applied to the oxide semiconductor layer 205 described in Embodiment 2 transmits visible light. A film including a light-transmitting conductive material, for example, indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, a Sn—Zn—O-based oxide semiconductor, an Al—Zn—O-based oxide semiconductor, an In—O-based oxide semiconductor, a Sn—O-based oxide semiconductor, a Zn—O-based oxide semiconductor, or the like can be formed by a sputtering method or the like and applied to the gate wiring 203, the electrode 207a, and the electrode 207b.

Since the thin film transistor where the light-transmitting oxide semiconductor layer 205 is used and light-transmitting conductive films are applied to the gate wiring 203, the electrode 207a, and the electrode 207b has a light-transmitting property, the aperture ratio in the pixel portion is not reduced.

Note that a light-transmitting conductive oxide functions as an $n^+$ layer in a region in contact with the oxide semiconductor layer; therefore, the thin film transistor can have low contact resistance and parasitic resistance.

Through the above process, a semiconductor device typified by a display device having high display quality, in which increase in wiring resistance is suppressed, can be provided. Moreover, a highly reliable semiconductor device can be provided in which insulating layers including silicon nitride are formed as insulating layers over and under a conductive layer including Cu so that the conductive layer including Cu may be sandwiched between or surrounded by the insulating layers, whereby diffusion of Cu included in the conductive layer is prevented.

Further, by heat treatment for dehydration or dehydrogenation, impurities (such as $H_2O$, H, or OH) included in the oxide semiconductor layer can be reduced and the oxide semiconductor layer can be highly purified. As described above, by suppressing the concentration of impurities in the oxide semiconductor layer, a highly reliable thin film transistor having favorable electric characteristics can be formed.

When an oxide semiconductor layer which is formed by the method described in this embodiment as an example and whose impurity concentration is suppressed is used, a highly reliable semiconductor element can be provided. Specifically, a thin film transistor including an oxide semiconductor, whose threshold voltage is controlled, can be provided. Moreover, a thin film transistor including an oxide semiconductor, which has high operation speed and sufficient reliability and can be manufactured through a relatively simple process, can be provided.

Furthermore, according to this embodiment, a method for manufacturing a thin film transistor including an oxide semiconductor, whose threshold voltage is controlled and which has high operation speed and sufficient reliability and can be manufactured through a relatively simple process, can be provided.

Note that this embodiment can be combined with any of the other embodiments in this specification as appropriate.

Embodiment 3

In this embodiment, an example of a structure of a thin film transistor used for the gate driver circuit 91 or the source driver circuit 92 of the display device 30 which is described in Embodiment 1 with reference to FIGS. 1A and 1B will be described.

A driver circuit for driving a pixel portion is formed using an inverter circuit, a capacitor, a resistor, and the like. In this embodiment, a structure of an inverter circuit which includes two thin film transistors as thin film transistors used in the driver circuit is described. When the inverter circuit is faulted using two n-channel TFTs in combination, there are an inverter circuit having two enhancement type TFTs (hereinafter referred to as an EEMOS circuit) and an inverter circuit having a combination of an enhancement type transistor and a depletion type transistor (hereinafter referred to as an EDMOS circuit). Note that an re-channel TFT whose threshold voltage is positive is referred to as an enhancement type transistor, and an n-channel TFT whose threshold voltage is negative is referred to as a depletion type transistor, throughout this specification.

Figure 8A:
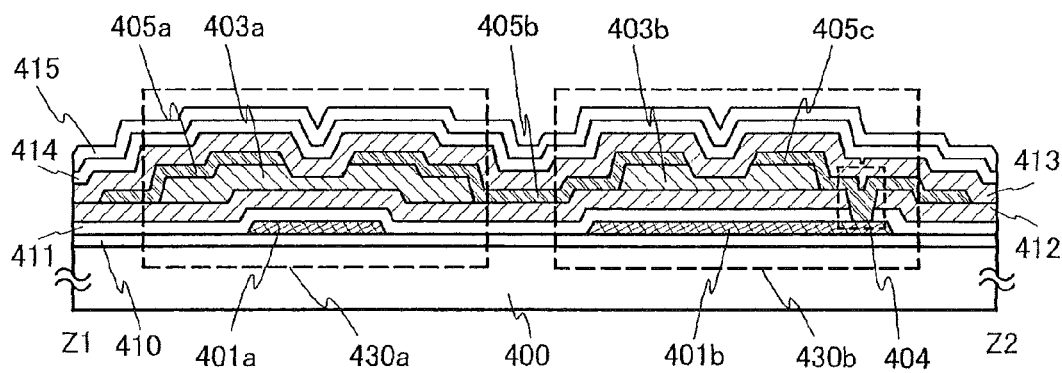
FIG. 8A is a cross-sectional view.
Figure 8B:
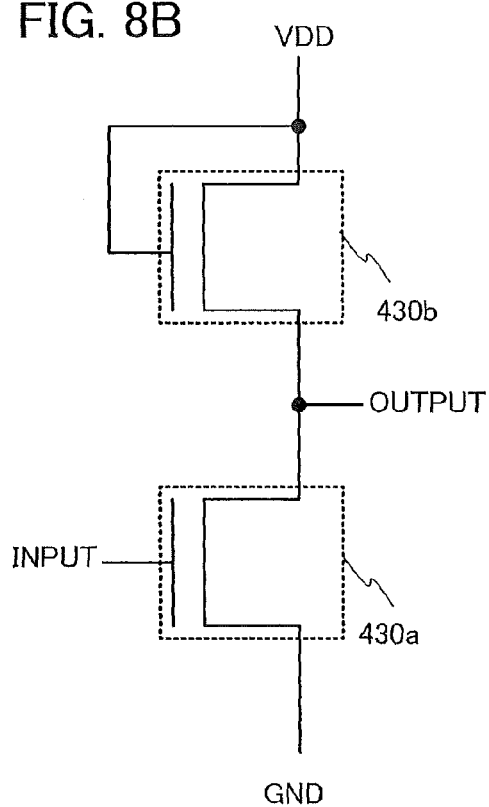
FIG. 8B is a circuit diagram.
Figure 8C:
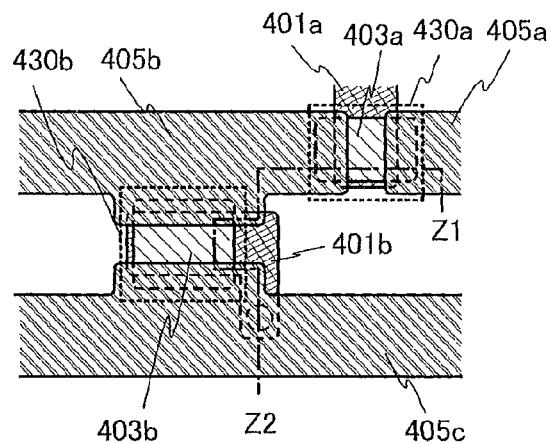
FIG. 8C is a plan view illustrating an embodiment of the present invention.

FIG. 8A illustrates a cross-sectional structure of the inverter circuit of the driver circuit. Further, FIG. 8C is a plan view of the inverter circuit of the driver circuit. A cross section taken along chain line Z1-Z2 in FIG. 8C corresponds to FIG. 8A. Note that a first thin film transistor 430a and a second thin film transistor 430b illustrated in FIGS. 8A to 8C are inverted staggered thin film transistors having a bottom gate structure.

In the first thin film transistor 430a illustrated in FIG. 8A, a first gate wiring 401a is provided over a substrate 400 whose surface is provided with an insulating layer 410, an insulating layer 411 and an insulating layer 412 are provided over the first gate wiring 401a, a first semiconductor layer 403a is provided over the insulating layer 412, and an electrode 405a and an electrode 405b are provided over the first semiconductor layer 403a. In a similar manner, in the second thin film transistor 430b, a second gate wiring 401b is provided over the substrate 400 whose surface is provided with the insulating layer 410, the insulating layer 411 and the insulating layer 412 are provided over the second gate wiring 401b, a second semiconductor layer 403b is provided over the insulating layer 412, and the electrode 405b and an electrode 405c are provided over the second semiconductor layer 403b. Here, the electrode 405c is directly connected to the second gate wiring 401b through a contact hole 404 formed in the insulating layer 411 and the insulating layer 412. Further, an insulating layer 413, an insulating layer 414, and an insulating layer 415 are formed over the electrode 405a, the electrode 405b, and the electrode 405c. Note that the electrode 405a, the electrode 405b, and the electrode 405c are extended as illustrated in FIG. 8C, and also function as wirings which electrically connect the thin film transistors in the driver circuit.

Here, the first gate wiring 401a and the second gate wiring 401b can be formed using a material and a method similar to those of the gate wiring 203 described in Embodiment 1 or 2. The first semiconductor layer 403a and the second semiconductor layer 403b can be formed using a material and a method similar to those of the semiconductor layer 205 described in Embodiment 1 or 2. The electrode 405a, the electrode 405b, and the electrode 405c can be formed using a material and a method similar to those of the pair of electrodes 207a and 207b described in Embodiment 1 or 2. The insulating layers 410 to 415 can be formed using materials and methods similar to those of the insulating layer 201, the insulating layers 204a and 204b, the insulating layers 208a and 208b, and the insulating layer 211, respectively.

Further, the contact hole 404 is formed in such a manner that, in the fourth photolithography step described in Embodiment 2, a mask is formed over the insulating layer 412 and used for selective etching of the insulating layer 412 and the insulating layer 411. By the direct connection between the electrode 405c and the second gate wiring 401b through the contact hole 404, favorable contact can be obtained, which leads to reduction in contact resistance. Moreover, as compared to the case where the electrode 405c is connected to the second gate wiring 401b through another conductive film such as a light-transmitting conductive film, the number of contact holes can be reduced; consequently, the area occupied by the thin film transistor can be reduced and the distance between thin film transistors in the driver circuit can be shortened.

As described above, the distance between the thin film transistors in the driver circuit can be shortened and wiring resistance can be sufficiently reduced; therefore, a conductive layer including Cu is not necessarily used as a wiring which electrically connects the thin film transistors. Accordingly, the distance between the thin film transistor in the driver circuit and a conductive layer including Cu can be long enough, whereby diffusion of Cu into the oxide semiconductor layer of the thin film transistor can be prevented. However, a power supply line which supplies a power supply potential to each thin film transistors or a wiring such as a common wiring which is relatively long is affected by wiring resistance relatively easily. Thus, a wiring formed using the conductive layer including Cu is preferably used for such wirings.

As described in Embodiment 1, the gate driver circuit 91 is connected to the gate wirings (20_1 to 20_n (note that n is a natural number)), and the source driver circuit 92 is connected to the source wirings (60_1 to 60_m (note that in is a natural number)); the gate wirings (20_1 to 20_n (note that n is a natural number)) and the source wirings (60_1 to 60_m (note that in is a natural number)) are formed using the conductive layer including Cu. Therefore, even in a display portion where the distance led by the wirings is long, wiring resistance can be sufficiently reduced.

The electrode 405a is a power supply line at a ground potential (a ground power supply line). This power supply line at a ground potential may be a power supply line to which negative voltage VDL is applied (a negative power supply line). The electrode 405c is electrically connected to a power supply line to which positive voltage VDD is applied (a positive power supply line).

An equivalent circuit of the EEMOS circuit is illustrated in FIG. 8B. The circuit connection illustrated in FIGS. 8A and 8C corresponds to the equivalent circuit illustrated in FIG. 8B, and the first thin film transistor 430a and the second thin film transistor 430b are enhancement type n-channel transistors as an example.

Here, gate electrodes may be provided above and below oxide semiconductor layers and the threshold voltage may be controlled so that the first thin film transistor 430a and the second thin film transistor 430b may behave as enhancement type n-channel transistors.

Further, not being limited to the EEMOS circuit, an EDMOS circuit can also be manufactured by forming the first thin film transistor 430a to be an enhancement type n-channel transistor and forming the second thin film transistor 430b to be a depletion type n-channel transistor. In that case, instead of the electrode 405c, the electrode 405b is connected to the second gate wiring 401b.

In order to manufacture an enhancement type n-channel transistor and a depletion type n-channel transistor over one substrate, for example, the first semiconductor layer 403a and the second semiconductor layer 403b are formed using different materials or under different conditions. An EDMOS circuit may be formed in such a manner that gate electrodes for controlling the threshold value are provided over oxide semiconductor layers to control the threshold value and voltage is applied to the gate electrodes for controlling the threshold value so that one of the TFTs is normally on while the other TFT is normally off.

Note that the structure described in this embodiment can be combined with any of the structures described in the other embodiments as appropriate.

Embodiment 4

In this embodiment, a protection circuit using a semiconductor element in which an oxide semiconductor film is applied to a semiconductor layer will be described with reference to FIGS. 9A and 9B and FIG. 10. In addition, a structure of a connection portion where different common wirings between which an insulating film is provided are connected will be described with reference to FIGS. 11A and 11B.

Figure 9A:
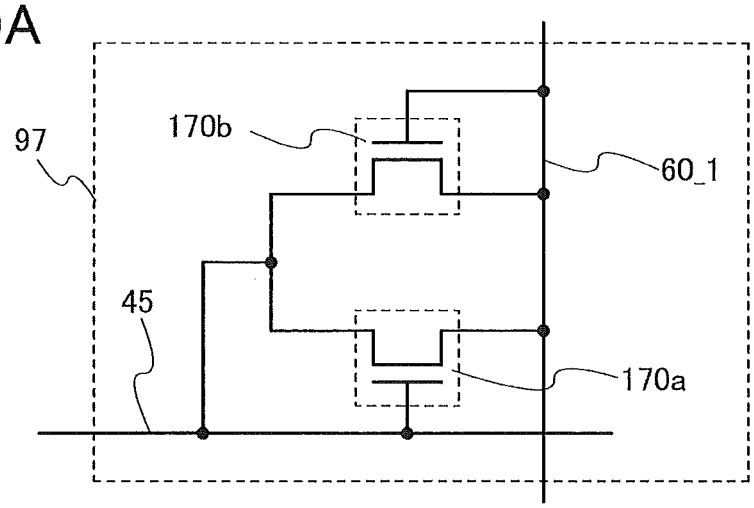
FIG. 9A is a circuit diagram and FIG. 9B is a plan view illustrating an embodiment of the present invention.
Figure 10:
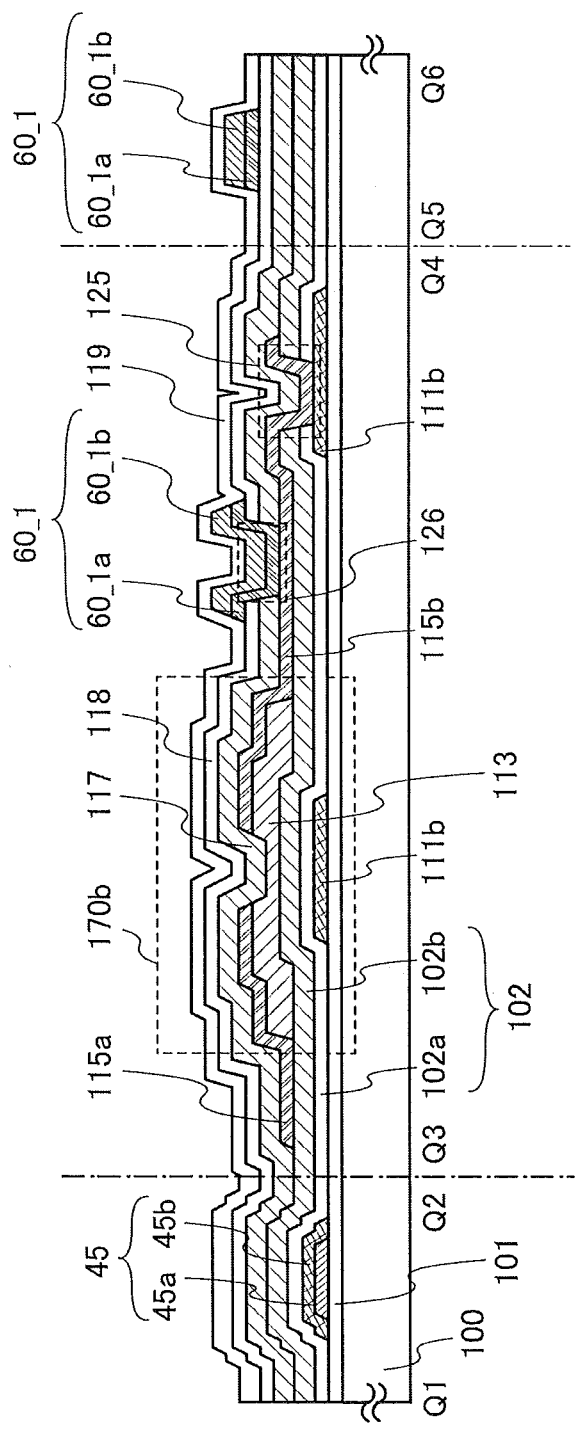
FIG. 10 is a cross-sectional view illustrating an embodiment of the present invention.

An example of a circuit that can be applied to the protection circuit 97 is illustrated in FIG. 9A. This protection circuit includes non-linear elements 170a and 170b. Each of the non-linear elements 170a and 170b includes a two-terminal element such as a diode or a three-terminal element such as a transistor. For example, the non-linear element can be formed through the same process as the transistor in the pixel portion. For example, characteristics similar to those of a diode can be obtained by connecting a gate terminal to a drain terminal of the non-linear element.

A first terminal (gate) and a third terminal (drain) of the non-linear element 170a are connected to the common wiring 45, and a second terminal (source) thereof is connected to the source wiring 60_1. A first terminal (gate) and a third terminal (drain) of the non-linear element 170b are connected to the source wiring 60_1, and a second terminal (source) thereof is connected to the common wiring 45. That is, the protection circuit illustrated in FIG. 9A has a structure in which the two transistors are each connected to the common wiring 45 and the source wiring 60_1 so as to have opposite rectifying directions. In other words, a transistor whose rectifying direction is from the common wiring 45 to the source wiring 60_1 and a transistor whose rectifying direction is from the source wiring 60_1 to the common wiring 45 are connected between the common wiring 45 and the source wiring 60_1.

In the above protection circuit, when the source wiring 60_1 is positively or negatively charged due to static electricity or the like, current flows in a direction that cancels the charge. For example, when the source wiring 60_1 is positively charged, current flows in a direction in which the positive charge is released to the common wiring 45. Owing to this operation, electrostatic breakdown or a shift in the threshold voltage of a pixel transistor connected to the charged source wiring 60_1 can be prevented. Moreover, it is possible to prevent dielectric breakdown of an insulating layer, between the charged source wiring 60_1 and another wiring that intersect with each other with the insulating layer interposed therebetween.

It is to be noted that the protection circuit is not limited to the above structure. For example, a structure in which a plurality of transistors whose rectifying direction is from the common wiring 45 to the source wiring 60_1 and a plurality of transistors whose rectifying direction is from the source wiring 60_1 to the common wiring 45 are connected may be employed. By connecting the common wiring 45 and the source wiring 60_1 with a plurality of non-linear elements, charges can be prevented from being directly applied to the source wiring 60_1 not only in the case where surge voltage is applied to the source wiring 60_1 but also in the case where the common wiring 45 is charged due to static electricity or the like. In addition, a protection circuit can be configured using an odd number of non-linear elements.

Although FIG. 9A illustrates an example in which the protection circuit is provided for the source wiring 60_1 and the common wiring 45, a similar configuration can be applied to a protection circuit of another portion. Note that the protection circuit of FIG. 9A can be formed by applying a semiconductor element of one embodiment of the present invention to the non-linear element 170a and the non-linear element 170b.

Next, an example in which a protection circuit is formed over a substrate with the use of a semiconductor element of one embodiment of the present invention is described with reference to FIG. 9B and FIG. 10. Note that FIG. 9B is an example of a plan view of wirings and a connection portion between the wirings, and FIG. 10 is a cross-sectional view taken along line Q1-Q2, line Q3-Q4, and line Q5-Q6 in FIG. 9B.

Figure 9B:
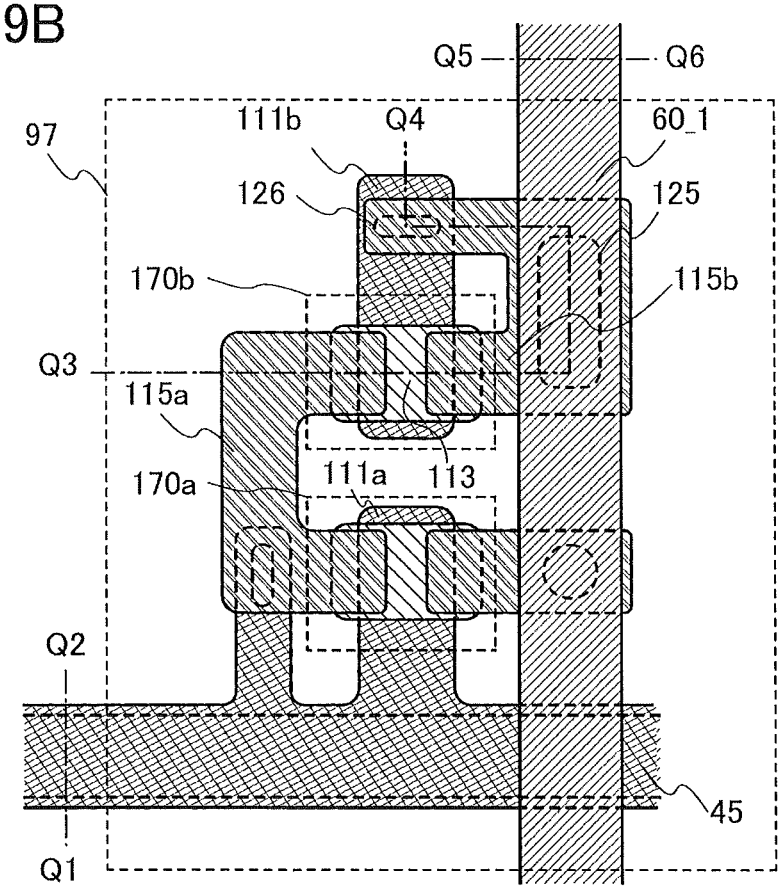

FIG. 9B is a plan view of a portion where the common wiring 45 and the source wiring 60_1 are connected with the non-linear element 170a and the non-linear element 170b and illustrates an example of a structure of the protection circuit 97.

The non-linear element 170a includes a gate wiring 111a, and the gate wiring 111a is connected to the common wiring 45. One of a source electrode and a drain electrode of the non-linear element 170a is connected to the source wiring 60_1, and the other thereof is formed of a first electrode 115a. Further, the first electrode 115a is connected to the common wiring 45.

The non-linear element 170b includes a gate wiring 111b, and the gate wiring 111b is connected to the source wiring 60_1 through a contact hole 126, a second electrode 115b, and a contact hole 125. A source electrode and a drain electrode of the non-linear element 170b are formed of the first electrode 115a and the second electrode 115b. Further, the non-linear element 170b includes a semiconductor layer 113.

Next, structures of the common wiring 45, the source wiring 60_1, and the non-linear element 170b are described with reference to FIG. 10.

The common wiring 45 is formed using the same wiring layer as the gate wiring. The common wiring 45 is formed so that a gate wiring 45a and a gate wiring 45b are stacked over an insulating film 101 which is provided over the substrate 100. Note that an insulating layer 102 is formed over the gate wiring 45b, an insulating layer 117 is provided over the insulating layer 102, and an insulating layer 118 is formed over the insulating layer 117.

The source wiring 60_1 is formed over the insulating layer 118. The source wiring 60_1 is formed so that a source wiring 60_1a and a source wiring 60_1b are stacked in this order. Note that an insulating layer 119 is formed over the source wiring 60_1.

The non-linear element 170b includes the gate wiring 111b over the insulating film 101 which is provided over the substrate 100, and the insulating layer 102 over the gate wiring 111b. Further, the non-linear element 170b includes the semiconductor layer 113 over the gate wiring 111b with the insulating layer 102 interposed therebetween, and the electrode 115a and the electrode 115b which are in contact with the semiconductor layer 113 with end portions thereof overlapping with the gate wiring 111b. The insulating layer 117 is formed to overlap with the gate wiring 111b and be in contact with the semiconductor layer 113 which is between the end portions of the electrode 115a and the electrode 115b, and the insulating layer 118 is formed over the insulating layer 117. Note that the insulating layer 102 is formed as a stack of an insulating layer 102a and an insulating layer 102b.

The electrode 115b is directly connected to the gate wiring 111b through the contact hole 125 provided in the insulating layer 102. The electrode 115b is connected to the source wiring 60_1 through the contact hole 126. The insulating layer 119 is formed over the insulating layer 118 and the source wiring 60_1.

For the conductive film serving as the electrode 115a and the electrode 115b, an element selected from Ti, Mo, W, Cr, Cu, and Ta, an alloy including any of these elements as a component, an alloy including any of these elements in combination, or the like is used. The conductive film is not limited to a single layer including the above element and may be a stack of two or more layers.

Metal with high oxygen affinity is particularly preferable for the conductive film which is in contact with the semiconductor layer 113 so that a junction of the metal with high oxygen affinity and an oxide semiconductor is formed. Titanium is particularly preferable among metals with high oxygen affinity. Instead of a titanium film, a titanium nitride film may be used.

By providing such a junction structure between the semiconductor layer 113 and the electrode 115a and between the semiconductor layer 113 and the electrode 115b, operation of the non-linear element 170a and the non-linear element 170b is stabilized. That is, the thermal stability is increased, so that stable operation becomes possible. Accordingly, the function of the protection circuit is enhanced and the operation can be made stable. Moreover, the amount of junction leakage is reduced, whereby parasitic resistance in the non-linear element 170a and the non-linear element 170b and variation in parasitic resistance can be reduced.

Note that the non-linear element 170a and the non-linear element 170b have the same structure in the main portion. The non-linear element 170b can have the same structure as the thin film transistor in the pixel portion, which is described in Embodiment 1. Therefore, detailed description of the non-linear element 170a and the non-linear element 170b is omitted in this embodiment. In addition, the non-linear elements 170a and 170b and the above thin film transistor can be manufactured over one substrate through the same process.

Figure 11A:
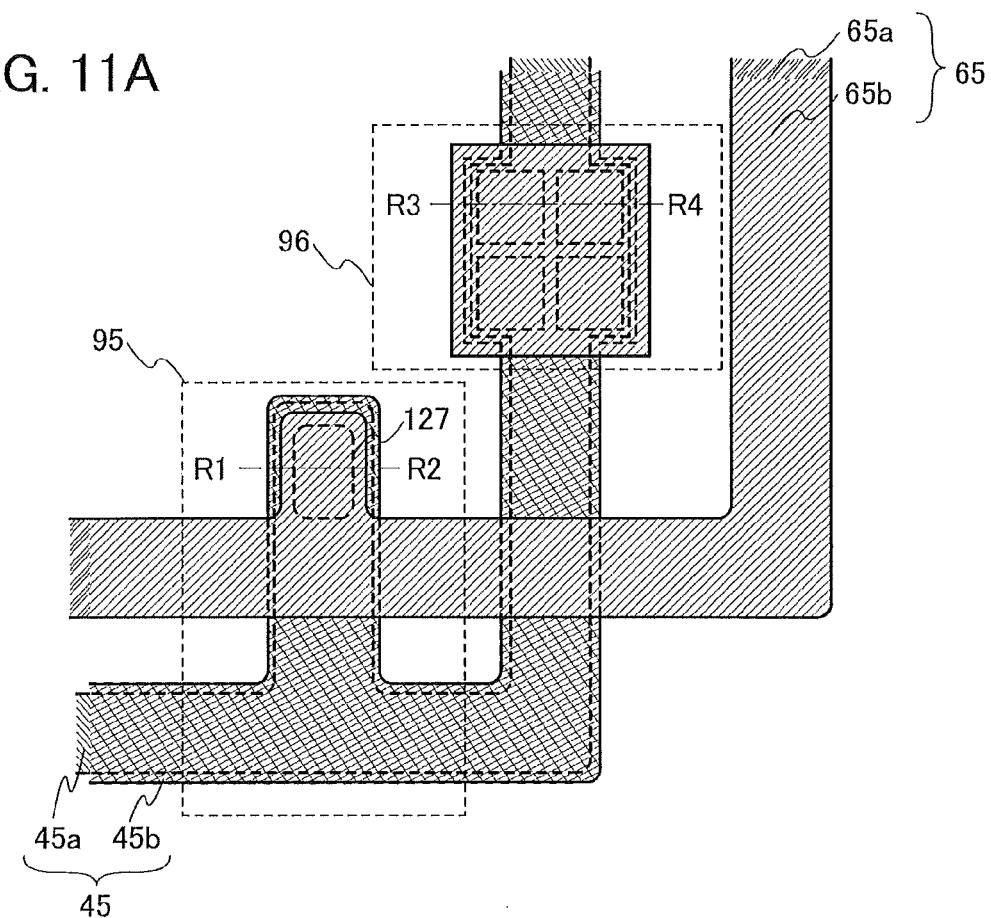
FIG. 11A is a plan view and FIG. 11B is a cross-sectional view illustrating an embodiment of the present invention.
Figure 11B:
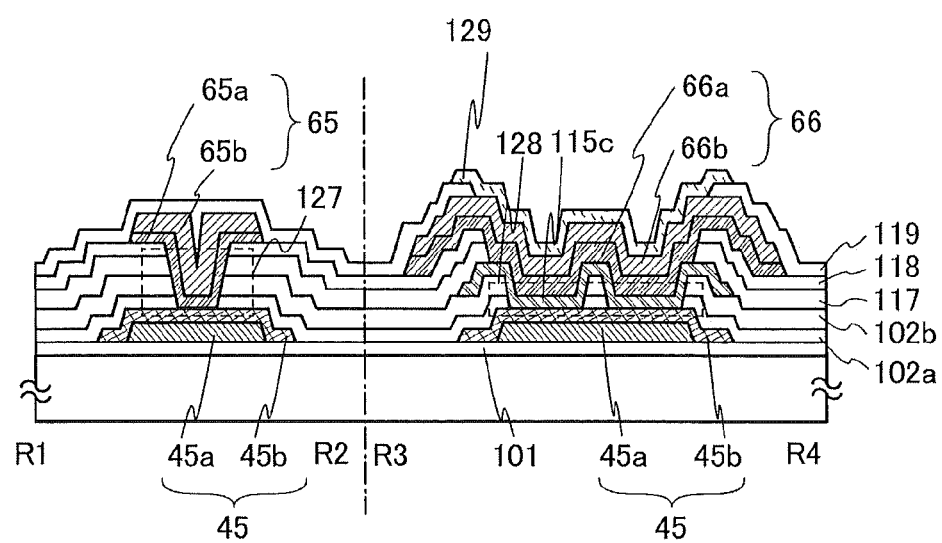

An example of a connection between the common wirings is described with reference to FIGS. 11A and 11B. Note that FIG. 11A is an example of a plan view of wirings and a connection portion between the wirings, and FIG. 11B is a cross-sectional view taken along line R1-R2 and line R3-R4 in FIG. 11A.

As described above, the common wiring 45 has a structure in which the gate wiring 45a and the gate wiring 45b are stacked in this order. The common wiring 65 has the same structure as the source wiring 60_1. That is, the common wiring 65 has a structure in which a source wiring 65a and a source wiring 65b are stacked in this order. The source wiring 65a is formed using the same conductive film as the source wiring 60_1a, and the source wiring 65b is formed using the same conductive film as the source wiring 60_1b.

In the connection portion 95, the common wiring 45 and the common wiring 65 are electrically connected to each other. The connection portion 95 is described with reference to FIG. 11B. The common wiring 45 and the common wiring 65 are connected to each other through a contact hole 127 formed in the insulating layer 102, the insulating layer 117, and the insulating layer 118.

In the connection portion 95, the gate wiring 45b and the source wiring 65a which include a conductive material including an element with a higher melting point than Cu are connected to each other, and thus a highly reliable connection is realized. Furthermore, the gate wiring 45a and the source wiring 65b which are formed using a conductive material including Cu suppress wiring resistance.

The common connection portion 96 is provided in a region outside the pixel portion and is a connection portion which is electrically connected to a substrate having a connection portion that is provided to face the common connection portion 96 through conductive particles (such as plastic particles plated with gold). An example in which the common connection portion 96 is formed over the conductive layer where the gate wiring 45a and the gate wiring 45b are stacked in this order is described with reference to FIG. 11B.

The common connection portion 96 is electrically connected to the common wiring 45. Over the conductive layer where the gate wiring 45a and the gate wiring 45b are stacked in this order, an electrode 115c is formed with the insulating layer 102a and the insulating layer 102b interposed therebetween. The electrode 115c is electrically connected to the conductive layer through a contact hole 128 that is formed in the insulating layer 102a and the insulating layer 102b. A conductive layer 66 which has the same structure as the common wiring 65 is stacked over the electrode 115c, and then a conductive layer 129 is formed using the same light-transmitting conductive film as the electrode 212 which functions as a pixel electrode.

The gate wiring 45a and the source wiring 60_1b which are connected to the protection circuit described as an example in this embodiment are formed using a conductive material including Cu and have low wiring resistance.

The gate wiring 45b is faulted using a conductive material including an element with a higher melting point than Cu, such as W, Ta, Mo, Ti, or Cr, so as to be in contact with and cover the gate wiring 45a, whereby migration of the gate wiring 45a can be suppressed and reliability of the semiconductor device can be improved. Further, insulating layers including silicon nitride are formed as the insulating layers located over and under the gate wiring 45a including Cu so that the gate wiring 45a including Cu is sandwiched between or surrounded by the insulating layers, whereby diffusion of Cu included in the gate wiring 45a can be prevented.

The protection circuit described as an example in this embodiment has a structure in which a first terminal (gate) of a non-linear element is directly connected to a second terminal (source) or a third terminal (drain) thereof through one contact hole. As a result, only one interface and one contact hole are formed for one connection, which are fewer than the numbers of interfaces and contact holes in the case of forming a connection through another wiring layer.

Note that when the number of interfaces needed for a connection is small, electric resistance can be reduced. In addition, when the number of contact holes needed for a connection is small, the area occupied by the connection portion can be reduced.

Accordingly, connection resistance can be reduced in the protection circuit described as an example in this embodiment, which results in stable operation of the protection circuit. Moreover, since a connection is formed using only one contact hole, the area occupied by the protection circuit can be reduced and thus the size of the display device can be reduced.

Note that this embodiment can be combined with any of the other embodiments in this specification as appropriate.

Embodiment 5

In this embodiment, as for the display device described in Embodiment 1 with reference to FIGS. 1A and 1B, examples of structures of a gate signal line terminal in the gate terminal portion 7 and a source signal line terminal in the source terminal portion 8 will be described.

FIGS. 12A1 and 12A2 are a cross-sectional view and a plan view of the gate signal line terminal, respectively. FIG. 12A1 is a cross-sectional view taken along line C1-C2 in FIG. 12A2. In the gate signal line terminal: as illustrated in FIG. 12A1, an insulating layer 360 is formed over a substrate 300; a gate wiring 351a is formed over the insulating layer 360; a gate wiring 351b is formed to cover at least an end portion of the gate wiring 351a; an insulating layer 361, an insulating layer 362, an insulating layer 363, an insulating layer 364, and an insulating layer 365 are formed over the gate wiring 351b; and a transparent conductive layer 355 is formed over the insulating layer 365 and the gate wiring 351b. Here, the gate wiring 351a and the gate wiring 351b are collectively referred to as a gate wiring 351, and the gate wiring 351b functions as a first terminal of the gate signal line terminal. In addition, end portions of the insulating layers 361 to 365 are patterned, so that an end portion of the gate wiring 351b is exposed and in direct contact with the transparent conductive layer 355. The transparent conductive layer 355 which is in direct contact with the end portion of the gate wiring 351b which is the first terminal is a connection terminal electrode which functions as an input terminal. Here, the gate wiring 351a, the gate wiring 351b, and the transparent conductive layer 355 can be formed using materials and methods similar to those of the gate wiring 202, the gate wiring 203, and the electrode 212 which are described in Embodiments 1 and 2, respectively. In addition, the insulating layers 360 to 365 can be formed using materials and methods similar to those of the insulating layer 201, the insulating layers 204a and 204b, the insulating layers 208a and 208b, and the insulating layer 211 which are described in Embodiments 1 and 2, respectively.

By forming the gate wiring 351a with the use of a conductive material including Cu, wiring resistance in the gate signal line terminal and a wiring led from the gate signal line terminal can be reduced. Further, the gate wiring 351b is formed using a conductive material including an element with a higher melting point than Cu, such as W, Ta, Mo, Ti, or Cr, so as to be in contact with and cover the gate wiring 351a, whereby migration of the gate wiring 351a can be suppressed and reliability of the semiconductor device can be improved. Furthermore, by providing insulating layers including silicon nitride as the insulating layer 360 and the insulating layer 361 which are insulating layers located over and under the gate wiring 351a including Cu so that the gate wiring 351a including Cu may be sandwiched between or surrounded by the insulating layers, diffusion of Cu included in the gate wiring 351a can be prevented.

Further, FIGS. 12B1 and 12B2 are a cross-sectional view and a plan view of the source signal line terminal, respectively. FIG. 12B1 is a cross-sectional view taken along line D1-D2 in FIG. 12B2. In the source signal line terminal, as illustrated in FIG. 12B1, the insulating layer 360, the insulating layer 361, and the insulating layer 362 are formed over the substrate 300, an electrode 352 is formed over the insulating layer 362, the insulating layer 363 and the insulating layer 364 are formed over the electrode 352, a source wiring 354a is formed over the insulating layer 364, a source wiring 354b is formed over the source wiring 354a, the insulating layer 365 is formed over the source wiring 354b, and the transparent conductive layer 355 is formed over the insulating layer 365 and the electrode 352. Here, the source wiring 354a and the source wiring 354b are collectively referred to as a source wiring 354. In addition, end portions of the insulating layers 363 to 365 are patterned, so that an end portion of the electrode 352 is exposed and in direct contact with the transparent conductive layer 355. A contact hole is formed in the insulating layer 363 and the insulating layer 364, through which the electrode 352 functioning as a second terminal of the source signal line terminal and the source wiring 354 are connected to each other. The transparent conductive layer 355 which is in direct contact with the end portion of the electrode 352 which is the second terminal is a connection terminal electrode which functions as an input terminal. Here, the electrode 352, the source wiring 354a, the source wiring 354b, and the transparent conductive layer 355 can be formed using materials and methods similar to those of the pair of electrodes 207a and 207b, the source wiring 209, the source wiring 210, and the electrode 212 which are described in Embodiments 1 and 2, respectively. Further, the insulating layers 360 to 365 can be formed using materials and methods similar to those of the insulating layer 201, the insulating layers 204a and 204b, the insulating layers 208a and 208b, and the insulating layer 211 which are described in Embodiments 1 and 2, respectively.

By forming the source wiring 354b with the use of a conductive material including Cu, wiring resistance in the source signal line terminal and a wiring led from the source signal line terminal can be reduced. Further, the source wiring 354a is formed using a conductive material including an element with a higher melting point than Cu, such as W, Ta, Mo, Ti, or Cr, an alloy including any of these elements in combination, tantalum nitride, titanium nitride, molybdenum nitride, or the like, so as to be in contact with the source wiring 354b, whereby migration of the source wiring 354b can be suppressed and reliability of the semiconductor device can be improved. Furthermore, by providing insulating layers including silicon nitride as the insulating layer 364 and the insulating layer 365 which are insulating layers located over and under the source wiring 354b including Cu so that the source wiring 354b including Cu may be sandwiched between or surrounded by the insulating layers, diffusion of Cu included in the source wiring 354b can be prevented.

In an example described in this embodiment, the gate wiring 351b which is the first terminal and included in the gate wiring 351 having a stacked-layer structure is connected to the transparent conductive layer 355 functioning as the input terminal is described in this embodiment; however, this embodiment is not limited thereto. As illustrated in FIGS. 13A1 and 13A2, a structure in which the first terminal is constituted by only the gate wiring 351a and the gate wiring 351a is in direct contact with the transparent conductive layer 355 may be employed. Here, FIG. 13A1 is a cross-sectional view taken along line C1-C2 in FIG. 13A2.

Furthermore, an example in which the source wiring 354 is connected to the transparent conductive layer 355 functioning as the input terminal through the electrode 352 which is the second terminal is described in this embodiment; however, this embodiment is not limited thereto. As illustrated in FIGS. 13B1 and 13B2, in the source wiring 354 functioning as the second terminal, the source wiring 354b may be in direct contact with the transparent conductive layer 355. Here, FIG. 13B1 is a cross-sectional view taken along line D1-D2 in FIG. 13B2.

A plurality of gate wirings, source wirings, and capacitor wirings are provided depending on the pixel density. In the terminal portion, a plurality of first terminals at the same potential as the gate wiring, a plurality of second terminals at the same potential as the source wiring, a plurality of third terminals at the same potential as the capacitor wiring, and the like are arranged. The number of each of the terminals may be any number, and the number of the terminals may be determined by a practitioner as appropriate.

Note that the structure described in this embodiment can be combined with any of the structures described in the other embodiments as appropriate.

Embodiment 6

In this embodiment, an example will be described below in which at least part of a driver circuit and a thin film transistors to be disposed in a pixel portion are formed over one substrate.

The thin film transistor to be disposed in the pixel portion is formed according to any of Embodiments 1 to 4. Further, the thin film transistor described in any of Embodiments 1 to 4 is an n-channel TFT. Thus, part of a driver circuit that can be formed using n-channel TFTs among driver circuits is formed over the same substrate as the thin film transistor of the pixel portion.

Figure 18A:
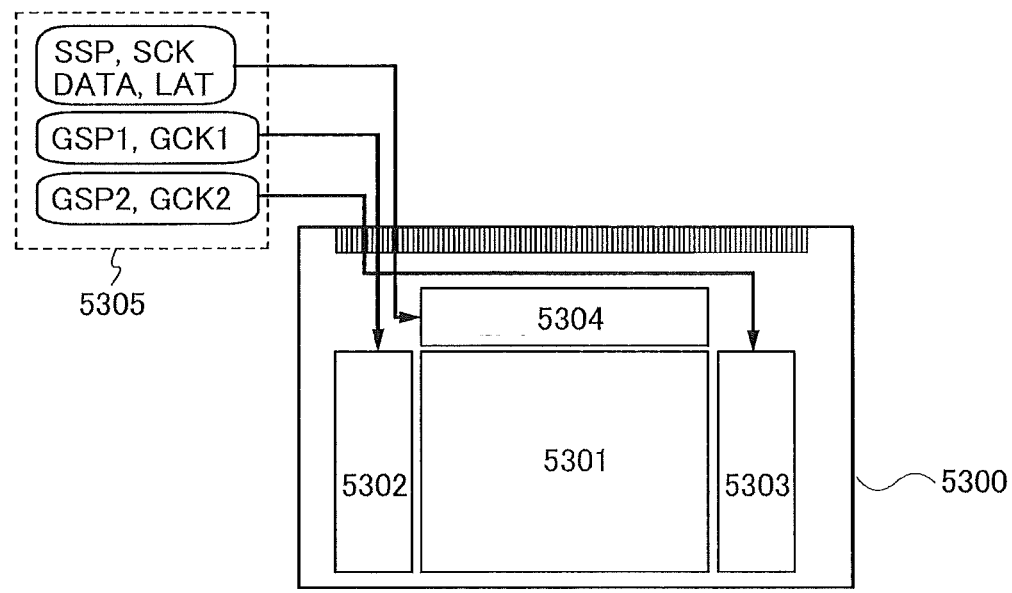
FIGS. 18A and 18B are block diagrams each illustrating a display device.

FIG. 18A is an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines which are extended from the signal line driver circuit 5304 are provided and a plurality of scan lines which are extended from the first scan line driver circuit 5302 and the second scan line driver circuit 5303 are provided. Note that pixels which include display elements are provided in matrix in respective regions where the scan lines and the signal lines intersect with each other. Further, the substrate 5300 in the display device is connected to a timing control circuit 5305 (also referred to as a controller or a controller IC) through a connection portion such as a flexible printed circuit (FPC).

In FIG. 18A, the first scan line driver circuit 5302, the second scan line driver circuit 5303, and the signal line driver circuit 5304 are formed over the same substrate 5300 as the pixel portion 5301. Accordingly, the number of components of a driver circuit and the like provided outside is reduced, whereby reduction in cost can be achieved. In addition, the number of connection portions (such as an FPC) for the substrate 5300 and the external driver circuit can be reduced; thus, reliability or yield can be improved.

Note that the timing control circuit 5305 supplies, for example, a first scan line driver circuit start signal (GSP1) and a scan line driver circuit clock signal (GCK1) to the first scan line driver circuit 5302. The timing control circuit 5305 supplies, for example, a second scan line driver circuit start signal (GSP2) (also referred to as a start pulse) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA) (also simply referred to as a video signal), and a latch signal (LAT) to the signal line driver circuit 5304. Note that each clock signal may be a plurality of clock signals whose periods are different or may be supplied together with an inverted clock signal (CKB). Note that one of the first scan line driver circuit 5302 and the second scan line driver circuit 5303 can be omitted.

Figure 18B:
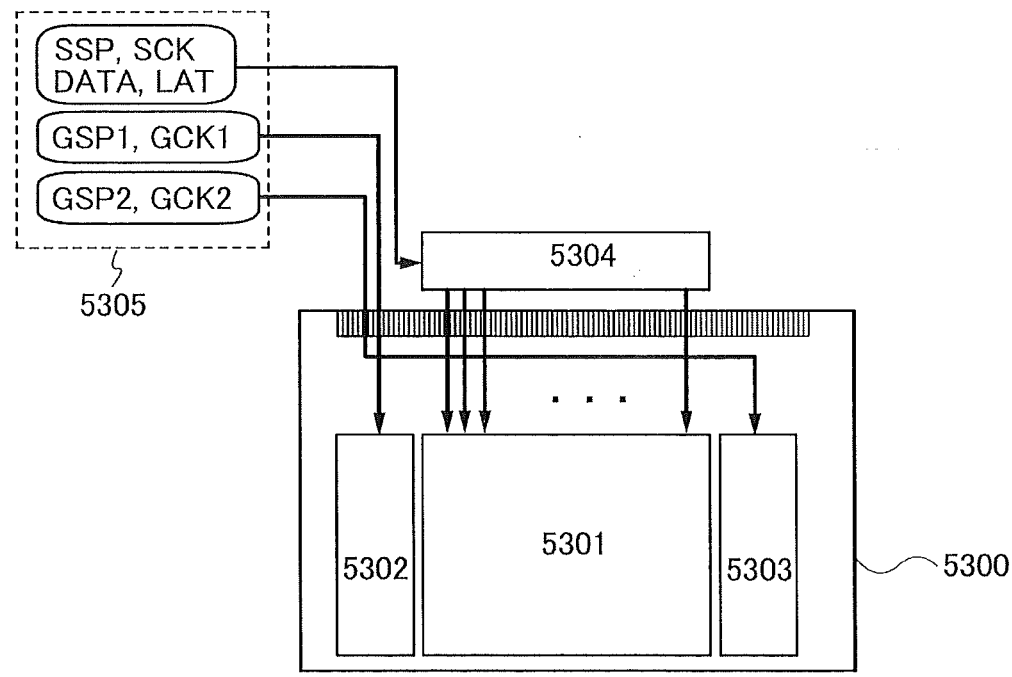

FIG. 18B illustrates a structure in which circuits with low driving frequency (e.g., the first scan line driver circuit 5302 and the second scan line driver circuit 5303) are formed over the same substrate 5300 as the pixel portion 5301, and the signal line driver circuit 5304 is formed over a substrate which is different from the substrate 5300 over which the pixel portion 5301 is formed. With this structure, a driver circuit formed over the substrate 5300 can be constituted by using thin film transistors with lower field effect mobility as compared to that of a transistor formed using a single crystal semiconductor. Accordingly, increase in the size of the display device, reduction in the number of steps, reduction in cost, improvement in yield, and the like can be achieved.

Figure 19A:
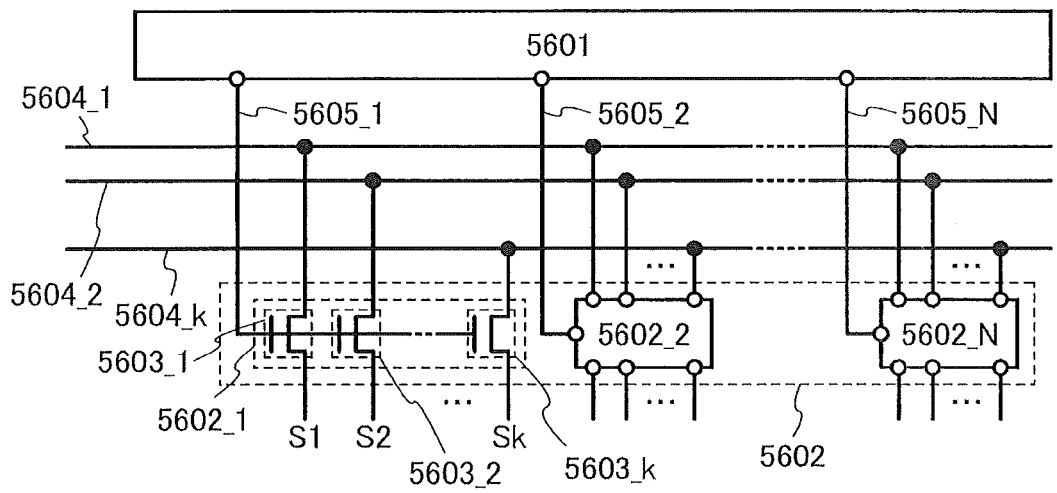
FIG. 19A illustrates a configuration of a signal line driver circuit and FIG. 19B is a timing chart illustrating operation thereof.
Figure 19B:
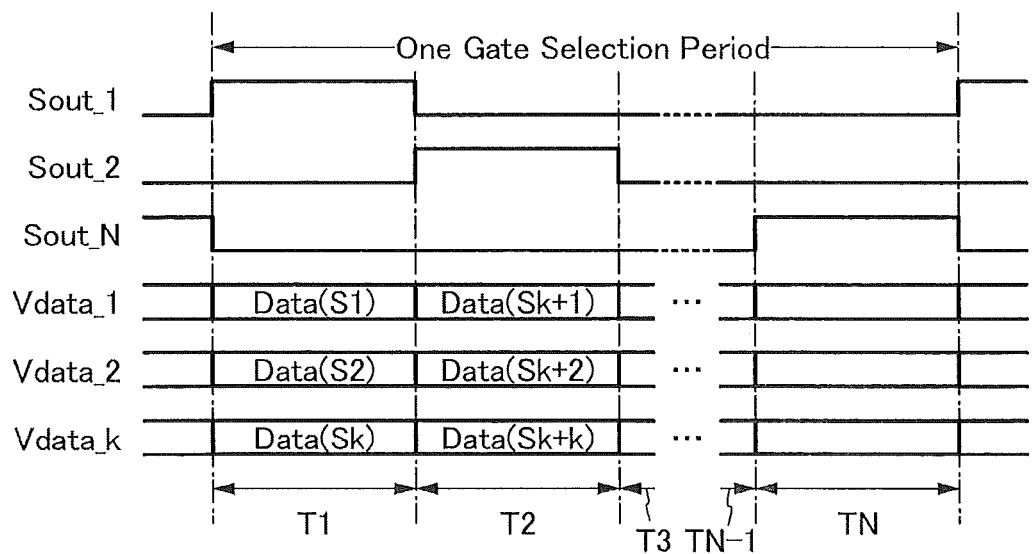

The thin film transistor described in any of Embodiments 1 to 4 is an n-channel TFT. In FIGS. 19A and 19B, an example of a structure and operation of a signal line driver circuit which is formed using the n-channel TFT is described as an example.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). An example in which the thin film transistors 5603l to 5603_k are n-channel TFTs will be described.

A connection relation of the signal line driver circuit will be described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603k are connected to signal lines S1 to Sk, respectively. Gates of the thin film transistors 5603_1 to 5603_k are connected to a wiring 5605_1.

The shift register 5601 has a function of sequentially selecting the switching circuits 5602_1 to 5602_N by sequentially outputting H-level signals (also referred to as H signals or signals at a high power supply potential level) to wirings 5605_1 to 5605_N.

For example, the switching circuit 5602_1 has a function of controlling conduction states between the wirings 5604_1 to 5604_k and the signal lines S1 to Sk (conduction states between the first terminals and the second terminals), that is, a function of controlling whether or not to supply potentials of the wirings 5604_1 to 5604_k to the signal lines S1 to Sk. In this manner, the switching circuit 5602_1 functions as a selector. The thin film transistors 5603_1 to 5603_k have functions of controlling conduction states between the wirings 5604_1 to 5604_k and the signal lines S1 to Sk, that is, functions of supplying potentials of the wirings 5604_1 to 5604_k to the signal lines S1 to Sk, respectively. In this manner, each of the thin film transistors 5603_1 to 5603_k functions as a switch.

Note that video signal data (DATA) is input to each of the wirings 5604_1 to 5604_k. The video signal data (DATA) is an analog signal corresponding to image data or image signals in many cases.

Next, operation of the signal line driver circuit in FIG. 19A is described with reference to a timing chart in FIG. 19B. FIG. 19B illustrates examples of signals Sout_1 to Sout_N and signals Vdata_1 to Vdata_k. The signals Sout_1 to Sout_N are examples of output signals of the shift register 5601, and the signals Vdata_1 to Vdata_k are examples of signals which are input to the wirings 5604_1 to 5604_k. Note that one operation period of the signal line driver circuit corresponds to one gate selection period in a display device. For example, one gate selection period is divided into periods T1 to TN. The periods T1 to TN are periods for writing video signal data (DATA) to the pixels which belong to a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H level signals to the wirings 5605_1 to 5605_N. For example, in the period T1, the shift register 5601 outputs an H level signal to the wiring 5605_1. Then, the thin film transistors 5603_1 to 5603_k are turned on, so that the wirings 5604_1 to 5604_k and the signal lines S1 to Sk are brought into conduction. In this case, Data (S1) to Data (Sk) are input to the wirings 5604_1 to 5604_k, respectively. The Data (S1) to Data (Sk) are input to pixels in a selected row in a first to k-th columns through the thin film transistors 5603_1 to 5603_k, respectively. Thus, in the periods T1 to TN, video signal data (DATA) is sequentially written to the pixels in the selected row of every k columns.

By writing video signal data (DATA) to pixels of every plurality of columns, the number of video signal data (DATA) or the number of wirings can be reduced. Thus, connections to an external circuit can be reduced. By writing video signal data (DATA) to pixels of every plurality of columns, writing time can be extended and insufficient writing of video signal data (DATA) can be prevented.

Note that as the shift register 5601 and the switching circuit 5602, a circuit including the thin film transistor described in Embodiment 3 can be used. In this case, the shift register 5601 can be constituted by only n-channel transistors or only p-channel transistors.

One embodiment of a shift register which is used for part of a scan line driver circuit and/or a signal line driver circuit is described with reference to FIGS. 20A to 20C and FIGS. 21A and 21B.

The scan line driver circuit includes a shift register. The scan line driver circuit may also include a level shifter, a buffer, or the like in some cases. In the scan line driver circuit, when a clock signal (CK) and a start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line need to be turned on all at once, a buffer which can supply large current is used.

Figure 20A:
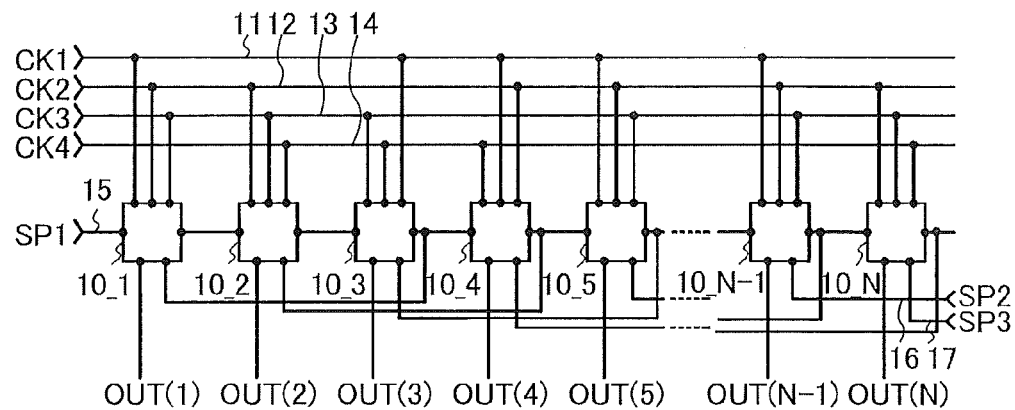
FIGS. 20A to 20C are circuit diagrams illustrating a configuration of a shift register.

The shift register includes first to N-th pulse output circuits 10_1 to 10_N (N is a natural number of 3 or more) (see FIG. 20A). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to N-th pulse output circuits 10_1 to 10_N of the shift register illustrated in FIG. 20A. A start pulse SP1 (a first start pulse) from a fifth wiring 15 is input to the first pulse output circuit 10_1. To the n-th pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) (n is a natural number greater than or equal to 2) is input. A signal from the third pulse output circuit 10_3 which is two stages after the first pulse output circuit 10_1 is input to the first pulse output circuit 10_1. In a similar manner, to the n-th pulse output circuit 10_n of the second or subsequent stage, a signal from the (n+2)-th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the respective subsequent stage and/or the pulse output circuit of the stage before the previous stage and second output signals (OUT(1) to OUT(N)) to be input to another wiring or the like. Note that as illustrated in FIG. 20A, the subsequent-stage signal OUT(n+2) is not input to last two stages of the shift register; as an example, a second start pulse SP2 and a third start pulse SP3 may be additionally input to the last two stages of the shift register from a sixth wiring 16 and a seventh wiring 17, respectively. Alternatively, a signal that is additionally generated inside the shift register may be used. For example, an (N+1)-th pulse output circuit 10_(N+1) and an (N+2)-th pulse output circuit 10_(N+2) which do not contribute to pulse output to the pixel portion (such circuits are also referred to as dummy stages) may be provided so that signals corresponding to the second start pulse (SP2) and the third start pulse (SP3) are generated in the dummy stages.

Note that a clock signal (CK) is a signal which alternates between an H level and an L level (also referred to as an L signal or a signal at a low power supply potential level) at regular intervals. The first to the fourth clock signals (CK1) to (CK4) are delayed by ¼ period sequentially. In this embodiment, by using the first to fourth clock signals (CK1) to (CK4), control of driving of a pulse output circuit or the like is performed. Note that the clock signal is also called GCK or SCK in accordance with a driver circuit to which the clock signal is input; however, description is made using CK as the clock signal.

A first input terminal 21, a second input terminal 22, and a third input terminal 23 are electrically connected to any of the first to fourth wirings 11 to 14. For example, in FIG. 20A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. The first input terminal 21 of the second pulse output circuit 10_2 is electrically connected to the second wiring 12, the second input terminal 22 of the second pulse output circuit 102 is electrically connected to the third wiring 13, and the third input terminal 23 of the second pulse output circuit 10_2 is electrically connected to the fourth wiring 14.

Figure 20B:
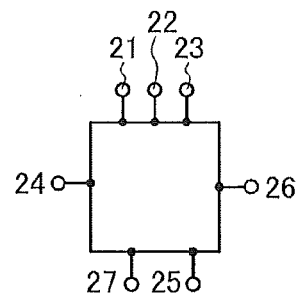

Each of the first to N-th pulse output circuits 10_1 to 10_N includes the first input terminal 21, the second input terminal 22, the third input terminal 23, the fourth input terminal 24, a fifth input terminal 25, a first output terminal 26, and a second output terminal 27 (see FIG. 20B). In the first pulse output circuit 10_1, the first clock signal CK1 is input to the first input terminal 21, the second clock signal CK2 is input to the second input terminal 22, the third clock signal CK3 is input to the third input terminal 23, the start pulse is input to the fourth input terminal 24, the subsequent-stage signal OUT(3) is input to the fifth input terminal 25, the first output signal OUT(1)(SR) is output from the first output terminal 26, and the second output signal OUT(1) is output from the second output terminal 27.

Next, an example of a specific circuit configuration of the pulse output circuit which is illustrated in FIG. 19A is described with reference to FIG. 20C.

Figure 20C:
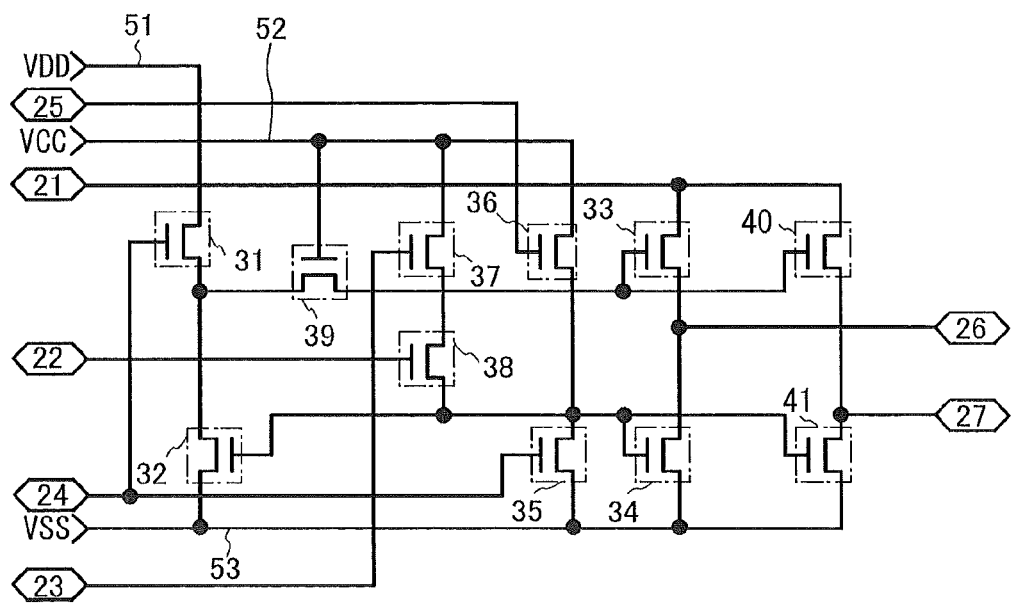

The pulse output circuit which is illustrated in FIG. 20C includes first to eleventh transistors 31 to 41. Signals or power supply potentials are supplied to the first to eleventh transistors 31 to 41 from a power supply line 51 to which a first high power supply potential VDD is supplied, a power supply line 52 to which a second high power supply potential VCC is supplied, and a power supply line 53 to which a low power supply potential VSS is supplied, in addition to the above first to fifth input terminals 21 to 25 and the first and second output terminals 26 and 27. Here, a magnitude relation of the power supply potentials of the power supply lines in FIG. 20C is as follows: the first high power supply potential VDD is higher than or equal to the second high power supply potential VCC, and the second high power supply potential VCC is higher than the low power supply potential VSS. Note that the first to fourth clock signals (CK1) to (CK4) are each a signal which alternates between an H level and an L level at regular intervals; the clock signal at the H level is VDD, and the clock signal at the L level is VSS. Note that when the potential VCC of the power supply line 52 is set to be lower than the potential VDD of the power supply line 51, a potential applied to the gate electrode of the transistor can be reduced without affecting the operation; thus, the shift of the threshold value of the transistor can be reduced and deterioration can be suppressed.

In FIG. 20C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 20C, a portion where the gate electrode of the third transistor 33, the gate electrode of the tenth transistor 40, and the second terminal of the ninth transistor 39 are connected is referred to as a node A. In addition, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B (see FIG. 21A).

Note that a thin film transistor is an element having at least three terminals of a gate, a drain, and a source. The thin film transistor has a semiconductor in which a channel region is formed in a region overlapping with the gate, and current which flows between the drain and the source through the channel region can be controlled by controlling the potential of the gate. Here, since the source and the drain of the thin film transistor may interchange depending on the structure, the operating conditions, or the like of the thin film transistor, it is difficult to determine which is the source and which is the drain. Therefore, a region functioning as a source or a drain is not called the source or the drain in some cases. In that case, for example, such regions may be referred to as a first terminal and a second terminal.

Figure 21A:
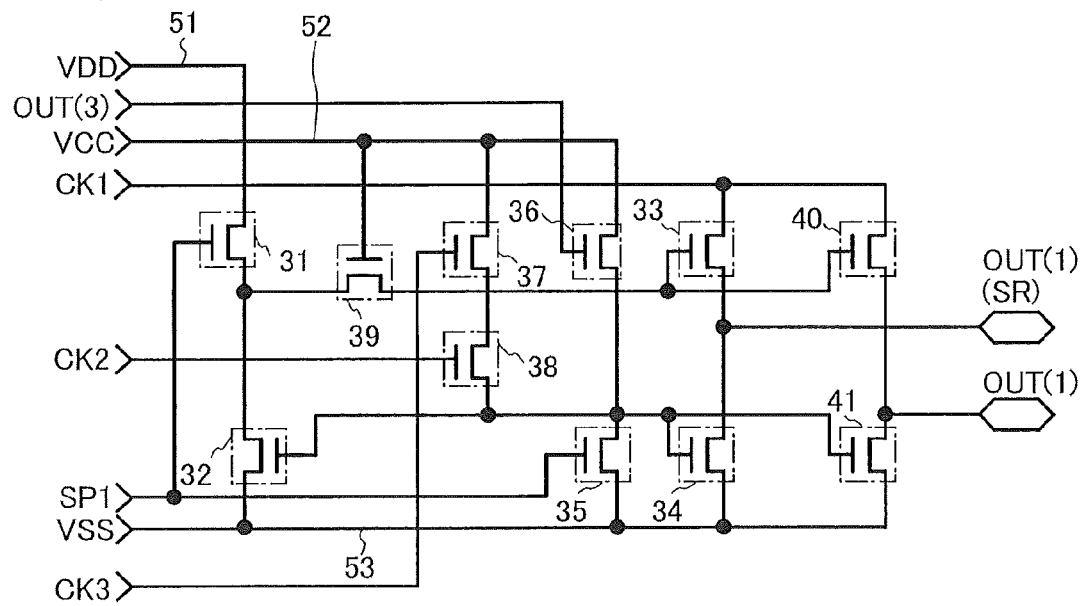
FIG. 21A is a circuit diagram of a shift register and FIG. 21B is a timing chart illustrating operation thereof.
Figure 21B:
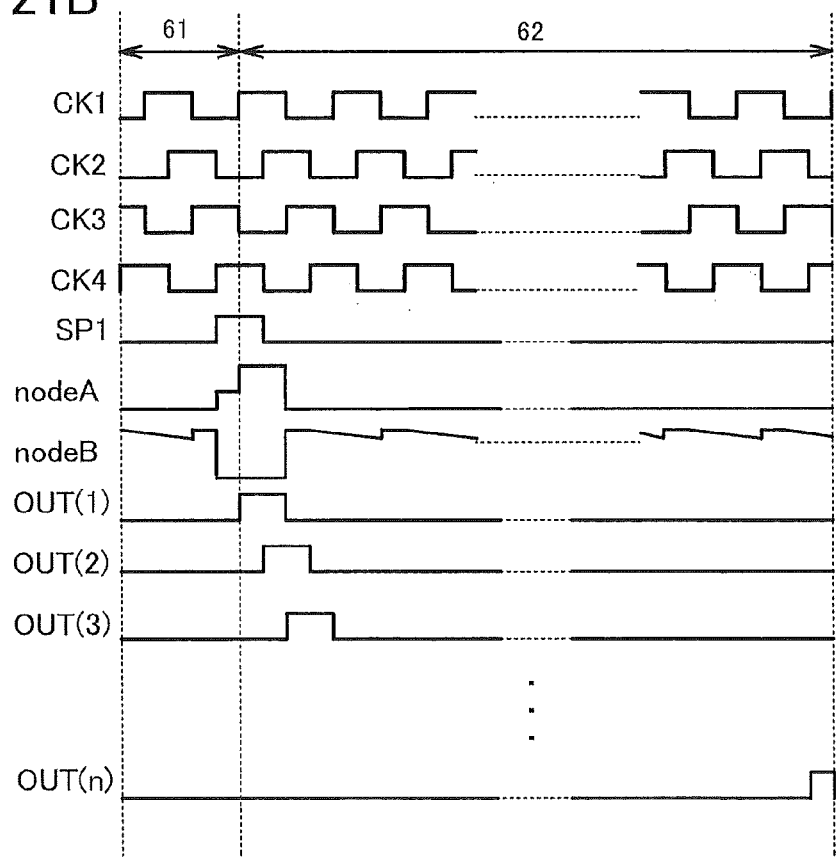

Here, FIG. 21B is a timing chart of the shift register including the plurality of pulse output circuits illustrated in FIG. 21A. Note that when the shift register is included in a scan line driver circuit, a period 61 and a period 62 in FIG. 21B correspond to a vertical retrace period and a gate selection period, respectively.

Note that as illustrated in FIG. 21A, by providing the ninth transistor 39 whose gate is supplied with the second power supply potential VCC, advantages described below are obtained before and after a bootstrap operation.

Without the ninth transistor 39 whose gate is supplied with the second power supply potential VCC, if the potential of the node A is raised by the bootstrap operation, the potential of a source which is the second terminal of the first transistor 31 increases to a value higher than the first power supply potential VDD. Then, the source of the first transistor 31 is switched to the first terminal, that is, the terminal on the power supply line 51 side. Therefore, in the first transistor 31, large voltage is applied and thus significant stress is applied between the gate and the source and between the gate and the drain, which can cause deterioration of the transistor. By providing the ninth transistor 39 whose gate is supplied the second power supply potential VCC, the potential of the node A is raised by the bootstrap operation, but increase in the potential of the second terminal of the first transistor 31 can be prevented. In other words, by providing the ninth transistor 39, negative voltage applied between the gate and the source of the first transistor 31 can be reduced. Accordingly, with the circuit configuration of this embodiment, negative voltage applied between the gate and the source of the first transistor 31 can be reduced, so that deterioration in the first transistor 31 due to stress can further be suppressed.

Note that the ninth transistor 39 is provided so as to be connected between the second terminal of the first transistor 31 and the gate of the third transistor 33 through the first terminal and the second terminal thereof. When the shift register including a plurality of the pulse output circuits described in this embodiment is used, in a signal line driver circuit having more stages than a scan line driver circuit, the ninth transistor 39 may be omitted, which is advantageous in that the number of transistors can be reduced.

When an oxide semiconductor is used for semiconductor layers of the first to eleventh transistor 31 to 41, off current of the thin film transistor can be reduced, on current and field effect mobility can be increased, and the degree of deterioration can be decreased; thus a malfunction in a circuit can be reduced. The degree of deterioration of the transistor formed using an oxide semiconductor, which is caused by application of a high potential to the gate electrode, is small as compared to that of a transistor formed using amorphous silicon. Therefore, even when the first power supply potential VDD is supplied to a power supply line to which the second power supply potential VCC is supplied, similar operation can be performed, and the number of power supply lines which are provided in a circuit can be reduced, so that the circuit can be miniaturized.

Note that even if a wiring connection is changed so that the clock signal which is supplied to the gate electrode of the seventh transistor 37 from the third input terminal 23 and the clock signal which is supplied to the gate electrode of the eighth transistor 38 from the second input terminal 22 are a clock signal which is supplied to the gate electrode of the seventh transistor 37 from the second input terminal 22 and a clock signal which is supplied to the gate electrode of the eighth transistor 38 from the third input terminal 23, respectively, a similar effect can be obtained. At this time, in the shift register illustrated in FIG. 21A, after the seventh transistor 37 and the eighth transistor 38 are both turned on, the seventh transistor 37 is turned off and the eighth transistor 38 is still on, and then the seventh transistor 37 is still off and the eighth transistor 38 is turned off. Thus, fall in the potential of the node B, which is caused by fall in the potentials of the second input terminal 22 and the third input terminal 23, occurs twice because of fall in the potential of the gate electrode of the seventh transistor 37 and fall in the potential of the gate electrode of the eighth transistor 38. On the other hand, when states of the seventh transistor 37 and the eighth transistor 38 in the shift register illustrated in FIG. 21A is changed so that both the seventh transistor 37 and the eighth transistor 38 are on, then the seventh transistor 37 is on and the eighth transistor 38 is off, and then the seventh transistor 37 and the eighth transistor 38 are off, the number of falls in the potential of the node B, which is caused by fall in the potentials of the second input terminal 22 and the third input terminal 23, can be reduced to one time, which is caused by fall in the potential of the gate electrode of the eighth transistor 38. Therefore, the connection relation in which the clock signal CK3 is supplied from the third input terminal 23 to the gate electrode of the seventh transistor 37 and the clock signal CK2 is supplied from the second input terminal 22 to the gate electrode of the eighth transistor 38 is preferable. That is because the number of times of the change in the potential of the node B can be reduced, whereby the noise can be reduced.

In this manner, in a period during which the potentials of the first output terminal 26 and the second output terminal 27 are held at the L level, the H level signal is regularly supplied to the node B; accordingly, a malfunction of the pulse output circuit can be suppressed.

This embodiment can be combined with any of the structures described in the other embodiments as appropriate.

Embodiment 7

When a thin film transistor is manufactured and used for a pixel portion and further for a driver circuit, a semiconductor device having a display function (also referred to as a display device) can be manufactured. Furthermore, when part or whole of a driver circuit is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric action, such as electronic ink, can be used.

The display device includes a panel in which the display element is sealed, and a module in which an IC or the like including a controller is mounted on the panel. The display device relates to one embodiment of an element substrate before the display element is completed in a manufacturing process of the display device, and the element substrate is provided with a means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by a chip on glass (COG) method.

The appearance and a cross section of a liquid crystal display panel, which is one embodiment of a semiconductor device, will be described with reference to FIGS. 14A1, 14A2 and 14B. FIGS. 14A1 and 14A2 are each a plan view of a panel in which thin film transistors 4010 and 4011 and a liquid crystal element 4013 are sealed between a first substrate 4001 and a second substrate 4006 with a sealant

4005. FIG. 14B is a cross-sectional view taken along line M-N of FIGS. 14A1 and 14A2.

The sealant 4005 is provided so as to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 14A1 illustrates an example of mounting the signal line driver circuit 4003 by a COG method, and FIG. 14A2 illustrates an example of mounting the signal line driver circuit 4003 by a TAB method.

The pixel portion 4002 and the scan line driver circuit 4004 provided over the first substrate 4001 each include a plurality of thin film transistors. FIG. 14B illustrates the thin film transistor 4010 included in the pixel portion 4002 and the thin film transistor 4011 included in the scan line driver circuit 4004 as an example. Insulating layers 4041, 4020, 4042, and 4021 are provided over the thin film transistors 4010 and 4011. Further, an insulating layer 4043 is provided over the first substrate 4001, and an insulating layer 4044 and an insulating layer 4045 are provided over the gate electrode layers of the thin film transistors. A source wiring 4046 is provided over the insulating layer 4020 and connected to a source electrode or a drain electrode of the thin film transistor 4010 through a contact hole formed in the insulating layer 4020 and the insulating layer 4041.

As the thin film transistors 4010 and 4011, the highly-reliable thin film transistor including an oxide semiconductor layer, which is described in any of Embodiments 1 to 4, can be employed. In this embodiment, the thin film transistors 4010 and 4011 are n-channel thin film transistors.

A conductive layer 4040 is provided over the insulating layer 4021, which overlaps with a channel formation region of an oxide semiconductor layer in the thin film transistor 4011 for the driver circuit. The conductive layer 4040 is provided in the position overlapping with the channel formation region of the oxide semiconductor layer, whereby the amount of shift in the threshold voltage of the thin film transistor 4011 before and after a BT test can be reduced. The potential of the conductive layer 4040 may be the same as or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be in a floating state.

Note that a thin film transistor manufactured in accordance with the process described in Embodiment 2 includes a highly purified oxide semiconductor layer. Specifically, in order to prevent entry of an impurity (e.g., a hydrogen atom, a compound including a hydrogen atom such as $H_2O$, or a compound including a carbon atom), evacuation with a cryopump or the like is performed at the time of forming the oxide semiconductor layer. Further, the oxide semiconductor layer is subjected to heat treatment for dehydration or dehydrogenation after its formation. Furthermore, an oxide insulating film is formed in contact with a region where a so-called back channel of the thin film transistor is formed, whereby impurities are diffused from the oxide semiconductor layer into the oxide insulating film.

In addition, by providing the conductive layer 4040 in a position overlapping with the channel formation region, the thin film transistor is shielded from static electricity. When the thin film transistor is shielded from static electricity, the number of carriers due to static electricity can be reduced.

When the oxide semiconductor layer is highly purified and shielded from static electricity, the carrier density of the oxide semiconductor layer is reduced. For example, the carrier density of the oxide semiconductor layer can be suppressed to $1 \times 10^{14}/cm^3$ or lower. In this manner, by using an oxide semiconductor layer with a suppressed carrier density for a thin film transistor, the transistor can have small off current ($I_{off}$). Moreover, by applying the thin film transistor whose off current ($I_{off}$) is suppressed to a display device, the display device can have low power consumption.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that as the first substrate 4001 and the second substrate 4006, a light-transmitting substrate can be employed, and glass, ceramic, or plastic can be used. As plastic, a fiberglass-reinforced plastics (FRP) plate, a polyvinyl fluoride (PVF) film, a polyester film, or an acrylic resin film can be used.

A spacer 4035 is a columnar spacer obtained by selective etching of an insulating film and is provided in order to control the distance (a cell gap) between the pixel electrode layer 4030 and the counter electrode layer 4031. Note that a spherical spacer may be used as the spacer 4035. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are included in the sealant 4005.

Alternatively, liquid crystal exhibiting a blue phase for which an alignment film is unnecessary may be used. A blue phase is one of the liquid crystal phases, which is generated just before a cholesteric phase changes into an isotropic phase while temperature of cholesteric liquid crystal is raised. Since the blue phase is generated within a narrow range of temperature, a liquid crystal composition including a chiral agent at 5 weight % or more is used for the liquid crystal layer 4008 in order to improve the temperature range. The liquid crystal composition which includes liquid crystal exhibiting a blue phase and a chiral agent has short response time of 1 msec or less, has optical isotropy, which makes the alignment treatment unneeded, and has a small viewing angle dependence.

An embodiment of the present invention can also be applied to a transflective liquid crystal display device, in addition to a transmissive liquid crystal display device.

An example of the liquid crystal display device is described in which a polarizing plate is provided on the outer surface of the substrate (on the viewer side) and a coloring layer (color filter) and an electrode layer used for a display element are provided on the inner surface of the substrate in this order; however, the polarizing plate may be provided on the inner surface of the substrate. The stacked-layer structure of the polarizing plate and the coloring layer is not limited to that of this embodiment and may be set as appropriate in accordance with materials of the polarizing plate and the coloring layer or conditions of the manufacturing process.

Over the thin film transistor 4011, the insulating layer 4041 is formed as a protective insulating film to be in contact with the semiconductor layer including the channel formation region. The insulating layer 4041 may be formed using a material and a method similar to those of the insulating layer 208 described in Embodiments 1 and 2, for example. Here, a silicon oxide film is formed as the insulating layer 4041 by a sputtering method in a manner similar to that of Embodiments 1 and 2.

In order to reduce surface roughness due to the thin film transistors, the insulating layer 4021 functioning as a planarization insulating film is formed over the insulating layer 4020. As the insulating layer 4021, an organic material having heat resistance such as polyimide, an acrylic resin, a benzocyclobutene-based resin, polyamide, or an epoxy resin can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using any of these materials.

Note that a siloxane-based resin is a resin which is formed from a siloxane-based material as a starting material and has a Si—O—Si bond. The siloxane-based resin may include as a substituent an organic group (e.g., an alkyl group or an aryl group) or a fluoro group. The organic group may include a fluoro group.

There is no particular limitation on the method for forming the insulating layer 4021, and the insulating layer 4021 can be formed, depending on the material, by a sputtering method, an SOG method, spin coating, dipping, spray coating, a droplet discharge method (such as an inkjet method, screen printing, or offset printing), or with a tool such as a doctor knife, a roll coater, a curtain coater, or a knife coater. When a baking step of the insulating layer 4021 also serves as the annealing step of the semiconductor layer, the semiconductor device can be manufactured efficiently.

The pixel electrode layer 4030 and the counter electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. A pixel electrode formed using the conductive composition preferably has a sheet resistance of 10000 ohms per square or less and a light transmittance of 70% or higher at a wavelength of 550 nm. Furthermore, the resistivity of the conductive high molecule included in the conductive composition is preferably 0.1 Ω·cm or lower.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

A variety of signals and potentials are supplied from an FPC 4018 to the signal line driver circuit 4003 that is formed separately, and the scan line driver circuit 4004 or the pixel portion 4002.

A connection terminal electrode 4015 is formed from the same conductive film as the pixel electrode layer 4030 included in the liquid crystal element 4013, and a terminal electrode 4016 is formed from the same conductive film as source electrode layers and drain electrode layers of the thin film transistors 4010 and 4011.

The connection terminal electrode 4015 is electrically connected to a terminal included in the FPC 4018 through an anisotropic conductive film 4019.

FIGS. 14A1, 14A2 and 14B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 23:
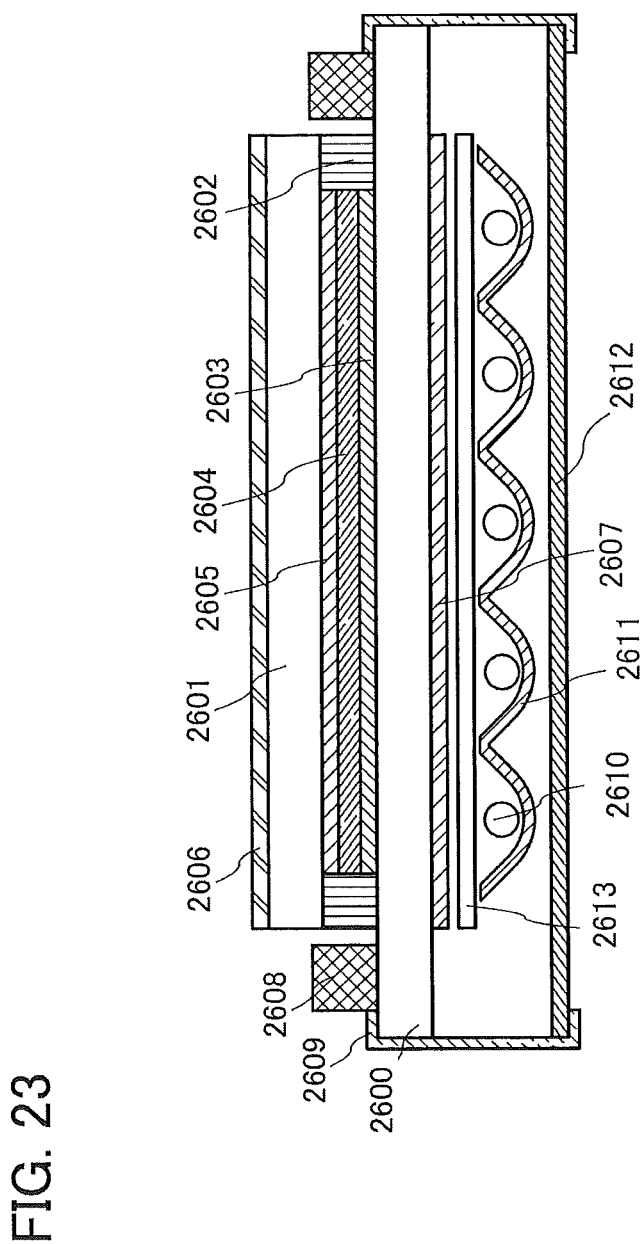
FIG. 23 illustrates a semiconductor device.

FIG. 23 illustrates an example of a liquid crystal display module which is formed as a semiconductor device with the use of a TFT substrate 2600 manufactured in accordance with the manufacturing method disclosed in this specification.

FIG. 23 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflection plate 2611. A circuit board 2612 is connected to a wiring circuit portion 2608 of the TFT substrate 2600 through a flexible wiring board 2609 and includes an external circuit such as a control circuit or a power supply circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above process, a highly reliable liquid crystal display panel as a semiconductor device can be manufactured.

By manufacturing the above liquid crystal display device with the use of the display device described in any of Embodiments 1 to 5, a gate wiring or a source wiring can be formed using a conductive material including Cu; accordingly, increase in wiring resistance can be prevented. Consequently, high speed operation and low power consumption of the above liquid crystal display device can be achieved, and thus the liquid crystal display device can have a large-sized screen or a high definition screen.

This embodiment can be combined with any of the structures described in the other embodiments as appropriate.

Embodiment 8

In this embodiment, an example of electronic paper will be described as one embodiment of a semiconductor device.

The thin film transistor of Embodiment 1 may be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. An electrophoretic display includes a plurality of microcapsules dispersed in a solvent or a solute, and each microcapsule includes first particles which are positively charged and second particles which are negatively charged. By applying an electric field to the microcapsules, the particles in the microcapsules move in opposite directions and only the color of the particles gathering on one side is displayed. Note that the first particles and the second particles each include a pigment and do not move without an electric field. In addition, the first particles and the second particles have different colors (which may be colorless).

Thus, an electrophoretic display is a display that utilizes a so-called dielectrophoretic effect by which a substance having a high dielectric constant moves to a high electric field region.

A solution in which the above microcapsules are dispersed in a solvent is called electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed and display can be performed by application of an electric field to the microcapsules. For example, the active matrix substrate obtained using the thin film transistor described in Embodiment 1 can be used.

Note that the first particles and the second particles in the microcapsules may be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these materials.

Figure 22:
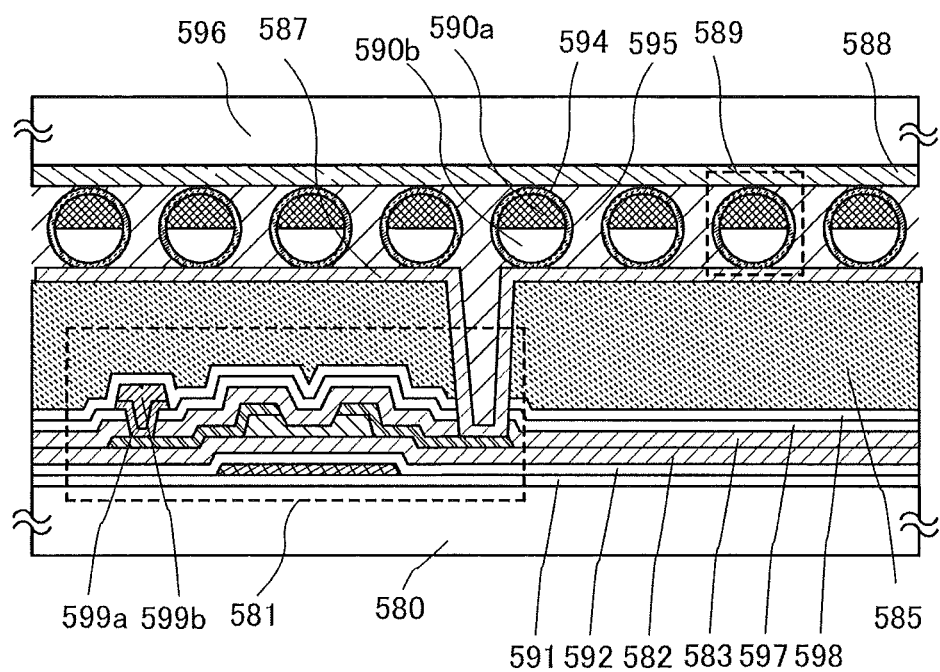
FIG. 22 illustrates a semiconductor device.

FIG. 22 illustrates active matrix electronic paper as an example of a semiconductor device. A thin film transistor 581 used for the semiconductor device can be manufactured in a manner similar to that of the thin film transistors described in Embodiments 1 and 2 and is a highly reliable thin film transistor including an oxide semiconductor layer.

The electronic paper in FIG. 22 is an example of a display device using a twisting ball display system. The twisting ball display system refers to a method in which spherical particles each colored in black and white are arranged between a first electrode layer 587 and a second electrode layer 588 which are electrode layers used for a display element, and a potential difference is generated between the first electrode layer and the second electrode layer to control orientation of the spherical particles, so that display is performed.

The thin film transistor 581 formed over a substrate 580 is a thin film transistor having a bottom gate structure and is covered with an insulating layer 583 which is in contact with the semiconductor layer. An insulating layer 591 is formed over the substrate 580, an insulating layer 592 and an insulating layer 582 are formed over the gate electrode of the thin film transistor, and an insulating layer 597 and an insulating layer 598 are formed over the insulating layer 583. Further, a source wiring 599a and a source wiring 599b are formed over the insulating layer 583 and connected to a source electrode layer or a drain electrode layer of the thin film transistor 581 through a contact hole formed in the insulating layer 583 and the insulating layer 597. The source electrode layer or the drain electrode layer of the thin film transistor 581 is in contact with the first electrode layer 587 through an opening formed in an insulating layer 585, whereby the thin film transistor 581 is electrically connected to the first electrode layer 587. Spherical particles 589 are provided between the first electrode layer 587 and the second electrode layer 588 formed on a substrate 596. Each of the spherical particles 589 includes a black region 590a, a white region 590b, and a cavity 594 filled with liquid around the black region 590a and the white region 590b. A space around the spherical particles 589 is filled with a filler 595 such as a resin (see FIG. 22). The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between the pair of substrates.

Instead of the twisting ball, an electrophoretic element can be used. A microcapsule with a diameter of approximately 10 μm to 200 μm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and a device using the electrophoretic display element is generally called electronic paper. The electrophoretic display element has higher reflectance than a liquid crystal display element, and thus, an auxiliary light is unnecessary, power consumption is low, and a display portion can be recognized even in a dim environment. Moreover, even when power is not supplied to the display portion, an image which has been displayed once can be maintained. Accordingly, a displayed image can be stored even if a semiconductor device having a display function (which may be referred to simply as a display device or a semiconductor device provided with a display device) is disconnected from an electric wave source.

Through the above process, highly reliable electronic paper as a semiconductor device can be manufactured.

In the case where a thin film transistor in a pixel portion of the above electronic paper is manufactured using any of methods for manufacturing the thin film transistors described in Embodiments 1 to 5, display unevenness due to variation in the threshold voltage of thin film transistors of respective pixels can be suppressed.

By manufacturing the above electronic paper with the use of the display device described in any of Embodiments 1 to 3, a gate wiring or a source wiring can be formed using a conductive material including Cu; accordingly, increase in wiring resistance can be prevented. Consequently, high speed operation and low power consumption of the above electronic paper can be achieved, and thus the electronic paper can have a large-sized screen or a high definition screen.

This embodiment can be combined with any of the structures described in the other embodiments as appropriate.

Embodiment 9

An example of a light-emitting display device will be described as a semiconductor device. As a display element included in the display device, a light-emitting element utilizing electroluminescence is described here. Light-emitting elements utilizing electroluminescence are classified according to whether a light-emitting material is an organic compound or an inorganic compound. In general, the former is referred to as an organic EL element and the latter is referred to as an inorganic EL element.

In an organic EL element, by application of voltage to a light-emitting element, electrons and holes are separately injected from a pair of electrodes into a layer including a light-emitting organic compound, and current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 16:
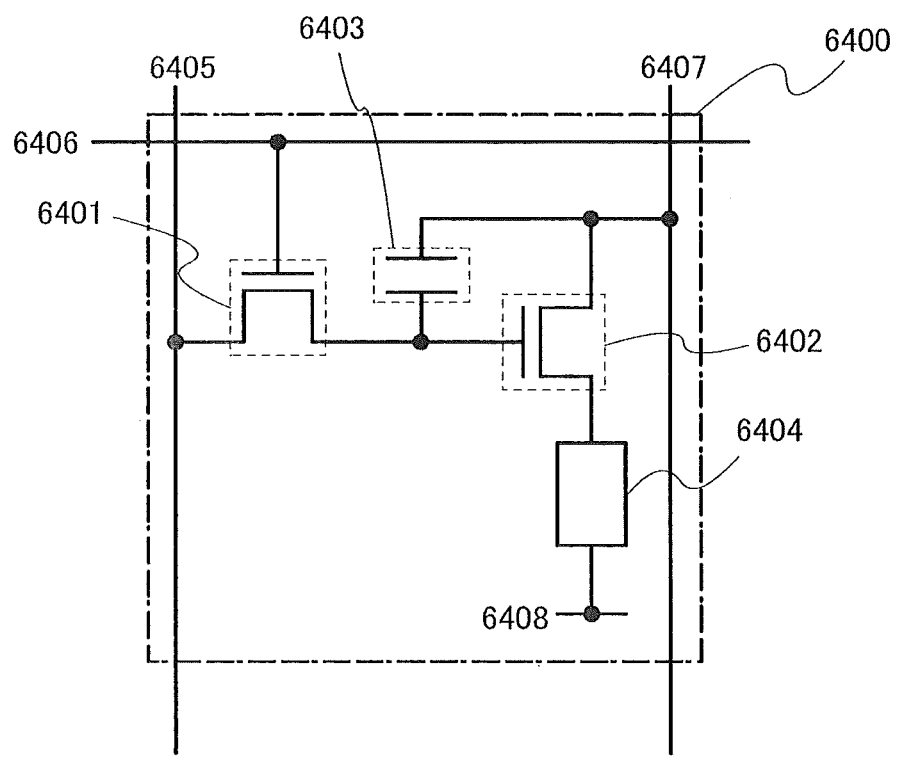
FIG. 16 illustrates a pixel equivalent circuit of a semiconductor device.

FIG. 16 illustrates an example of a pixel configuration as an example of a semiconductor device, which can be driven by a digital time grayscale method.

The configuration and operation of a pixel which can be driven by a digital time grayscale method will be described. An example is described here in which one pixel includes two n-channel transistors using an oxide semiconductor layer in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (a pixel electrode) of the light-emitting element 6404. A second electrode of the light-emitting element 6404 corresponds to a common electrode 6408. The common electrode 6408 is electrically connected to a common potential line formed over the same substrate.

Note that the second electrode (the common electrode 6408) of the light-emitting element 6404 is set to a low power supply potential. The low power supply potential is lower than a high power supply potential which is supplied to the power supply line 6407 when the high power supply potential is a reference. For example, GND and 0 V may be set as the low power supply potential. The potential difference between the high power supply potential and the low power supply potential is applied to the light-emitting element 6404 so that current flows through the light-emitting element 6404, whereby the light-emitting element 6404 emits light. Thus, each potential is set so that the potential difference between the high power supply potential and the low power supply potential is greater than or equal to forward threshold voltage of the light-emitting element 6404.

When the gate capacitance of the driver transistor 6402 is used as a substitute for the capacitor 6403, the capacitor 6403 can be omitted. The gate capacitance of the driver transistor 6402 may be formed between a channel region and a gate electrode.

Here, in the case of using a voltage-input voltage driving method, a video signal is input to the gate of the driver transistor 6402 so that the driver transistor 6402 is sufficiently turned on or off. That is, the driver transistor 6402 operates in a linear region, and thus voltage higher than the voltage of the power supply line 6407 is applied to the gate electrode of the driver transistor 6402. Note that voltage higher than or equal to (power supply line voltage+$V_{th}$ of the driver transistor 6402) is applied to the signal line 6405.

In the case of using an analog grayscale method instead of the digital time grayscale method, the same pixel configuration as in FIG. 16 can be employed by inputting signals in a different way.

In the case of using the analog grayscale method, voltage higher than or equal to (forward voltage of the light-emitting element 6404+$V_{th}$ of the driver transistor 6402) is applied to the gate electrode of the driver transistor 6402. The forward voltage of the light-emitting element 6404 refers to voltage at which a desired luminance is obtained, and is higher than at least forward threshold voltage. By inputting a video signal to enable the driver transistor 6402 to operate in a saturation region, current can be supplied to the light-emitting element 6404. In order that the driver transistor 6402 can operate in the saturation region, the potential of the power supply line 6407 is set higher than a gate potential of the driver transistor 6402. Since the video signal is an analog signal, current according to the video signal flows in the light-emitting element 6404, and analog grayscale driving can be performed.

Note that the pixel configuration is not limited to that illustrated in FIG. 16. For example, the pixel illustrated in FIG. 16 can further include a switch, a resistor, a capacitor, a transistor, a logic circuit, or the like.

Next, structures of the light-emitting element will be described with reference to FIGS. 17A to 17C. Here, a cross-sectional structure of a pixel will be described by taking an re-channel driver TFT as an example. A driver TFT 7001, a driver TFT 7011, and a driver TFT 7021 used for semiconductor devices illustrated in FIGS. 17A to 17C can be manufactured in a manner similar to that of the thin film transistors described in Embodiments 1 and 2 and are highly reliable thin film transistors each including an oxide semiconductor layer.

In order to extract light emitted from the light-emitting element, at least one of an anode and a cathode is required to transmit light. A thin film transistor and a light-emitting element are formed over a substrate. A light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side. The pixel configuration can be applied to a light-emitting element having any of these emission structures.

A light-emitting element having a bottom emission structure will be described with reference to FIG. 17A.

Figure 17A:
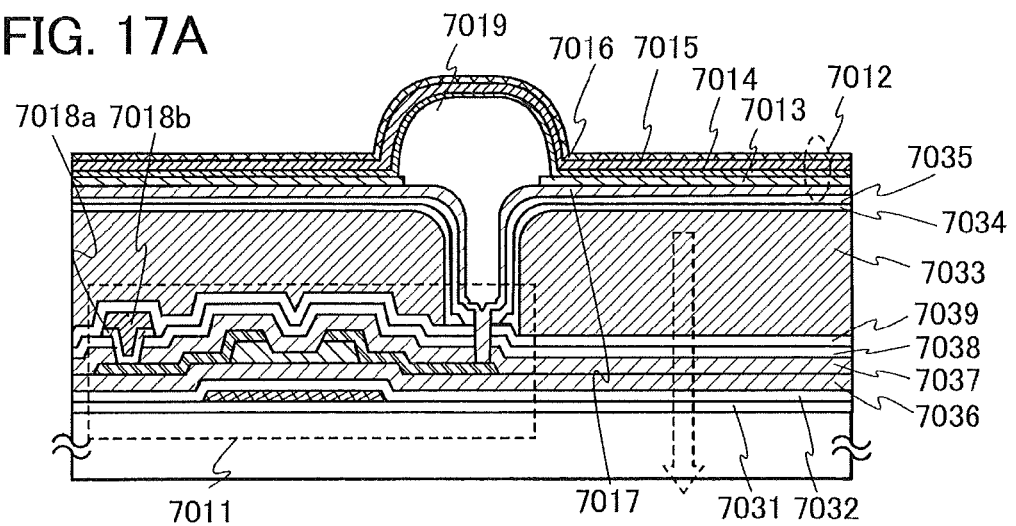
FIGS. 17A to 17C illustrate semiconductor devices.

FIG. 17A is a cross-sectional view of a pixel in the case where the driver TFT 7011 is an n-channel TFT and light is emitted from a light-emitting element 7012 to a cathode 7013 side. In FIG. 17A, the cathode 7013 of the light-emitting element 7012 is formed over a light-transmitting conductive film 7017 which is electrically connected to the driver TFT 7011, and an EL layer 7014 and an anode 7015 are stacked in this order over the cathode 7013. Further, an insulating layer 7031 is formed over a substrate, an insulating layer 7032 and an insulating layer 7036 are formed over a gate electrode of the driver TFT 7011, and insulating layers 7037, 7038, and 7039 are formed over a source electrode and a drain electrode of the driver TFT 7011. A source wiring 7018a and a source wiring 7018b are formed over the insulating layer 7038 and connected to the source electrode of the driver TFT 7011 through a contact hole formed in the insulating layer 7037 and the insulating layer 7038. Note that the light-transmitting conductive film 7017 is electrically connected to the drain electrode of the driver TFT 7011 through a contact hole formed in the insulating layers 7037, 7038, and 7039.

As the light-transmitting conductive film 7017, a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used.

The cathode 7013 can be formed using various materials, and a material having a relatively low work function, for example, an alkali metal such as Li or Cs, an alkaline earth metal such as Mg, Ca, or Sr, an alloy including any of these (such as Mg:Ag or Al:Li), a rare earth metal such as Yb or Er, or the like is preferable. In FIG. 17A, the thickness of the cathode 7013 is approximately a thickness that transmits light (preferably approximately 5 nm to 30 nm). For example, an aluminum film having a thickness of 20 nm is used for the cathode 7013.

Note that the light-transmitting conductive film and the aluminum film may be stacked and selectively etched to form the light-transmitting conductive film 7017 and the cathode 7013; in this case, etching can be performed using the same mask, which is preferable.

The peripheral portion of the cathode 7013 is covered with a partition wall 7019. The partition wall 7019 is formed using an organic resin film of polyimide, an acrylic resin, polyamide, an epoxy resin, or the like; an inorganic insulating film; or organic polysiloxane. It is particularly preferable that the partition wall 7019 be formed using a photosensitive resin material to have an opening over the cathode 7013 so that a sidewall of the opening is formed as an inclined surface with continuous curvature. In the case where a photosensitive resin material is used for the partition wall 7019, a step of forming a resist mask can be omitted.

The EL layer 7014 formed over the cathode 7013 and the partition wall 7019 may be formed as a single layer or a plurality of layers stacked. When the EL layer 7014 is formed as a plurality of layers, an electron-injection layer, an electron-transport layer, a light-emitting layer, a hole-transport layer, and a hole-injection layer are stacked in this order over the cathode 7013. Note that not all of these layers other than the light-emitting layer need to be provided.

The stacking order is not limited to the above stacking order, and a hole-injection layer, a hole-transport layer, a light-emitting layer, an electron-transport layer, and an electron-injection layer may be stacked in this order over the cathode 7013. However, when power consumption is compared, an electron-injection layer, an electron-transport layer, a light-emitting layer, a hole-transport layer, and a hole-injection layer are preferably stacked in this order over the cathode 7013 because of lower power consumption.

For the anode 7015 formed over the EL layer 7014, various materials can be used, and a material having a high work function such as titanium nitride, ZrN, Ti, W, Ni, Pt, or Cr; or a light-transmitting conductive material such as ITO, IZO (indium oxide zinc oxide), or ZnO is preferably used, for example. For a light-blocking film 7016 over the anode 7015, for example, a metal which blocks light, a metal which reflects light, or the like is used. In this embodiment, an ITO film is used for the anode 7015, and a Ti film is used for the light-blocking film 7016.

The light-emitting element 7012 corresponds to a region where the EL layer 7014 is sandwiched between the cathode 7013 and the anode 7015. In the case of the element structure illustrated in FIG. 17A, light is emitted from the light-emitting element 7012 to the cathode 7013 side as indicated by an arrow.

Note that an example in which a light-transmitting conductive film is used as a gate electrode is illustrated in FIG. 17A, and light is emitted from the light-emitting element 7012 through a color filter layer 7033.

The color filter layer 7033 is formed by a droplet discharge method such as an inkjet method, a printing method, an etching method using a photolithography technique, or the like.

The color filter layer 7033 is covered with an overcoat layer 7034, and also covered with a protective insulating layer 7035. Note that the overcoat layer 7034 with a thin thickness is illustrated in FIG. 17A; however, the overcoat layer 7034 has a function to planarize a surface with unevenness due to the color filter layer 7033.

A contact hole which is formed in the protective insulating layer 7035, the overcoat layer 7034, and insulating layers 7037, 7038, and 7039 and reaches the drain electrode is provided in a position overlapping with the partition wall 7019. In FIG. 17A, the contact hole which reaches the drain electrode and the partition wall 7019 overlap with each other, whereby the aperture ratio can be improved.

Next, a light-emitting element having a dual emission structure will be described with reference to FIG. 17B.

Figure 17B:
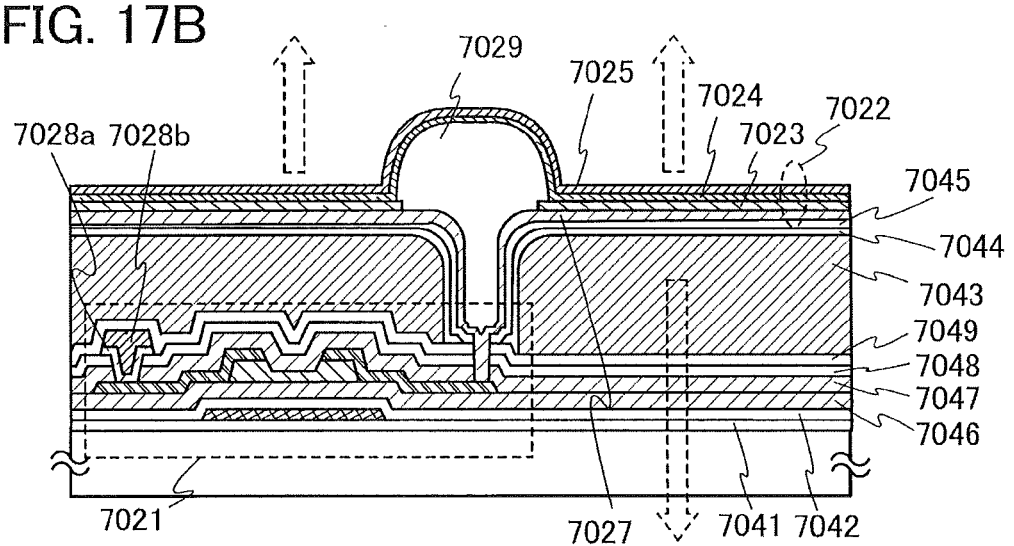

In FIG. 17B, a cathode 7023 of a light-emitting element 7022 is formed over a light-transmitting conductive film 7027 which is electrically connected to the driver TFT 7021, and an EL layer 7024 and an anode 7025 are stacked in this order over the cathode 7023. Further, an insulating layer 7041 is formed over a substrate, an insulating layer 7042 and an insulating layer 7046 are formed over a gate electrode of the driver TFT 7021, and insulating layers 7047, 7048, and 7049 are formed over a source electrode and a drain electrode of the driver TFT 7021. A source wiring 7028*a* and a source wiring 7028*b* are formed over the insulating layer 7048 and connected to the source electrode of the driver TFT 7021 through a contact hole formed in the insulating layer 7047 and the insulating layer 7048. Note that the light-transmitting conductive film 7027 is electrically connected to the drain electrode of the driver TFT 7021 through a contact hole formed in the insulating layers 7047, 7048, and 7049.

For the light-transmitting conductive film 7027, a light-transmitting conductive film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like can be used.

The cathode 7023 can be formed using a variety of materials, and a material having a relatively low work function, for example, an alkali metal such as Li or Cs; an alkaline earth metal such as Mg, Ca, or Sr; an alloy including any of these (such as Mg:Ag or Al:Li); a rare earth metal such as Yb or Er; or the like is preferable. In this embodiment, the thickness of the cathode 7023 is approximately a thickness that transmits light (preferably approximately 5 nm to 30 nm). For example, an aluminum film having a thickness of 20 nm is used for the cathode 7023.

Note that the light-transmitting conductive film and the aluminum film may be stacked and selectively etched to form the light-transmitting conductive film 7027 and the cathode 7023. In this case, etching can be performed using the same mask, which is preferable.

The peripheral portion of the cathode 7023 is covered with a partition wall 7029. The partition wall 7029 is formed using an organic resin film of polyimide, an acrylic resin, polyamide, an epoxy resin, or the like; an inorganic insulating film; or organic polysiloxane. It is particularly preferable that the partition wall 7029 be formed using a photosensitive resin material to have an opening over the cathode 7023 so that a sidewall of the opening is formed as an inclined surface with continuous curvature. In the case where a photosensitive resin material is used for the partition wall 7029, a step of forming a resist mask can be omitted.

The EL layer 7024 formed over the cathode 7023 and the partition wall 7029 may be formed as a single layer or a plurality of layers stacked. When the EL layer 7024 is formed as a plurality of layers, an electron-injection layer, an electron-transport layer, a light-emitting layer, a hole-transport layer, and a hole-injection layer are stacked in this order over the cathode 7023. Note that not all of these layers other than the light-emitting layer need to be provided.

The stacking order is not limited to the above stacking order, and a hole-injection layer, a hole-transport layer, a light-emitting layer, an electron-transport layer, and an electron-injection layer may be stacked in this order over the cathode 7023. However, when power consumption is compared, an electron-injection layer, an electron-transport layer, a light-emitting layer, a hole-transport layer, and a hole-injection layer are preferably stacked in this order over the cathode 7023 because of lower power consumption.

For the anode 7025 formed over the EL layer 7024, various materials can be used, and a material having a relatively high work function, for example, a light-transmitting conductive material such as ITO, IZO, or ZnO is preferable. In this embodiment, an ITO film including silicon oxide is used for the anode 7025.

The light-emitting element 7022 corresponds to a region where the EL layer 7024 is sandwiched between the cathode 7023 and the anode 7025. In the case of the element structure illustrated in FIG. 17B, light is emitted from the light-emitting element 7022 to both the anode 7025 side and the cathode 7023 side as indicated by arrows.

Note that an example in which a light-transmitting conductive film is used as the gate electrode is illustrated in FIG. 17B, and light is emitted from the light-emitting element 7022 to the cathode 7023 side through a color filter layer 7043.

The color filter layer 7043 is formed by a droplet discharge method such as an inkjet method, a printing method, an etching method using a photolithography technique, or the like.

The color filter layer 7043 is covered with an overcoat layer 7044, and also covered with a protective insulating layer 7045.

A contact hole which is formed in the protective insulating layer 7045, the overcoat layer 7044, and the insulating layers 7047, 7048, and 7049 and reaches the drain electrode is provided in a position overlapping with the partition wall 7029. The contact hole which reaches the drain electrode and the partition wall 7029 overlap with each other, whereby the aperture ratio on the anode 7025 side can be substantially the same as the aperture ratio on the cathode 7023 side.

Note that when a light-emitting element having a dual emission structure is used and full color display is performed on both display surfaces, light from the anode 7025 side does not pass through the color filter layer 7043; therefore, a sealing substrate provided with another color filter layer is preferably provided over the anode 7025.

Next, a light-emitting element having a top emission structure will be described with reference to FIG. 17C.

Figure 17C:
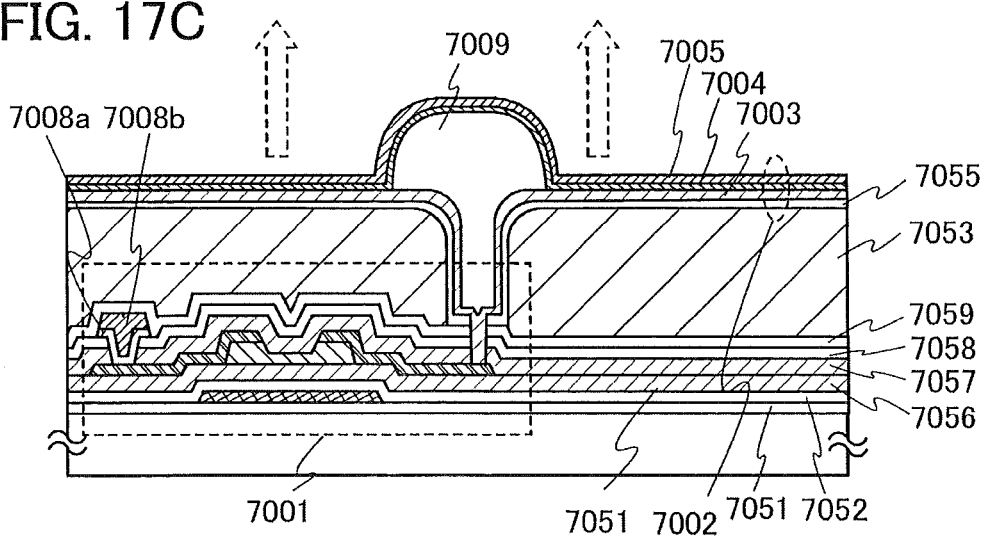

FIG. 17C is a cross-sectional view of a pixel in the case where the driver TFT 7001 is an n-channel TFT and light is emitted from a light-emitting element 7002 to an anode 7005 side. In FIG. 17C, a cathode 7003 of the light-emitting element 7002 which is electrically connected to the driver TFT 7001 is formed, and an EL layer 7004 and the anode 7005 are stacked in this order over the cathode 7003. Further, an insulating layer 7051 is formed over a substrate, an insulating layer 7052 and an insulating layer 7056 are formed over a gate electrode of the driver TFT 7001, and insulating layers 7057, 7058, and 7059 are formed over a source electrode and a drain electrode of the driver TFT 7001. A source wiring 7008*a* and a source wiring 7008*b* are formed over the insulating layer 7058 and connected to the source electrode of the driver TFT 7001 through a contact hole formed in the insulating layer 7057 and the insulating layer 7058. Note that the cathode 7003 is electrically connected to the drain electrode of the driver TFT 7001 through the contact hole formed in the insulating layers 7057, 7058, and 7059.

The cathode 7003 can be formed using a variety of materials, and a material having a relatively low work function, for example, an alkali metal such as Li or Cs; an alkaline earth metal such as Mg, Ca, or Sr; an alloy including any of these (such as Mg:Ag or Al:Li); a rare earth metal such as Yb or Er; or the like is preferable.

The peripheral portion of the cathode 7003 is covered with a partition wall 7009. The partition wall 7009 is formed using an organic resin film of polyimide, an acrylic resin, polyamide, an epoxy resin, or the like; an inorganic insulating film; or organic polysiloxane. It is particularly preferable that the partition wall 7009 be formed using a photosensitive resin material to have an opening over the cathode 7003 so that a sidewall of the opening is formed as an inclined surface with continuous curvature. In the case where a photosensitive resin material is used for the partition wall 7009, a step of forming a resist mask can be omitted.

The EL layer 7004 which is formed over the cathode 7003 and the partition wall 7009 may be formed using a single layer or a plurality of layers stacked. When the EL layer 7004 is formed using a plurality of layers, an electron-injection layer, an electron-transport layer, a light-emitting layer, a hole-transport layer, and a hole-injection layer are stacked in this order over the cathode 7003. Note that not all of these layers other than the light-emitting layer need to be provided.

The stacking order is not limited to the above stacking order, and a hole-injection layer, a hole-transport layer, a light-emitting layer, an electron-transport layer, and an electron-injection layer may be stacked in this order over the cathode 7003. In the case where these layers are stacked in this order, the cathode 7003 functions as an anode.

In FIG. 17C, a hole-injection layer, a hole-transport layer, a light-emitting layer, an electron-transport layer, and an electron-injection layer are stacked in this order over a stacked film in which a Ti film, an aluminum film, and a Ti film are formed in this order, and thereover, a stacked layer of a Mg:Ag alloy thin film and an ITO film is formed.

However, when power consumption is compared, an electron-injection layer, an electron-transport layer, a light-emitting layer, a hole-transport layer, and a hole-injection layer are preferably stacked in this order over the cathode 7003 because of lower power consumption.

The anode 7005 is formed using a light-transmitting conductive material which transmits light, and for example, a light-transmitting conductive film of indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like may be used.

The light-emitting element 7002 corresponds to a region where the EL layer 7004 is sandwiched between the cathode 7003 and the anode 7005. In the case of the pixel illustrated in FIG. 17C, light is emitted from the light-emitting element 7002 to the anode 7005 side as indicated by arrows.

In FIG. 17C, the drain electrode of the TFT 7001 is electrically connected to the cathode 7003 through a contact hole formed in the insulating layers 7057, 7058, and 7059. A planarization insulating layer 7053 can be formed using a resin material such as polyimide, an acrylic resin, a benzocyclobutene-based resin, polyamide, or an epoxy resin. In addition to such resin materials, it is also possible to use a low-dielectric constant material (a low-k material), a siloxane-based resin, phosphosilicate glass (PSG), borophosphosilicate glass (BPSG), or the like. Note that the planarization insulating layer 7053 may be formed by stacking a plurality of insulating films formed using any of these materials. There is no particular limitation on the method for forming the planarization insulating layer 7053, and the planarization insulating layer 7053 can be formed, depending on the material, by a method such as a sputtering method, an SOG method, spin coating, dipping, spray coating, or a droplet discharge method (such as an inkjet method, screen printing, or offset printing), or with a tool such as a doctor knife, a roll coater, a curtain coater, or a knife coater. In addition, an insulating layer 7055 is preferably provided over the planarization insulating layer 7053.

The partition wall 7009 is provided so as to insulate the cathode 7003 and a cathode of an adjacent pixel. The partition wall 7009 is formed using an organic resin film of polyimide, an acrylic resin, polyamide, an epoxy resin, or the like; an inorganic insulating film; or organic polysiloxane. It is particularly preferable that the partition wall 7009 be formed using a photosensitive resin material to have an opening over the cathode 7003 so that a sidewall of the opening is formed as an inclined surface with continuous curvature. In the case where a photosensitive resin material is used for the partition wall 7009, a step of forming a resist mask can be omitted.

In the structure of FIG. 17C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include white light-emitting elements as well as three kinds of light-emitting elements.

In the structure of FIG. 17C, a light-emitting display device capable of full color display may be manufactured in such a manner that all of a plurality of light-emitting elements which is arranged is white light-emitting elements and a sealing substrate having a color filter or the like is provided over the light-emitting element 7002. A material which exhibits a single color such as white is formed and combined with a color filter or a color conversion layer, whereby full color display can be performed.

Needless to say, display of monochromatic light emission may be performed. For example, a lighting device may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can also be provided as a light-emitting element.

Note that the example is described in which a thin film transistor (a driver TFT) which controls the driving of a light-emitting element is electrically connected to the light-emitting element; however, a structure may be employed in which a TFT for current control is connected between the driver TFT and the light-emitting element.

When a light-emitting element and a partition wall are not provided, one embodiment of the present invention can also be applied to a liquid crystal display device. The case of a liquid crystal display device will be described in FIG. 37.

Figure 37:
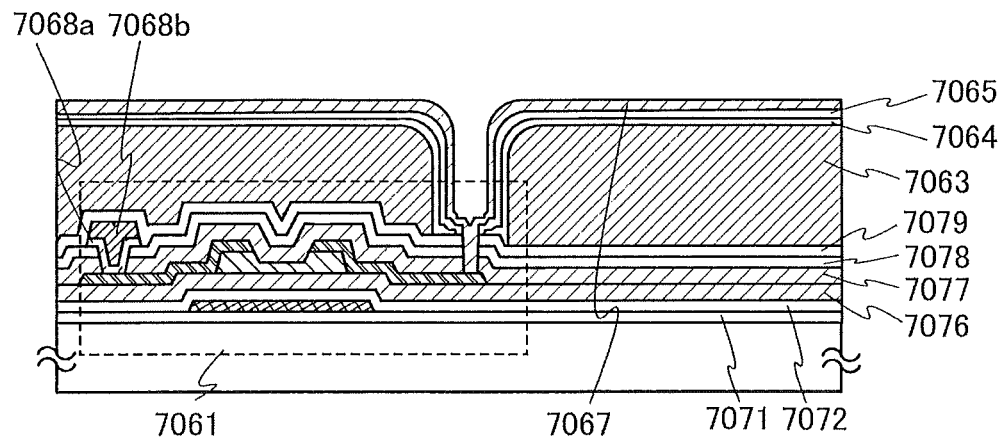
FIG. 37 illustrates a semiconductor device.

The case where a driver TFT 7061 is an n-channel TFT is described. In FIG. 37, a light-transmitting conductive film 7067 which is electrically connected to the driver TFT 7061 is provided. Further, an insulating layer 7071 is formed over a substrate, an insulating layer 7072 and an insulating layer 7076 are formed over a gate electrode of the driver TFT 7061, and insulating layers 7077, 7078, and 7079 are formed over a source electrode and a drain electrode of the driver TFT 7061. A source wiring 7068*a* and a source wiring 7068*b* are formed over the insulating layers 7077 and 7078 and connected to the source electrode of the driver TFT 7061 through a contact hole formed in the insulating layer 7078 and the insulating layer 7077. The light-transmitting conductive film 7067 is electrically connected to the drain electrode of the driver TFT 7061 through a contact hole formed in the insulating layers 7077, 7078, and 7079.

As the light-transmitting conductive film 7067, a light-transmitting conductive film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like can be used.

Note that in FIG. 37, light is emitted from a backlight or the like through a color filter layer 7063. The color filter layer 7063 is formed by a droplet discharge method such as an inkjet method, a printing method, an etching method using a photolithography technique, or the like.

The color filter layer 7063 is covered with an overcoat layer 7064, and also covered with a protective insulating layer 7065. Note that the overcoat layer 7064 with a thin thickness is illustrated in FIG. 37; however, the overcoat layer 7064 has a function to planarize a surface with unevenness due to the color filter layer 7063.

A structure in which a liquid crystal layer is provided over the light-transmitting conductive film 7067 can be applied to a liquid crystal display device.

Next, the appearance and a cross section of a light-emitting display panel (also referred to as a light-emitting panel), which is one embodiment of the semiconductor device, will be described with reference to FIGS. 15A and 15B. FIG. 15A is a plan view of a panel in which a thin film transistor and a light-emitting element formed over a first substrate are sealed between the first substrate and a second substrate with a sealant. FIG. 15B is a cross-sectional view taken along line H-I of FIG. 15A.

A sealant 4505 is provided to surround a pixel portion 4502, a signal line driver circuit 4503*a*, a signal line driver circuit 4503*b*, a scan line driver circuit 4504*a*, and a scan line driver circuit 4504*b*, which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503*a* and 4503*b*, and the scan line driver circuits 4504*a* and 4504*b* formed over the first substrate 4501 each include a plurality of thin film transistors, and a thin film transistor 4510 included in the pixel portion 4502 and a thin film transistor 4509 included in the signal line driver circuit 4503*a* are illustrated as an example in FIG. 15B. Insulating layers 4541, 4542, and 4543 are provided over the thin film transistors 4509 and 4510. An insulating layer 4544 is provided over the thin film transistor 4510. Further, an insulating layer 4545 is provided over the first substrate 4501, and an insulating layer 4546 and an insulating layer 4547 are provided over gate electrode layers of the thin film transistors. A source wiring 4548 is provided over the insulating layer 4542 and connected to a source electrode layer or a drain electrode layer of the thin film transistor 4510 through a contact hole formed in the insulating layer 4541 and the insulating layer 4542.

As the thin film transistors 4509 and 4510, the highly reliable thin film transistor including an oxide semiconductor layer, which is described in any of Embodiments 1 to 3, can be employed. In this embodiment, the thin film transistors 4509 and 4510 are n-channel thin film transistors.

A conductive layer 4540 is provided over an insulating layer 4543 so as to overlap with a channel formation region of the oxide semiconductor layer of the thin film transistor 4509 for the driver circuit. When the conductive layer 4540 is provided in a position overlapping with the channel formation region of the oxide semiconductor layer, the amount of shift in the threshold voltage of the thin film transistor 4509 before and after a BT test can be reduced. The conductive layer 4540 may have a potential which is the same as or different from that of the gate electrode layer of the thin film transistor 4509, and can function as a second gate electrode layer. The potential of the conductive layer 4540 may be GND or 0 V, or the conductive layer 4540 may be in a floating state.

In the thin film transistors 4509 and 4510, the insulating layer 4541 is formed as a protective insulating film to be in contact with the semiconductor layers including channel formation regions. The insulating layer 4541 may be formed using a material and a method similar to those of the insulating layer 208 described in Embodiment 1. In addition, in order to reduce surface roughness due to a thin film transistor, the thin film transistor 4510 is covered with the insulating layer 4544 functioning as a planarization insulating film. Here, a silicon oxide film is formed as the insulating layer 4541 by a sputtering method in a manner similar to that of the insulating layer 208 described in Embodiment 1.

Further, the insulating layer 4544 is formed as the planarization insulating film. The insulating layer 4544 may be formed using a material and a method similar to those of the insulating layer 4021 described in Embodiment 7. Here, an acrylic resin is used for the insulating layer 4544.

Reference numeral 4511 denotes a light-emitting element, and a first electrode layer 4517 that is a pixel electrode included in the light-emitting element 4511 is electrically connected to the source electrode or the drain electrode of the thin film transistor 4510. Note that a structure of the light-emitting element 4511 is not limited to the structure described in this embodiment, which is a stacked-layer structure of the first electrode layer 4517, an electroluminescent layer 4512, and a second electrode layer 4513. The structure of the light-emitting element 4511 can be changed as appropriate, depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material to have an opening over the first electrode layer 4517 so that a sidewall of the opening is formed as an inclined surface with continuous curvature.

The electroluminescent layer 4512 may be formed as a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from an FPC 4518a and an FPC 4518b.

A connection terminal electrode 4515 is formed from the same conductive film as the first electrode layer 4517 included in the light-emitting element 4511, and a terminal electrode 4516 is formed from the same conductive film as source electrodes and drain electrodes included in the thin film transistors 4509 and 4510.

The connection terminal electrode 4515 is electrically connected to a terminal of the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), an acrylic resin, polyimide, an epoxy resin, a silicone resin, polyvinyl butyral (PVB), or an ethylene-vinyl acetate copolymer (EVA) can be used. For example, nitrogen may be used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 15A and 15B.

Through the above process, a highly reliable light-emitting display device (display panel) as a semiconductor device can be manufactured.

By manufacturing the above light-emitting display device with the use of the display device described in any of Embodiments 1 to 5, a gate wiring or a source wiring can be formed using a conductive material including Cu; accordingly, increase in wiring resistance can be prevented. Consequently, high speed operation and low power consumption of the above light-emitting display device can be achieved, and thus the light-emitting display device can have a large-sized screen or a high definition screen.

This embodiment can be combined with any of the structures described in the other embodiments as appropriate.

Embodiment 10

A semiconductor device disclosed in this specification can be applied to electronic paper. Electronic paper can be used for electronic appliances in a variety of fields as long as they can display data. For example, electronic paper can be applied to an electronic book reader (an e-book reader), a poster, an advertisement in a vehicle such as a train, or displays of various cards such as a credit card. Examples of such electronic appliances are illustrated in FIGS. 24A and 24B and FIG. 25.

Figure 24A:
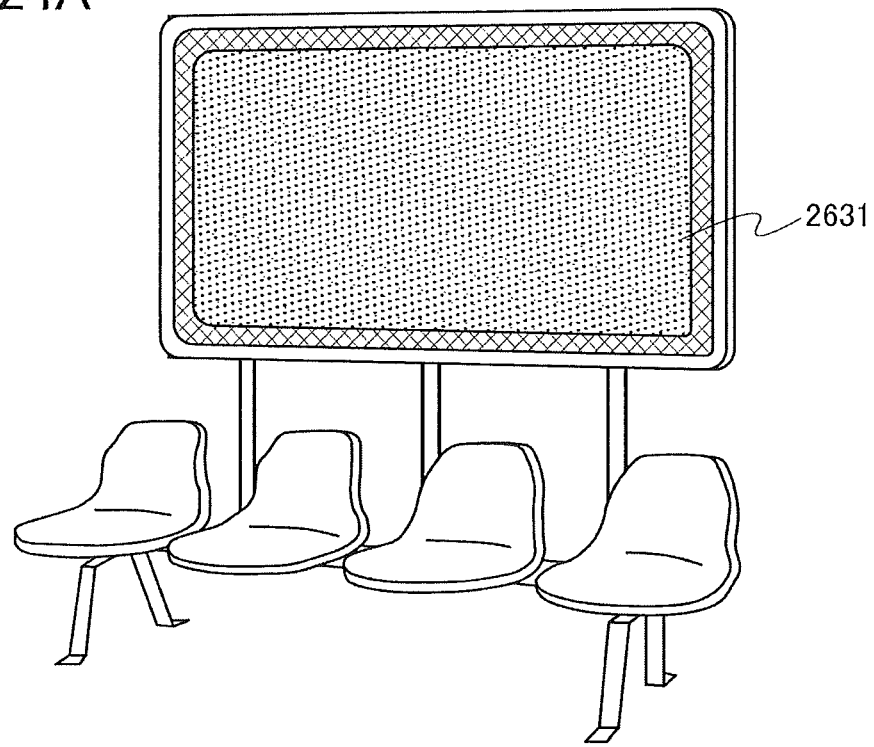
FIGS. 24A and 24B illustrate applications of electronic paper.
Figure 25:
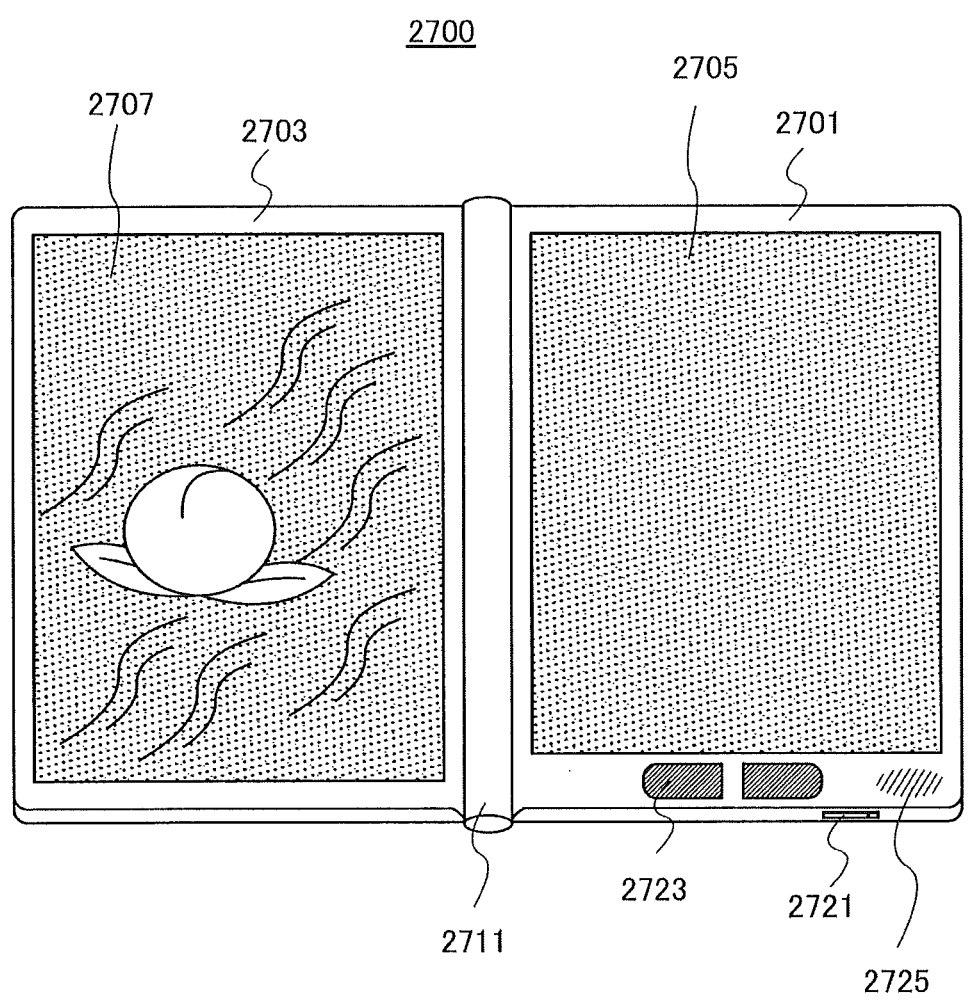
FIG. 25 is an external view illustrating an example of an electronic book reader.

FIG. 24A illustrates a poster 2631 using electronic paper. In the case where an advertising medium is printed paper, the advertisement is replaced by hands; however, by using the electronic paper, the advertising display can be changed in a short time. Furthermore, stable images can be obtained without display defects. Note that the poster may have a configuration capable of wirelessly transmitting and receiving data.

By manufacturing the poster 2631 with the use of the display device described in any of Embodiments 1 to 5, a gate wiring or a source wiring can be formed using a conductive material including Cu; accordingly, increase in wiring resistance can be prevented. Consequently, high speed operation and low power consumption of the above display device can be achieved, and thus the poster 2631 can have a large-sized screen or a high definition screen.

Figure 24B:
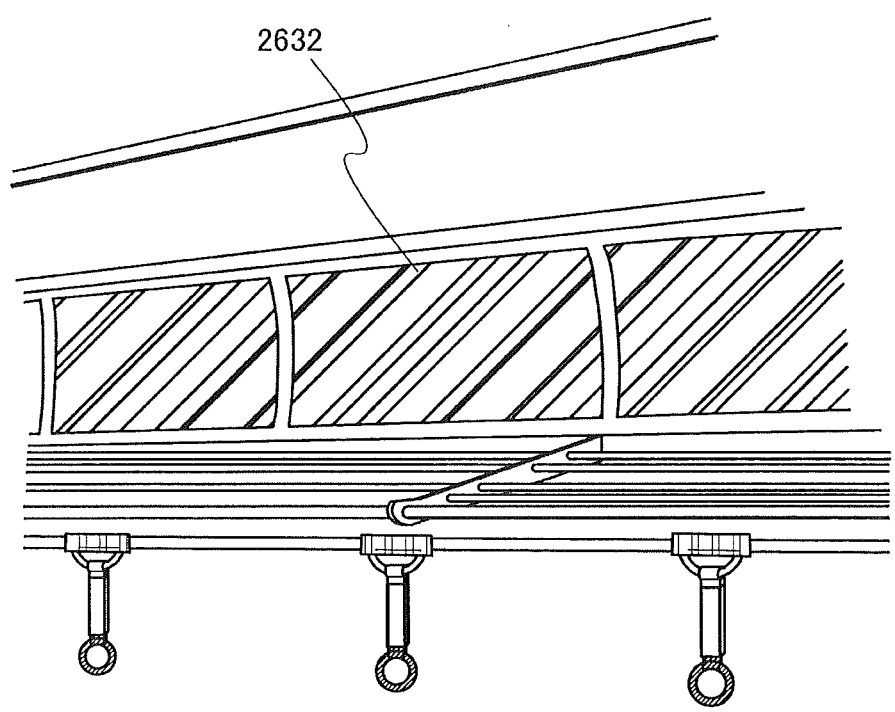

FIG. 24B illustrates an advertisement 2632 in a vehicle such as a train. In the case where an advertising medium is printed paper, the advertisement is replaced by hands; however, by using the electronic paper, much manpower is not needed and the advertising display can be changed in a short time. Furthermore, stable images can be obtained without display defects. Note that the advertisement in a vehicle may have a configuration capable of wirelessly transmitting and receiving data.

By manufacturing the advertisement 2632 in a vehicle with the use of the display device described in any of Embodiments 1 to 5, a gate wiring or a source wiring can be formed using a conductive material including Cu; accordingly, increase in wiring resistance can be prevented. Consequently, high speed operation and low power consumption of the above display device can be achieved, and thus the advertisement 2632 in a vehicle can have a large-sized screen or a high definition screen.

FIG. 25 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 25) and graphics can be displayed on a display portion on the left side (the display portion 2707 in FIG. 25).

FIG. 25 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on a surface of the housing, on which the display portion is provided. Furthermore, an external connection terminal (such as an earphone terminal, a USB terminal, or a terminal that can be connected to various cables like an AC adapter and a USB cable), a recording medium insertion portion, and the like may be provided on the back surface or a side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Embodiment 11

A semiconductor device disclosed in this specification can be applied to a variety of electronic appliances (including amusement machines). Examples of electronic appliances include television sets (also referred to as televisions or television receivers), monitors of computers or the like, cameras such as digital cameras and digital video cameras, digital photo frames, cellular phones (also referred to as mobile phones or mobile phone sets), portable game consoles, portable information terminals, audio reproducing devices, large-sized game machines such as pachinko machines, and the like.

Figure 26A:
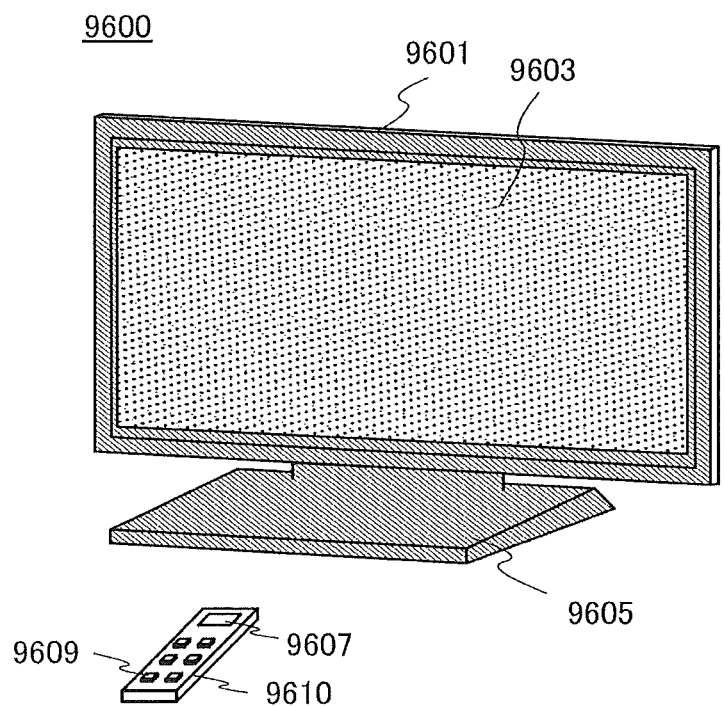
FIGS. 26A and 26B are external views respectively illustrating a television set and a digital photo frame.

FIG. 26A illustrates an example of a television set. In a television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

By manufacturing the television set 9600 with the use of the display device described in any of Embodiments 1 to 5, a gate wiring or a source wiring can be formed using a conductive material including Cu; accordingly, increase in wiring resistance can be prevented. Consequently, high speed operation and low power consumption of the above display device can be achieved, and thus the television set 9600 can have a large-sized screen or a high definition screen.

Figure 26B:
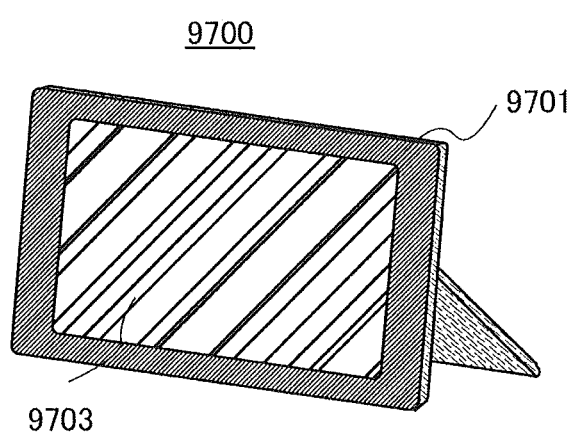

FIG. 26B illustrates an example of a digital photo frame. For example, in a digital photo frame 9700, a display portion 9703 is incorporated in a housing 9701. Various images can be displayed on the display portion 9703. For example, data of an image taken by a digital camera or the like can be displayed, and the digital photo frame can function as a normal photo frame.

Note that the digital photo frame 9700 is provided with an operation portion, an external connection portion (such as a USB terminal or a terminal that can be connected to various cables like a USB cable), a recording medium insertion portion, and the like. Although these components may be provided on a surface where the display portion is provided, it is preferable to provide them on a side surface or the back surface for the design of the digital photo frame 9700. For example, a memory storing data of an image taken by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 27A:
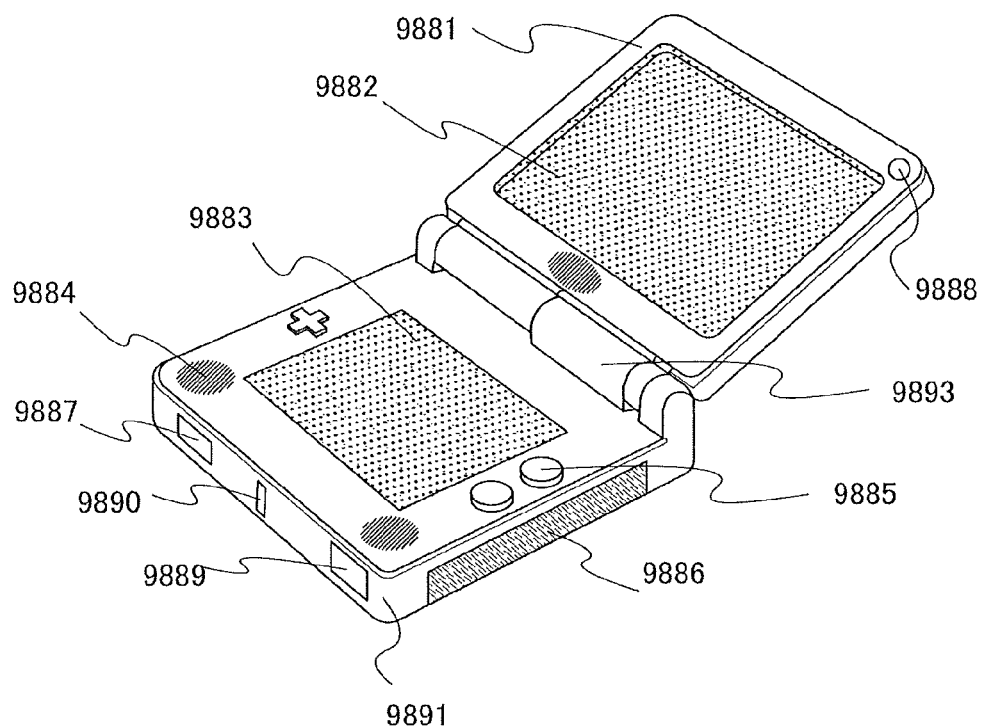
FIGS. 27A and 27B are external views each illustrating an example of an amusement machine.

FIG. 27A illustrates a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 27A includes a speaker portion 9884, a recording medium insertion portion 9886, an LED lamp 9890, input means (an operation key 9885, a connection terminal 9887, a sensor 9888 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. Needless to say, the structure of the portable amusement machine is not limited to the above and other structures provided with at least a semiconductor device disclosed in this specification can be employed. The portable amusement machine may include other accessory equipment, as appropriate. The portable amusement machine illustrated in FIG. 27A has a function of reading a program or data stored in a recording medium to display it on the display portion, and a function of sharing information with another portable amusement machine by wireless communication. The portable amusement machine illustrated in FIG. 27A can have various functions without limitation to the above.

Figure 27B:
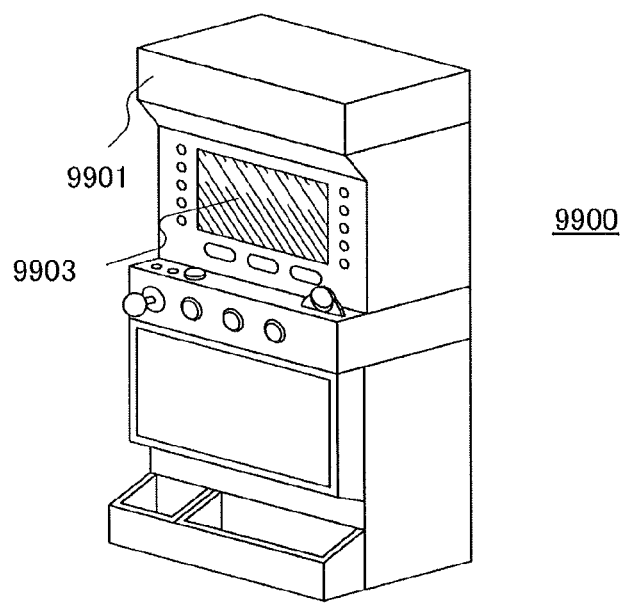

FIG. 27B illustrates an example of a slot machine which is a large-sized amusement machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include other accessory equipment, as appropriate.

Figure 28A:
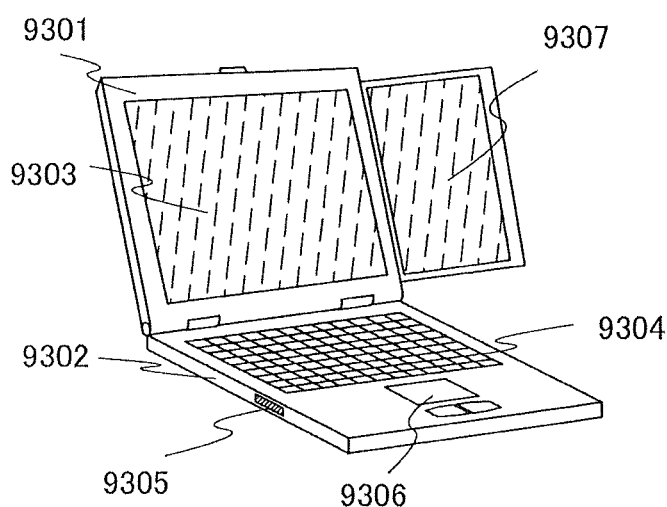
FIGS. 28A and 28B are external views respectively illustrating an example of a portable computer and an example of a cellular phone.

FIG. 28A is a perspective view illustrating an example of a portable computer.

In the portable computer of FIG. 28A, a top housing 9301 having a display portion 9303 and a bottom housing 9302 having a keyboard 9304 can overlap with each other by closing a hinge unit which connects the top housing 9301 and the bottom housing 9302. The portable computer of FIG. 28A can be convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion.

The display portion 9303 or the storable display portion 9307 is formed using an image display device of a liquid crystal display panel, a light-emitting display panel such as an organic light-emitting element or an inorganic light-emitting element, or the like.

In addition, the portable computer of FIG. 28A, which can be provided with a receiver or the like, can receive a television broadcast to display an image on the display portion. While the hinge unit which connects the top housing 9301 and the bottom housing 9302 is kept closed, the whole screen of the display portion 9307 is exposed by sliding the display portion 9307 out and the angle of the screen is adjusted; thus, the user can watch a television broadcast. In this case, the hinge unit is not opened and display is not performed on the display portion 9303. In addition, start up of only a circuit which displays the television broadcast is performed. Therefore, power consumption can be minimized, which is advantageous for the portable computer whose battery capacity is limited.

Figure 28B:
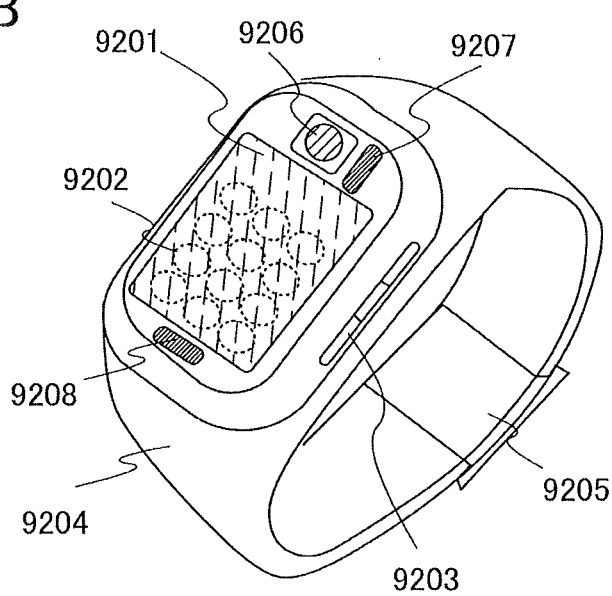

FIG. 28B is a perspective view illustrating an example of a cellular phone that the user can wear on the wrist like a wristwatch.

This cellular phone is formed with a main body which includes a communication device including at least a telephone function, and a battery; a band portion 9204 which enables the main body to be worn on the wrist; an adjusting portion 9205 for adjusting the fixation of the band portion 9204 fixed for the wrist; a display portion 9201; a speaker 9207; and a microphone 9208.

In addition, the main body includes operation switches 9203. The operation switches 9203 serve, for example, as a switch for starting a program for the Internet when the switch is pressed, in addition to serving as a switch for turning on a power source, a switch for shifting a display, a switch for instructing to start taking images, or the like, and can be used so as to correspond to each function.

Input to this cellular phone is performed by touching the display portion 9201 with a finger or an input pen, operating the operation switches 9203, or inputting voice into the microphone 9208. Note that displayed buttons 9202 which are displayed on the display portion 9201 are illustrated in FIG. 28B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The cellular phone illustrated in FIG. 28B is provided with a receiver of a television broadcast or the like, and can display an image on the display portion 9201 by receiving a television broadcast. In addition, the cellular phone illustrated in FIG. 28B is provided with a memory device and the like such as a memory, and can record a television broadcast in the memory. The cellular phone illustrated in FIG. 28B may have a function of collecting location information such as GPS.

An image display device of a liquid crystal display panel, a light-emitting display panel such as an organic light-emitting element or an inorganic light-emitting element, or the like is used as the display portion 9201. The cellular phone illustrated in FIG. 28B is compact and lightweight, and the battery capacity thereof is limited. Therefore, a panel which can be driven with low power consumption is preferably used as a display device for the display portion 9201.

Note that FIG. 28B illustrates the electronic appliance which is worn on the wrist; however, this embodiment is not limited thereto as long as a portable shape is employed.

Embodiment 12

In this embodiment, examples of display devices including the thin film transistor described in Embodiment 1 will be described as one embodiment of a semiconductor device with reference to FIG. 29, FIG. 30, FIG. 31, and FIG. 32. In this embodiment, an example of a liquid crystal display device using a liquid crystal element as a display element will be described with reference to FIG. 29, FIG. 30, FIG. 31, and FIG. 32. Any of the thin film transistors described in Embodiments 1 and 2 can be applied to a TFT 628 and a TFT 629 used for liquid crystal display devices illustrated in FIG. 29, FIG. 30, FIG. 31, and FIG. 32, and the TFT 628 and the TFT 629 can be manufactured through a process similar to that described in Embodiment 2 and have high electric characteristics and high reliability. The TFT 628 and the TFT 629 are each a thin film transistor including an oxide semiconductor layer as a channel formation region. The case where the thin film transistor illustrated in FIGS. 1A and 1B is used as an example of a thin film transistor will described with reference to FIG. 29, FIG. 30, FIG. 31, and FIG. 32, but an embodiment of the present invention is not limited thereto.

A vertical alignment (VA) liquid crystal display device is described. The VA liquid crystal display device has a kind of form in which alignment of liquid crystal molecules of a liquid crystal display panel is controlled. The VA liquid crystal display device has a form in which liquid crystal molecules are vertical to a panel surface when voltage is not applied. In this embodiment, in particular, a pixel is divided into some regions (subpixels), and molecules are aligned in different directions in their respective regions. This is referred to as domain multiplication or multi-domain design. In the following description, a liquid crystal display device with multi-domain design is described.

Figure 29:
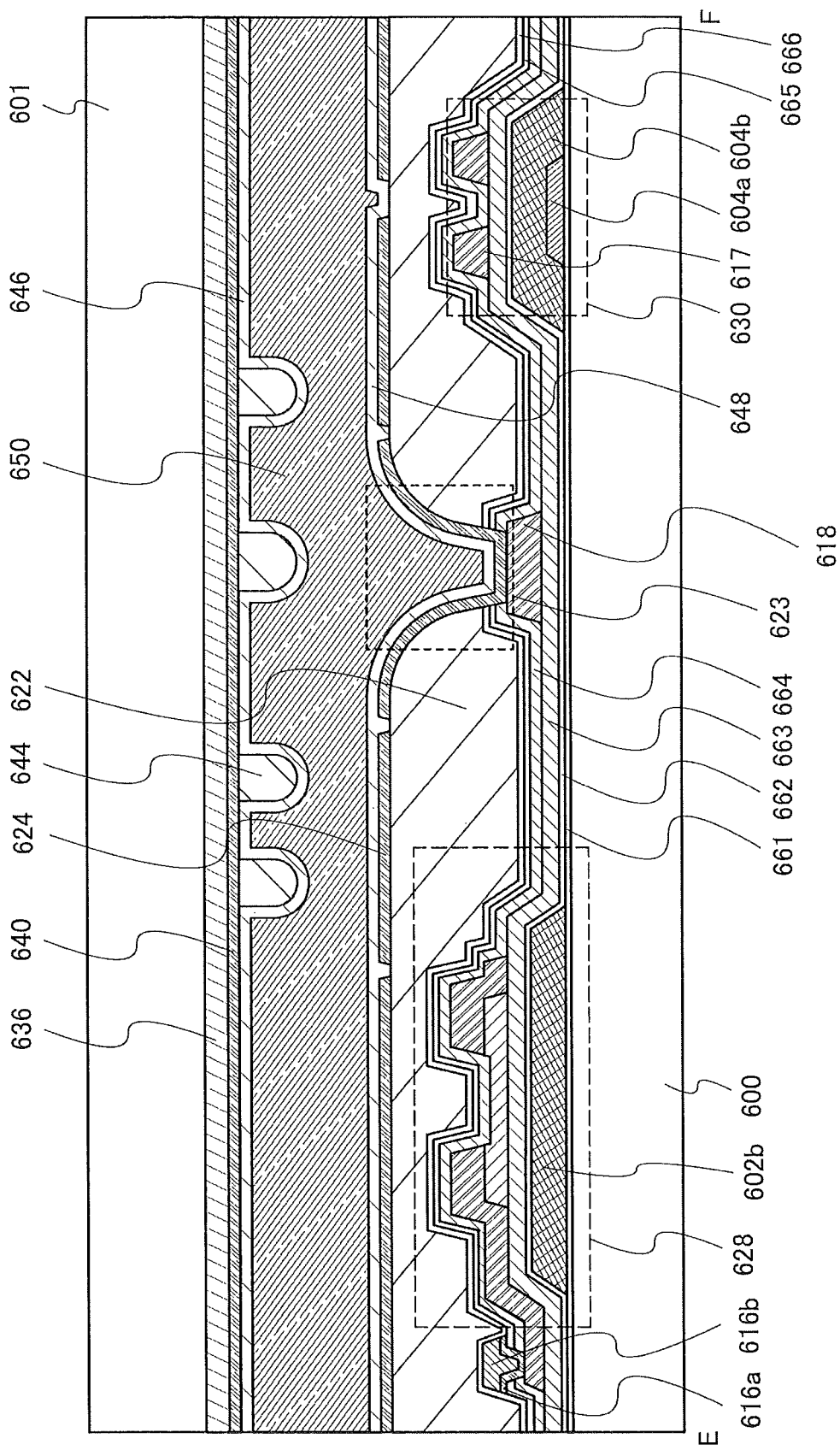
FIG. 29 illustrates a semiconductor device.
Figure 30:
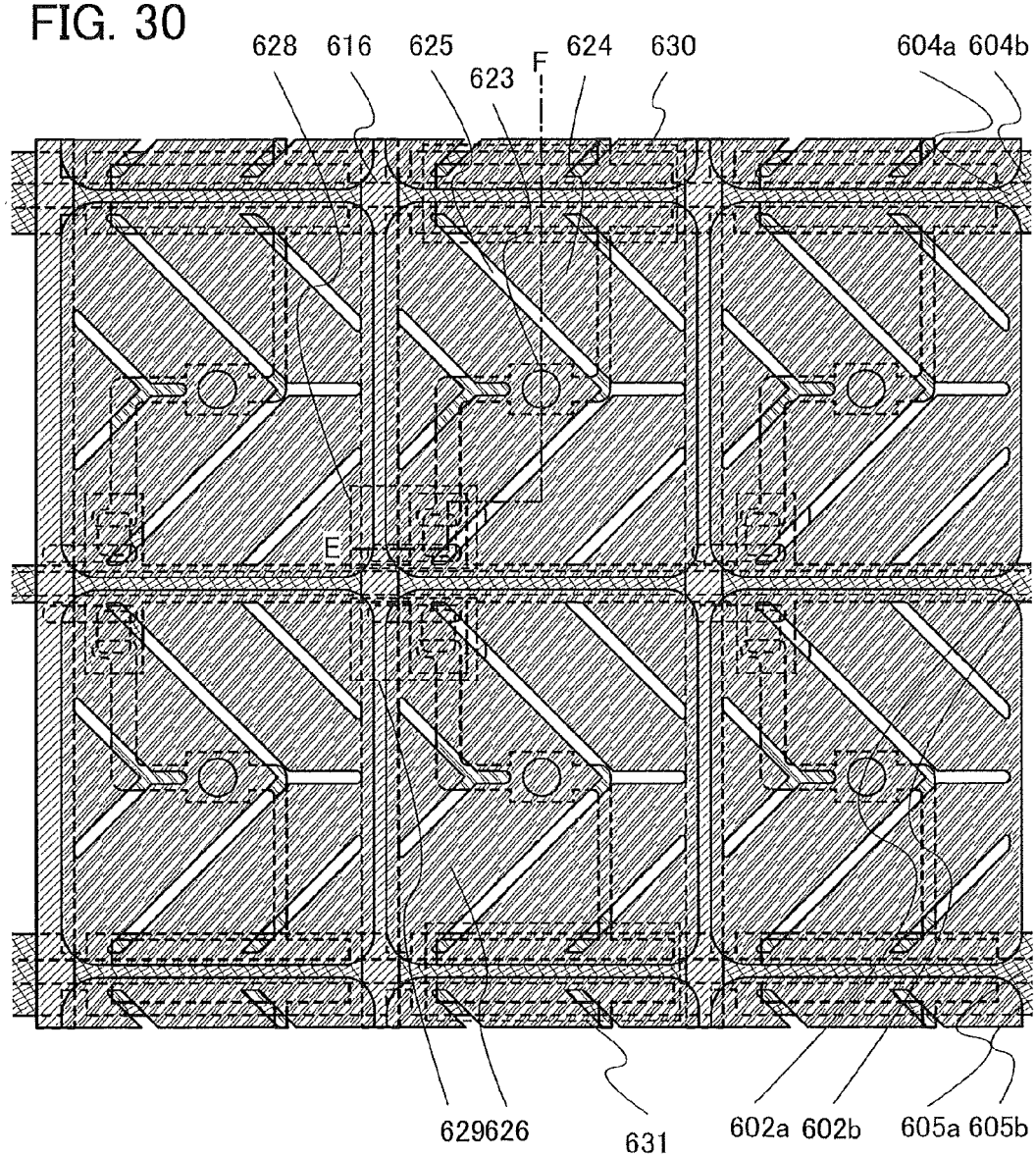
FIG. 30 illustrates a semiconductor device.
Figure 31:
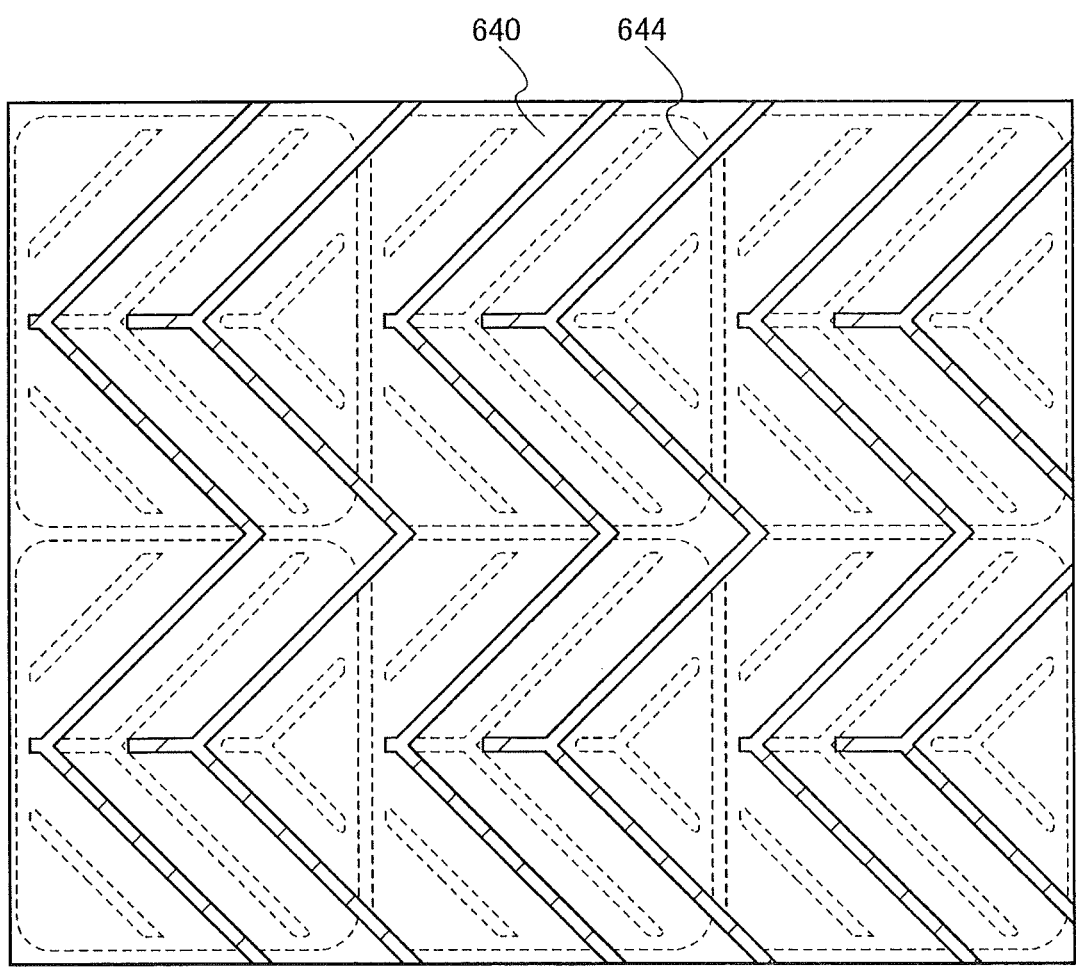
FIG. 31 illustrates a semiconductor device.

FIG. 30 and FIG. 31 illustrate a pixel electrode and a counter electrode, respectively. FIG. 30 is a plan view of a substrate side, which is provided with the pixel electrode. FIG. 29 illustrates a cross-sectional structure taken along line E-F of FIG. 30. FIG. 31 is a plan view of a substrate side, which is provided with the counter electrode. Hereinafter, description is made with reference to these drawings.

FIG. 29 illustrates a state in which a substrate 600 provided with the TFT 628, a pixel electrode layer 624 electrically connected thereto, and a storage capacitor portion 630 overlaps with a counter substrate 601 provided with a counter electrode layer 640 and the like, and liquid crystal is injected therebetween.

The counter substrate 601 is provided with a coloring film 636 and the counter electrode layer 640, and the counter electrode layer 640 is provided with a projection 644 for controlling alignment of liquid crystal. Here, the height of the projection 644 on the counter electrode layer 640 is different from the height of a spacer (not illustrated). An alignment film 648 is formed over the pixel electrode layer 624. In a similar manner, the counter electrode layer 640 is provided with an alignment film 646. A liquid crystal layer 650 is formed between the electrode layers.

As the spacer, columnar spacer may be used or bead spacers may be dispersed. Further, the spacer may also be formed over the pixel electrode layer 624 provided over the substrate 600.

The TFT 628, the pixel electrode layer 624 electrically connected thereto, and the storage capacitor portion 630 are formed over the substrate 600 provided with an insulating layer 661. The pixel electrode layer 624 is connected to a wiring 618 through a contact hole 623 which penetrates an insulating layer 664 that covers the TFT 628, a source wiring 616, and the storage capacitor portion 630, an insulating layer 665 over the insulating layer 664, an insulating layer 666 over the insulating layer 665, and an insulating layer 622 over the insulating layer 666. Further, the source wiring 616 which includes a stack of a source wiring 616*a* and a source wiring 616*b* is formed over the insulating layer 665 and connected to a source electrode layer or a drain electrode layer of the TFT 628 through a contact hole formed in the insulating layer 665 and the insulating layer 664. Here, the thin film transistor described in Embodiment 1 can be used as the TFT 628 as appropriate.

The storage capacitor portion 630 includes a first capacitor wiring 604 which is formed at the same time as a gate wiring 602 of the TFT 628, insulating layers 662 and 663 over the gate wiring 602, and a second capacitor wiring 617 which is formed at the same time as the wiring 618. Here, the gate wiring 602 is a stack of gate wirings 602*a* and 602*b*, and the gate wiring 602*b* functions as a gate electrode layer of the TFT 628. The capacitor wiring 604 is also a stack of capacitor wirings 604*a* and 604*b*.

A liquid crystal element is formed by overlapping of the pixel electrode layer 624, the liquid crystal layer 650, and the counter electrode layer 640.

FIG. 30 illustrates a structure over the substrate 600. The pixel electrode layer 624 is formed using the material described in Embodiment 1. The pixel electrode layer 624 is provided with a slit 625. The slit 625 is provided to control alignment of the liquid crystal.

The TFT 629, a pixel electrode layer 626 electrically connected thereto, and a storage capacitor portion 631 illustrated in FIG. 30 can be formed in a similar manner to that of the TFT 628, the pixel electrode layer 624, and the storage capacitor portion 630, respectively. Note that a capacitor wiring 605 included in the storage capacitor portion 631 is also a stack of capacitor wirings 605*a* and 605*b*, which is similar to the case of the capacitor wiring 604. Here, the TFT 628 and the TFT 629 are both connected to the source wiring 616 and the gate wiring 602. A pixel of this liquid crystal display panel includes the pixel electrode layers 624 and 626. Each of the pixel electrode layers 624 and 626 is in a sub-pixel.

FIG. 31 illustrates a structure on the counter substrate side. The counter electrode layer 640 is preferably formed using a material similar to that of the pixel electrode layer 624. The counter electrode layer 640 is provided with the projection 644 for controlling alignment of the liquid crystal.

Figure 32:
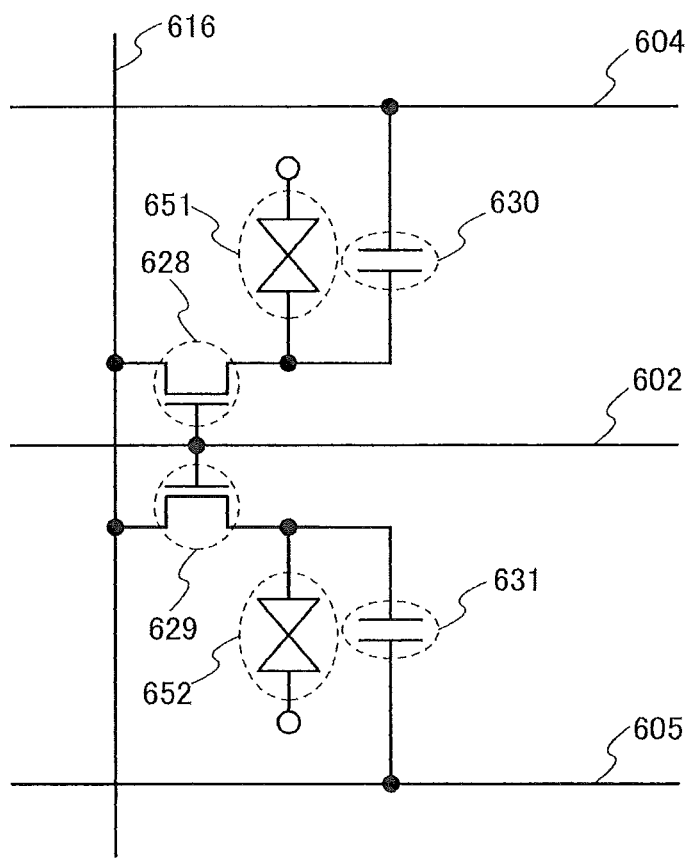
FIG. 32 illustrates a semiconductor device.

FIG. 32 illustrates an equivalent circuit of this pixel structure. Both the TFT 628 and the TFT 629 are connected to the gate wiring 602 and the source wiring 616. In this case, when potentials of the capacitor wiring 604 and the capacitor wiring 605 are different from each other, operations of a liquid crystal element 651 and a liquid crystal element 652 can be different from each other. That is, alignment of the liquid crystal is precisely controlled and the viewing angle is increased by individual control of potentials of the capacitor wirings 604 and 605.

When voltage is applied to the pixel electrode layer 624 provided with the slit 625, electric field distortion (an oblique electric field) is generated in the vicinity of the slit 625. The slit 625 and the projection 644 on the counter substrate 601 side are alternately arranged in an engaging manner, and thus an oblique electric field is effectively generated to control alignment of the liquid crystal, so that a direction of alignment of the liquid crystal varies depending on location. That is, the viewing angle of the liquid crystal display panel is increased by domain multiplication.

Next, another VA liquid crystal display device, which is different from the above, is described with reference to FIG. 33, FIG. 34, FIG. 35, and FIG. 36. In the structures of the invention to be given below, portions which are the same as or have functions similar to those of the above VA liquid crystal display device are denoted by the same reference numerals in different drawings, and repetitive description thereof is omitted.

Figure 33:
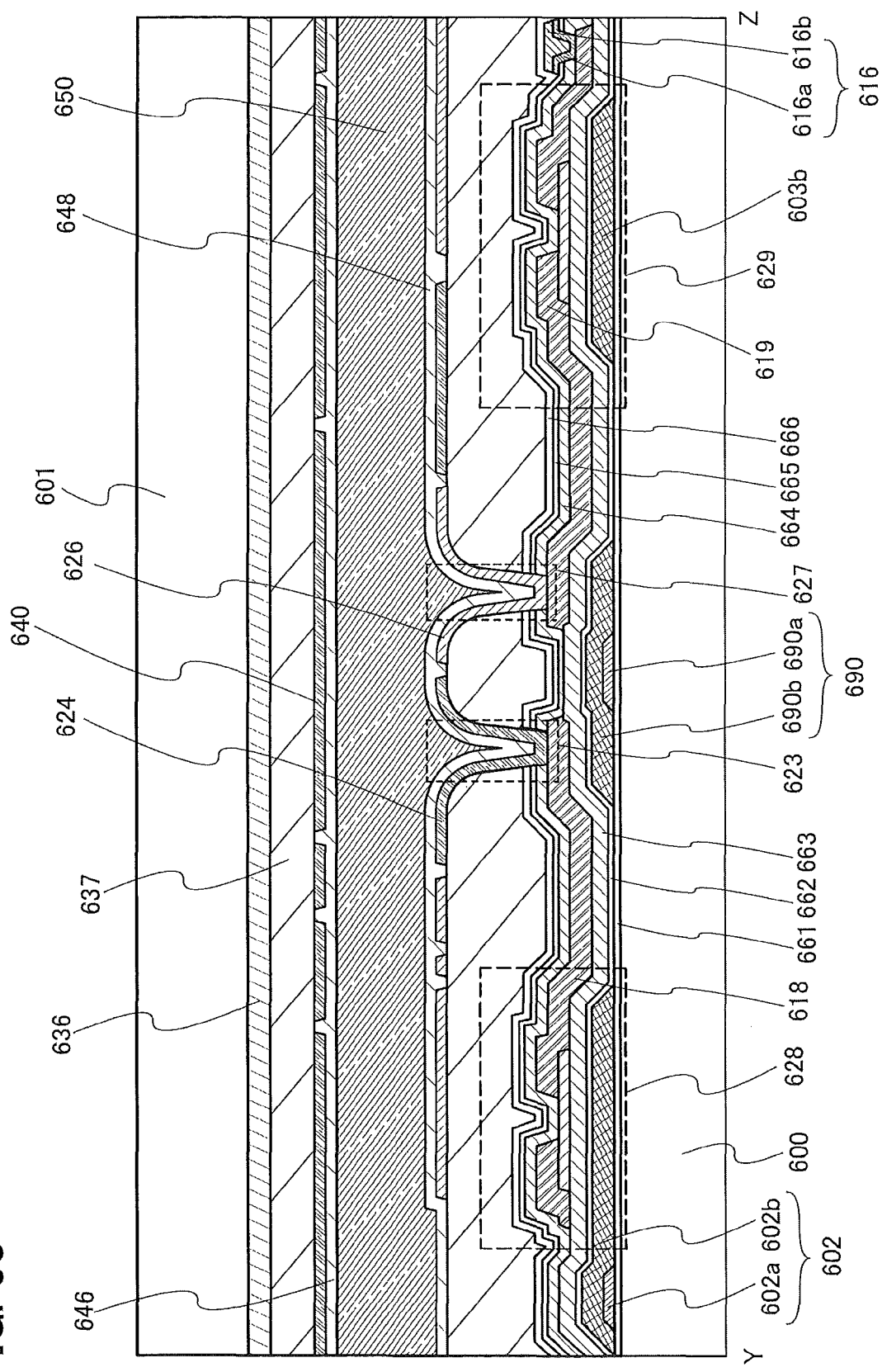
FIG. 33 illustrates a semiconductor device.
Figure 34:
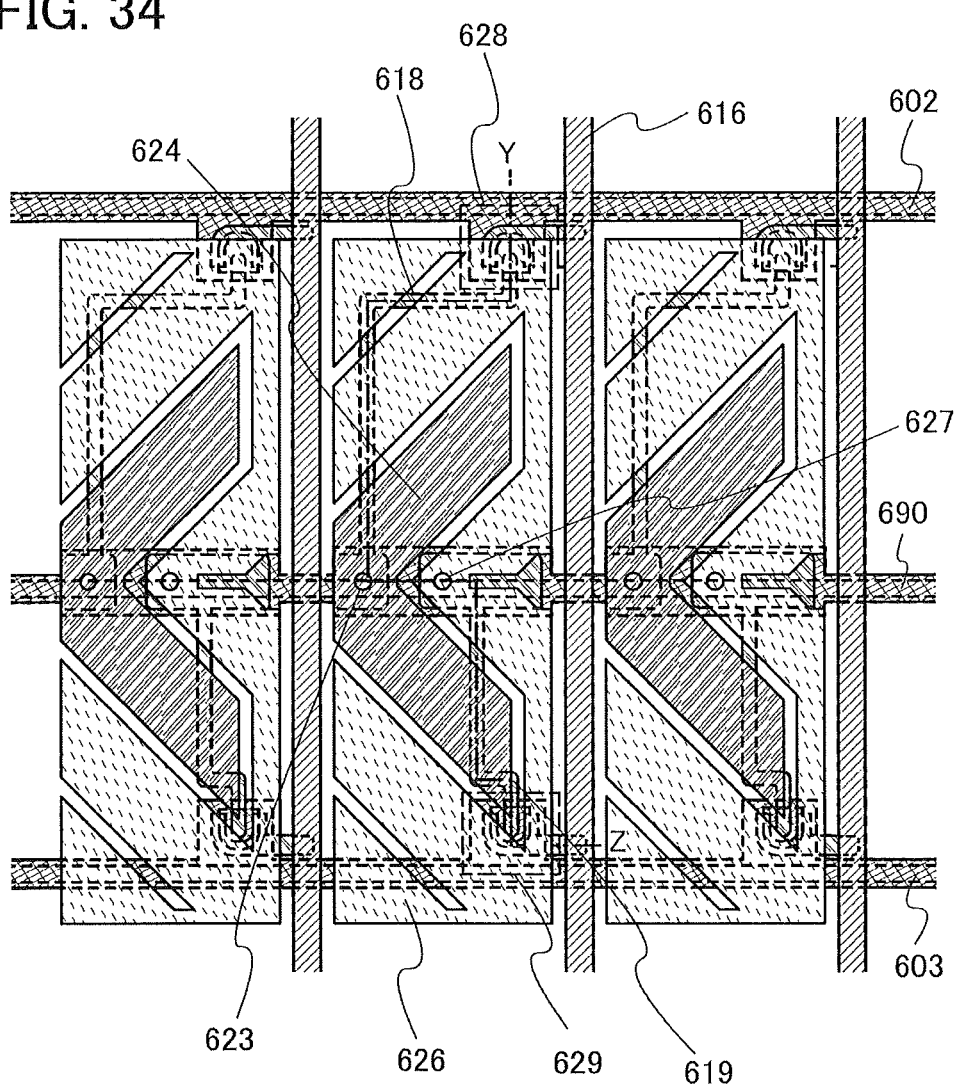
FIG. 34 illustrates a semiconductor device.

FIG. 33 and FIG. 34 each illustrate a pixel structure of a VA liquid crystal display panel. FIG. 34 is a plan view of the substrate 600. FIG. 33 illustrates a cross-sectional structure taken along line Y-Z of FIG. 34. Hereinafter, description is made with reference to these drawings.

In this pixel structure, a plurality of pixel electrodes is included in one pixel, and each of the pixel electrodes is connected to a respective TFT. Each TFT is driven by a different gate signal. That is, this is a structure in which a signal supplied to each pixel electrode is individually controlled in a multi-domain pixel.

Through the contact hole 623, the pixel electrode layer 624 is connected to the TFT 628 through the wiring 618. Through a contact hole 627, the pixel electrode layer 626 is connected to the TFT 629 through a wiring 619. The gate wiring 602 of the TFT 628 and a gate wiring 603 of the TFT 629 are separated so that different gate signals can be supplied thereto. Meanwhile, the source wiring 616 which functions as a data line is connected to the source electrode layers of the TFT 628 and the TFT 629 through contact holes formed in the insulating layer 664 and the insulating layer 665, and commonly used between the TFT 628 and the TFT 629. As each of the TFTs 628 and 629, the thin film transistor described in Embodiment 1 can be used as appropriate. A capacitor wiring 690 is also provided. Note that similarly to the pixel structure of the above VA liquid crystal display panel, the gate wiring 602 is a stack of the gate wirings 602*a* and 602*b*, the gate wiring 603 is a stack of gate wirings 603*a* and 603*b*, the source wiring 616 is a stack of the source wirings 616*a* and 616*b*, and the capacitor wiring 690 is a stack of capacitor wirings 690*a* and 690*b*. In addition, the insulating layers 661 to 666 are formed as those in the pixel structure of the above VA liquid crystal display panel.

Figure 36:
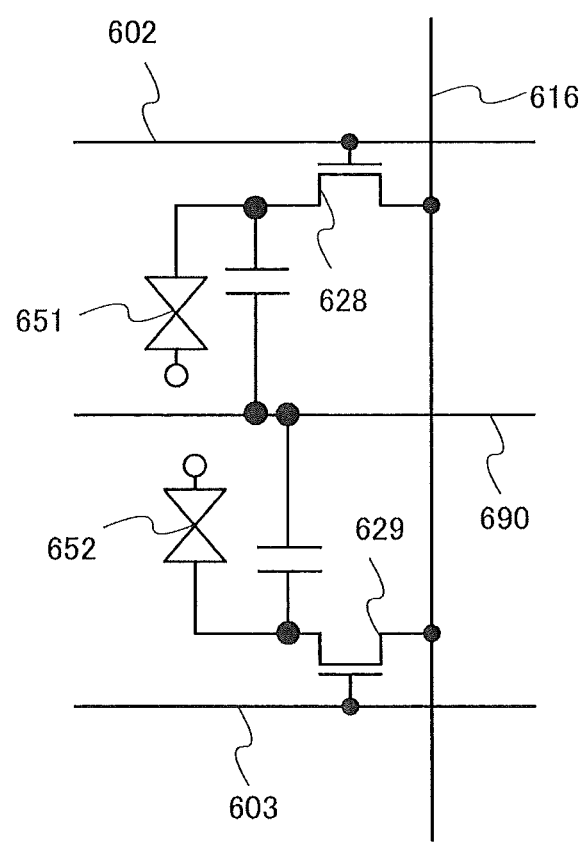
FIG. 36 illustrates a semiconductor device.

The pixel electrode layers 624 and 626 have different shapes and are separated by the slit 625. The pixel electrode layer 626 is formed so as to surround the pixel electrode layer 624 which has a V shape. The timing of voltage applied between the pixel electrode layers 624 and 626 is made to vary by the TFTs 628 and 629 in order to control alignment of the liquid crystal. FIG. 36 illustrates an equivalent circuit of this pixel structure. The TFT 628 is connected to the gate wiring 602. The TFT 629 is connected to the gate wiring 603. When different gate signals are supplied to the gate wirings 602 and 603, operation timings of the TFTs 628 and 629 can vary.

Figure 35:
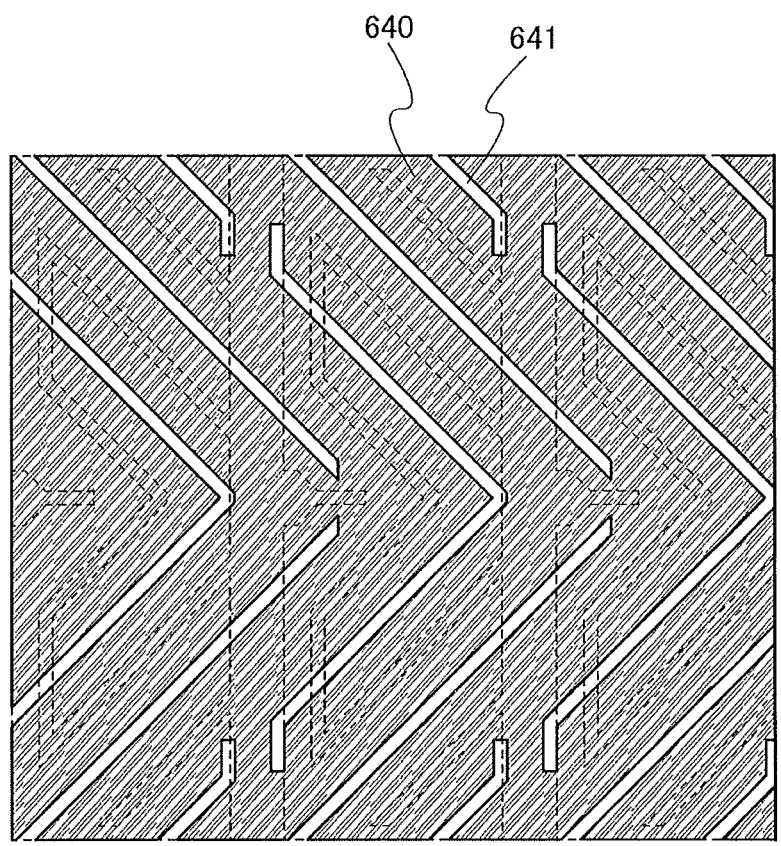
FIG. 35 illustrates a semiconductor device.

The counter substrate 601 is provided with the coloring film 636 and the counter electrode layer 640. Moreover, a planarization film 637 is formed between the coloring film 636 and the counter electrode layer 640 to prevent alignment disorder of the liquid crystal. FIG. 35 illustrates a structure on the counter substrate side. A slit 641 is formed in the counter electrode layer 640, which is used in common between different pixels. The slits 641 and 625 on the pixel electrode layers 624 and 626 side are alternately arranged in an engaging manner; thus, an oblique electric field is effectively generated, and alignment of the liquid crystal can be controlled. Accordingly, the direction in which the liquid crystal is aligned can vary depending on location, and the viewing angle is increased.

The liquid crystal element 651 illustrated in FIG. 36 is formed by overlapping of the pixel electrode layer 624, the liquid crystal layer 650, and the counter electrode layer 640 which are illustrated in FIG. 33. The liquid crystal element 652 illustrated in FIG. 36 is formed by overlapping of the pixel electrode layer 626, the liquid crystal layer 650, and the counter electrode layer 640 which are illustrated in FIG. 33. A multi-domain structure in which the liquid crystal element 651 and the liquid crystal element 652 are included in one pixel is illustrated.

With the use of the display device described in any of Embodiments 1 to 5, a liquid crystal display device like the above can be manufactured. Although the vertical alignment (VA) liquid crystal display device is described, this embodiment is not limited thereto. For example, a liquid crystal display device in a horizontal electric field mode (e.g., an IPS liquid crystal display device) in which a horizontal electric field is applied to liquid crystal molecules in a cell, whereby liquid crystal is driven to express gray scales or a TN liquid crystal display device may be employed.

By manufacturing the above liquid crystal display device with the use of the display device described in any of Embodiments 1 to 5, a gate wiring or a source wiring can be formed using a conductive material including Cu; accordingly, increase in wiring resistance can be prevented. Consequently, high speed operation and low power consumption of the display device can be achieved, and thus the liquid crystal display device can have a large-sized screen or a high definition screen.

Embodiment 13

In this embodiment, an example of manufacturing a display panel in which a first substrate provided with a thin film transistor and a second substrate serving as a counter substrate are bonded to each other will be described below.

In a production process of liquid crystal display panels or EL display panels, static electricity might affect an electronic circuit adversely, which results in variation in electric characteristics or breakdown of the circuit. In addition, there is a problem in that static electricity easily causes attachment of dust to a product.

In particular, an insulating substrate is easily electrostatically charged. An insulating substrate is formed using a material that is easily electrostatically charged, such as glass or a resin.

Note that static electricity refers to charges in a state where, when two objects are rubbed together, in contact with each other, or separated from each other, one is positively charged and the other is negatively charged. Charges are generated by movement of electrons between two objects owing to friction or the like; such a phenomenon is called electrification. When electrification is caused, generated charges do not flow and are stored as static electricity in the case where a material of an object is an insulator.

Moreover, a thin film transistor including an oxide semiconductor layer has a possibility that electric characteristics of the thin film transistor may fluctuate by the influence of static electricity and deviate from the designed range.

Thus, after the first substrate provided with the thin film transistor and the second substrate serving as the counter substrate are bonded to each other, heat treatment is performed in a state where static electricity stored in the thin film transistor is released to a ground side and the charging amount of static electricity is gradually decreased so that the static electricity is eliminated more easily. When this heat treatment also serves as at least one of heat treatments performed in manufacturing the display panel, the charging amount of static electricity can be reduced without increase in the number of steps.

Figure 39A:
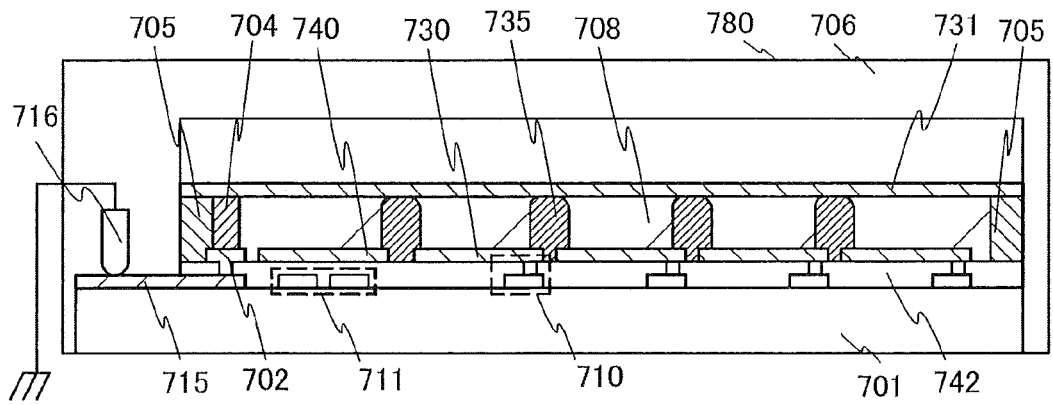
FIGS. 39A and 39B are cross-sectional views and FIG. 39C is a circuit diagram illustrating an embodiment of the present invention.

The case of manufacturing a liquid crystal display panel is described below with reference to FIGS. 39A to 39C.

First, a first substrate 701 over which a thin film transistor 710 including an oxide semiconductor layer and a pixel electrode 730 are formed in accordance with Embodiment 2 is prepared. Further, a driver circuit is provided over the first substrate 701, and a TFT 711 in the driver circuit is manufactured through the same process as the thin film transistor 710. A conductive layer 740 is formed above the TFT 711 in the driver circuit to block static electricity. Note that the conductive layer 740 is formed using the same material as the pixel electrode 730.

After the pixel electrode is formed, cleaning is performed and then drying is performed at 150° C. for 2 minutes. Next, an alignment film is formed. The alignment film is formed in such a manner that a liquid material for forming a horizontal alignment film (or a liquid material for forming a vertical alignment film), such as polyimide, is selectively applied by an offset printing method, a screen printing method, or the like, and baked. Prebaking is performed with a hot plate at 80° C. for 2 minutes and then baking is performed with a clean oven at 230° C. for 40 minutes. After the baking, rubbing treatment is performed. Then, cleaning is performed, and drying is performed at 150° C. for 2 minutes.

A process of forming a color filter, an alignment film, a sealant, and the like on a second substrate 706 serving as a counter substrate is described below.

First, a black resin layer pattern serving as a black matrix is formed on the second substrate 706. Next, a green resin layer pattern, a blue resin layer pattern, and a red resin layer pattern are formed. The green resin layer pattern, the blue resin layer pattern, and the red resin layer pattern form the color filter. Then, an overcoat layer is formed to cover these resin layer patterns.

Next, a counter electrode 731 including indium tin oxide to which silicon oxide is added is formed on the overcoat layer by a sputtering method. In order to reduce resistance of the counter electrode 731, heating is performed at 250° C. for 1 hour.

Next, a columnar spacer 735 is formed on the counter electrode 731. The columnar spacer 735 is obtained by selectively etching an organic resin film such as an acrylic resin film.

Next, cleaning is performed, and drying is performed at 150° C. for 2 minutes. Then, an alignment film is formed on the spacer 735. The alignment film is formed in such a manner that a liquid material for forming a horizontal alignment film (or a liquid material for forming a vertical alignment film), such as polyimide, is selectively applied by an offset printing method, a screen printing method, or the like, and baked. Prebaking is performed with a hot plate at 80° C. for 2 minutes and then baking is performed with a clean oven at 230° C. for 40 minutes. After the baking, rubbing treatment is performed. Then, cleaning is performed, and drying is performed at 150° C. for 2 minutes.

Next, a sealant is formed by a screen printing method, or using an inkjet apparatus or a dispensing apparatus. For the sealant, an acrylic-based photocurable resin or the like may be used. As the sealant, a sealant which includes a filler (with a diameter of 6 µm to 24 µm) and has a viscosity of 40 Pa·s to 400 Pa·s is used. Note that it is preferable to select a sealant which is not dissolved in liquid crystal with which the sealant is in contact later. This sealant is formed into a closed loop and surrounds a display region.

In order to electrically connect the counter electrode 731 to a common connection portion 702 provided over the first substrate, a sealant 704 including conductive particles is also formed using an inkjet apparatus or a dispensing apparatus. The common connection portion 702 is provided in a position overlapping with the sealant for bonding the first substrate and the second substrate and is electrically connected to the counter electrode through the conductive particles in the sealant. Alternatively, the common connection portion is provided in a position that does not overlap with the sealant (except for the pixel portion) and a paste including conductive particles is provided so as to overlap with the common connection portion, whereby the common connection portion is electrically connected to the counter electrode. The common connection portion 702 is formed using the same material and through the same process as the pixel electrode 730 and the conductive layer 740.

It does not matter if the second substrate 706 is electrostatically charged until the formation of the sealant because an element such as a thin film transistor is not formed yet; however, since the second substrate 706 is bonded to the first substrate in a later step, it is preferable that the charging amount of the second substrate 706 be reduced before the bonding. In this case, the charging amount of the second substrate 706 may be reduced with an ionizer or the like, or heat treatment such as the above baking may be performed in a state where the counter electrode 731 is electrically connected to a fixed potential, for example, a ground potential.

Next, liquid crystal is dripped on the alignment film of the second substrate 706. The dripping of a liquid crystal material is performed using an inkjet apparatus or a dispensing apparatus under atmospheric pressure. There is no particular limitation on the liquid crystal material, and TN liquid crystal, OCB liquid crystal, STN liquid crystal, VA liquid crystal, ECB liquid crystal, GH liquid crystal, polymer dispersed liquid crystal, discotic liquid crystal, or the like can be used.

Next, the pair of substrates is bonded to each other under reduced pressure. The second substrate 706 where the liquid crystal is dripped is bonded to the first substrate 701 provided with the thin film transistor 710. Immediately after bonding of the substrates, a sealant 705 is irradiated with ultraviolet.

Next, in order to cure the sealant 705 further, heat treatment is performed at higher than or equal to 80° C. and lower than or equal to 200° C. for longer than or equal to 0.5 hour and shorter than or equal to 10 hours. Note that in this heat treatment, the pair of substrates bonded to each other is put in a furnace 780 of a heating apparatus as illustrated in FIG. 39A. The furnace 780 is set over and in contact with a stainless-steel floor which is electrically connected to a ground potential so that the furnace 780 is electrically connected to the ground potential. Then, heating is performed while an external terminal 716 which is connected to the ground potential is connected to a common connection terminal 715 which is electrically connected to the common connection portion 702. Alternatively, the furnace 780 and the common connection portion 702 may be electrically connected to a fixed potential without limitation to the ground potential (also referred to as GND). Cure of the sealant 705 and appropriate removal of stored static electricity can be performed at the same time by this heat treatment.

In this embodiment, heating is performed at 120° C. for 1 hour.

Figure 39B:
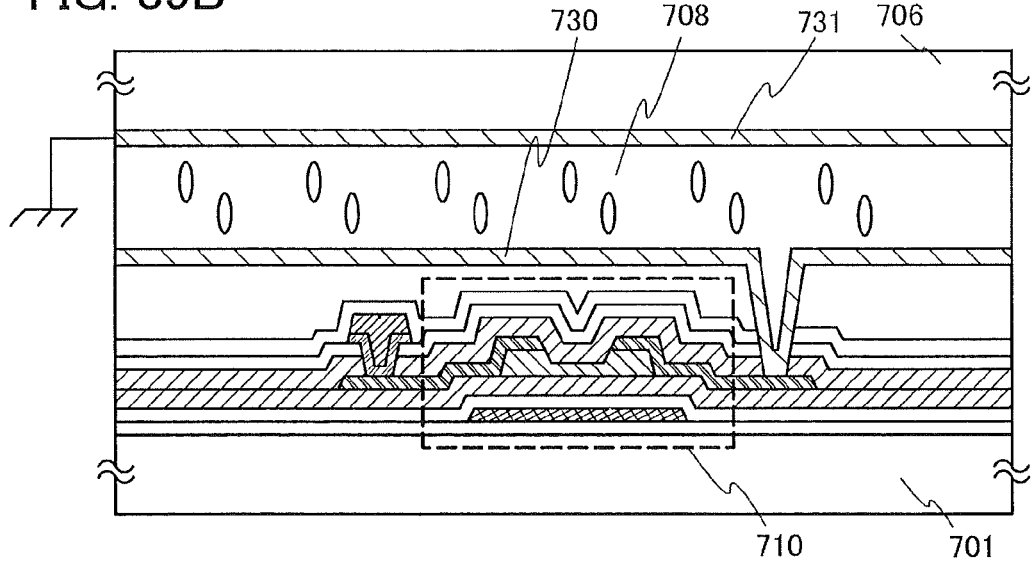
Figure 39C:
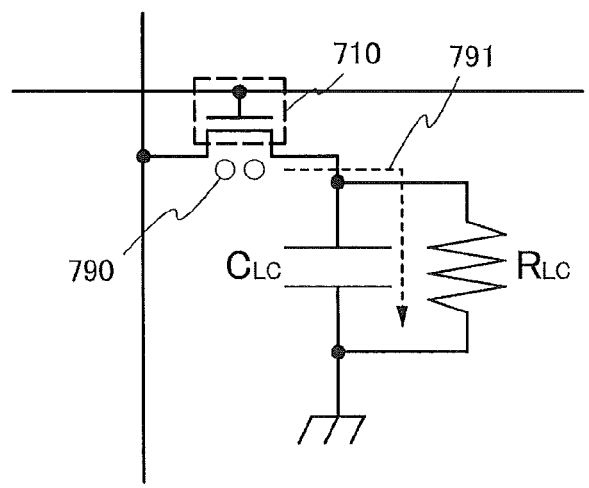

Note that FIG. 39B is an enlarged cross-sectional view of a display region which is subjected to the heat treatment in a state of being connected to the ground potential. As illustrated in FIG. 39B, a liquid crystal layer 708 is provided between the counter electrode 731 which is electrically connected to the ground potential and the pixel electrode 730 which is electrically connected to the thin film transistor 710. By heating the liquid crystal layer 708, static electricity 790 stored in the thin film transistor 710 is released to the ground side through the liquid crystal layer 708. FIG. 39C is a schematic view illustrating the above state simply. FIG. 39C, which is the schematic view using an equivalent circuit, illustrates a path 791 through which the static electricity 790 stored in the thin film transistor 710 is released to the ground side through the liquid crystal layer. By the heat treatment, stored static electricity is released to the ground side through the path 791 and gradually decreased to be eliminated easily.

By performing heat treatment with the counter electrode set at the ground potential, a normally-off thin film transistor can be manufactured stably; accordingly, yield of the liquid crystal display panel can be improved.

In the case of manufacturing a plurality of panels from one substrate, after bonding of the pair of substrates, the first substrate or both substrates is/are cut using a cutting apparatus such as a scriber apparatus, a breaker apparatus, or a roll cutter. Thus, a plurality of panels can be manufactured from one substrate.

Next, heat treatment for aligning liquid crystal, that is, realignment treatment is performed (e.g., at 80° C. to 200° C. for 10 minutes to 1 hour, preferably at 100° C. to 170° C. for 10 minutes to 1 hour).

In this embodiment, heating at 120° C. for 1 hour is performed as the realignment treatment. This heat treatment may be performed with the counter electrode set at the ground potential as illustrated in FIG. 39A. Further, cure of the sealant and alignment of the liquid crystal are performed by separate heat treatments as an example in this embodiment, but may be performed by one heat treatment.

Through the above process, the liquid crystal display panel can be formed.

In addition, without limitation to the liquid crystal display device, the heat treatment for reducing stored static electricity can be performed on a display panel such as electronic paper where electronic ink is driven, which is described in Embodiment 8. For example, heat treatment for curing a sealant with which a second substrate that is used for sealing of the electronic ink is fixed to a first substrate provided with a thin film transistor may be performed while an electrode provided on the second substrate is electrically connected to a ground potential. When heat treatment is performed with the electrode provided on the second substrate set at the ground potential, a normally-off thin film transistor can be manufactured stably; accordingly, yield of the active matrix electronic paper can be improved.

Furthermore, without limitation to the liquid crystal display device, the heat treatment for reducing stored static electricity can be performed on the EL display panel described in Embodiment 9.

In the case of manufacturing an EL display panel, a first electrode which is electrically connected to a thin film transistor including an oxide semiconductor layer and a partition wall which covers a periphery of the first electrode are formed over a first substrate in accordance with Embodiment 2, and then heating is performed. This heating is conducted in the following manner: heat treatment is performed at 200° C. for 1 hour in a nitrogen atmosphere and further at 150° C. for 1 hour in vacuum, and then a layer including an organic compound is evaporated over the first electrode of the first substrate.

Next, a second electrode is formed over the layer including an organic compound by an evaporation method or a sputtering method. The second electrode is provided above and to overlap with the thin film transistor in a display region. Further, the second electrode can also be provided above and to overlap with a thin film transistor in a driver circuit. When the second electrode is at a common potential, it is preferable that the second electrode be electrically connected to a ground potential during heat treatment performed later.

Next, a second substrate having a depression where a drying agent is set is fixed to the first substrate with a sealant, and heat treatment for curing the sealant is performed. In the case of an EL display panel, a light-emitting element might deteriorate at a heating temperature higher than 80° C.; therefore, the heat treatment is performed at 80° C. for longer than or equal to 0.5 hour and shorter than or equal to 10 hours.

By performing heat treatment with the second electrode set at the ground potential, a normally-off thin film transistor can be manufactured stably; accordingly, yield of the EL display panel can be improved.

In the case where sealing of the light-emitting element is performed using a stainless-steel substrate with a small thickness as the second substrate, heat treatment is performed at the time of curing an adhesive (such as an epoxy resin) for fixing the stainless-steel substrate while the stainless-steel substrate is electrically connected to the ground potential. In the case of using the stainless-steel substrate, the stainless-steel substrate including a conductive material overlaps with all thin film transistors including the thin film transistor in the display region and the thin film transistor in the driver circuit which are formed over one substrate. By performing heat treatment with the stainless-steel substrate overlapping with the thin film transistors set at a fixed potential such as the ground potential, normally-off thin film transistors can be manufactured stably; accordingly, yield of the EL display panel which is flexible can be improved.

By performing heat treatment with an electrode overlapping with a thin film transistor set at a fixed potential such as a ground potential, static electricity stored in a substrate in a manufacturing process of a semiconductor device can be favorably removed.

Embodiment 14

In this embodiment, as for the channel-etched thin film transistor in which an In—Ga—Zn—O-based oxide semiconductor film is used as an active layer, which is described in Embodiment 2, the following phenomenon was examined by computational science: a layer including indium at a higher concentration than the other region (In-rich layer) and a titanium oxide (TiO$_x$) film are formed in the vicinity of an interface between the In—Ga—Zn—O-based oxide semiconductor film and a metal film used for a source electrode and a drain electrode.

First, energy which is necessary for an oxide of each of indium, gallium, and zinc that are included in the In—Ga—Zn—O-based oxide semiconductor to form an oxygen-deficient state (deficiency formation energy $E_{def}$) was calculated, and which metal oxide was likely to form an oxygen-deficient state was studied.

Note that the deficiency formation energy $E_{def}$ is expressed by Formula 1 below. A represents any of indium; gallium; zinc; and a combination of indium, gallium, and zinc. Note that E(O) represents half energy of an oxygen atom, and $E(A_mO_{n-1})$ represents energy of an oxide $A_mO_{n-1}$ with oxygen deficiency.

$$E_{def} = \{E(A_mO_{n-1}) + E(O)\} - E(A_mO_n) \quad \text{(Formula 1)}$$

An approximate relation between a concentration of deficiency n and the deficiency formation energy $E_{def}$ is expressed by Formula 2 below. Note that N represents the number of oxygen positions in a state where deficiency is not formed, $k_B$ represents Boltzmann constant, and T represents temperature.

$$n = N \times \exp(-E_{def}/k_B T) \quad \text{(Formula 2)}$$

The calculation was performed using CASTEP, which is a program using the density functional theory. A plane-wave-basis pseudopotential method was used as the density functional theory, and GGA-PBE was used for a functional. The cut-off energy was 500 eV. The number of grids at k-point was set as follows: 3×3×1 for IGZO; 2×2×2 for In$_2$O$_3$; 2×3×2 for Ga$_2$O$_3$; and 4×4×1 for ZnO.

As a crystal structure of IGZO crystal, a structure where 84 atoms were arranged in the structure obtained by doubling a symmetry R-3 (international number: 148) structure for each of the a-axis and the b-axis so that each energy of Ga and Zn was minimized was employed. As for In$_2$O$_3$, a bixbyite structure of 80 atoms was employed; as for Ga$_2$O$_3$, a β-Gallia structure of 80 atoms was employed; and as for ZnO, a wurtzite structure of 80 atoms was employed.

From the Formula 2, it is found that when the deficiency formation energy $E_{def}$ is increased, the concentration of oxygen deficiency n, that is, the amount of oxygen deficiency is decreased. Table 1 below shows values of the deficiency formation energy $E_{def}$ in the case where A is indium; in the case where A is gallium; in the case where A is zinc; and in the case where A is a combination of indium, gallium, and zinc.

Figure 40A:
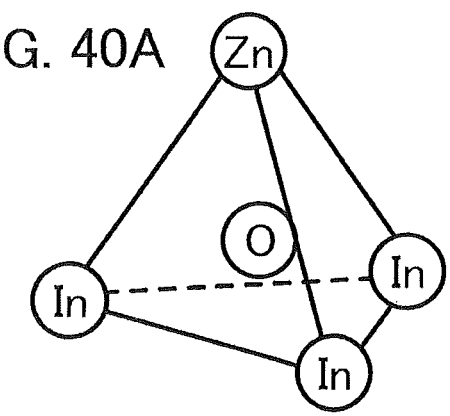
FIGS. 40A to 40C illustrate crystal structures of metal and oxygen in IGZO.

IGZO (Model 1) shows a value of the deficiency formation energy $E_{def}$ of oxygen that is adjacent to three indium atoms and one zinc atom in a crystal. This structure is illustrated in FIG. 40A.

Figure 40B:
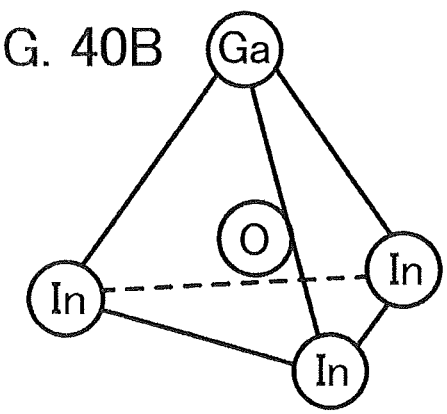

IGZO (Model 2) shows a value of the deficiency formation energy $E_{def}$ of oxygen that is adjacent to three indium atoms and one gallium atom in a crystal. This structure is illustrated in FIG. 40B.

Figure 40C:
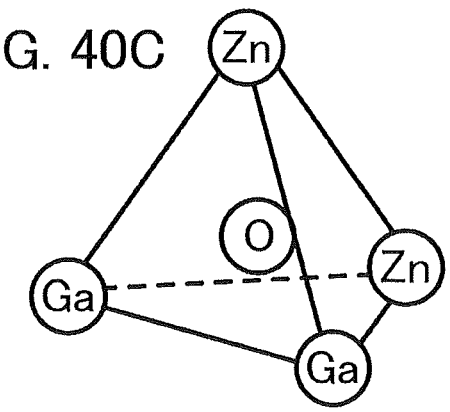

IGZO (Model 3) shows a value of the deficiency formation energy $E_{def}$ of oxygen that is adjacent to two zinc atoms and two gallium atoms in a crystal. This structure is illustrated in FIG. 40C.

TABLE 1

| Compound | $E_{def}$ (eV) |
|---|---|
| $In_2O_3$ | 3.06 |
| ZnO | 3.75 |
| IGZO (Model 1) | 3.73 |
| IGZO (Model 2) | 3.98 |
| IGZO (Model 3) | 4.08 |
| $Ga_2O_3$ | 4.18 |

The larger the value of the deficiency formation energy $E_{def}$ is, the more energy is needed to form an oxygen-deficient state; that is, stronger bonding with oxygen is formed. Accordingly, the values of the deficiency formation energy $E_{def}$ shown in Table 1 indicate that indium has the weakest bonding with oxygen and oxygen is easily released in the vicinity of indium.

It is considered that an oxygen-deficient state in an In—Ga—Zn—O-based oxide semiconductor is formed by extraction of oxygen from the oxide semiconductor by metal used for a source electrode and a drain electrode. Since the electric conductivity of an oxide semiconductor is increased by formation of an oxygen-deficient state, the electric conductivity of the oxide semiconductor film in the vicinity of an interface with the metal film is expected to be increased by the extraction of oxygen.

Next, in order to confirm whether oxygen is extracted from the oxide semiconductor by metal, quantum molecular dynamic (QMD) simulation was performed on a stacked-layer structure of the In—Ga—Zn—O-based oxide semiconductor film and the metal film.

The structure used for the simulation was formed in the following manner. First, a unit lattice including 84 atoms ($In_{12}Ga_{12}Zn_{12}O_{48}$) was extracted from an amorphous In—Ga—Zn—O-based oxide semiconductor (a-IGZO) formed by a classical molecular dynamic (CMD) method, and was subjected to quantum molecular dynamic (QMD) simulation and first-principle structural optimization. Over an a-IGZO layer obtained by cutting the unit lattice subjected to the structural optimization, a metal layer including crystal of metal atoms (W, Mo, and Ti) was stacked. After that, the formed structure was optimized. Simulation was performed using this structure as an initial structure at 623.0 K by the quantum molecular dynamic (QMD) method. Note that a lower end of the a-IGZO layer and an upper end of the metal layer were fixed so that only interaction in the interface could be estimated.

The conditions of the classical molecular dynamic simulation are shown below. Materials Explorer was used as a calculation program. The a-IGZO was formed under the following conditions. The all 84 atoms were arranged at random in a simulation cell with a side of 1 nm at a ratio of In:Ga:Zn:O=1:1:1:4, and the density was set to 5.9 g/cm$^3$. The temperature was gradually lowered from 5500 K to 1 K with an NVT ensemble, and then structural relaxation was performed at 1 K and with a time interval of 0.1 fs for 10 ns. The total simulation time was 10 ns. As for potentials, a Born-Mayer-Huggins potential was applied to metal-oxygen bonding and oxygen-oxygen bonding, and a Lennard-Jones potential was applied to metal-metal bonding. Charges were set as follows: +3 for In, +3 for Ga, +2 for Zn, and −2 for O.

The conditions of the QMD simulation are shown below. A first-principle calculation software CASTEP was used as a calculation program. GGA-PBE was used for a functional, and Ultrasoft was used for pseudopotential. The cut-off energy was 260 eV, and the k-point set was 1×1×1. The MD simulation was performed using an NVT ensemble at a temperature of 623 K. The total simulation time was 2.0 ps and the time interval was 1.0 fs.

Figure 41A:
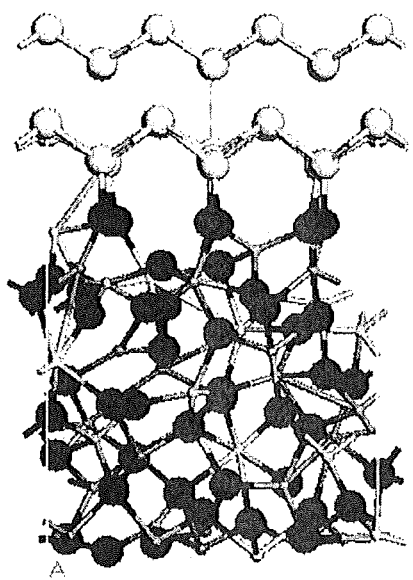
FIGS. 41A and 41B show structural models of metal atoms and oxygen atoms in the vicinity of an interface between a tungsten film and an oxide semiconductor film.
Figure 41B:
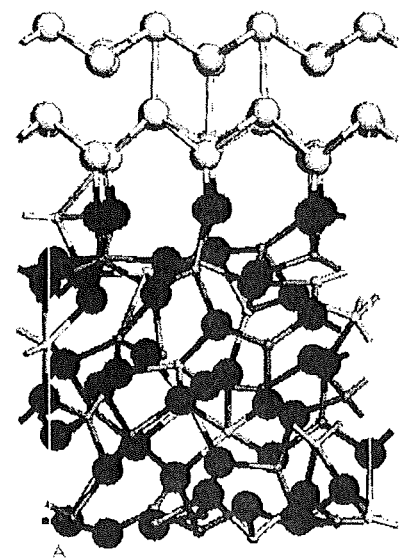
Figure 42A:
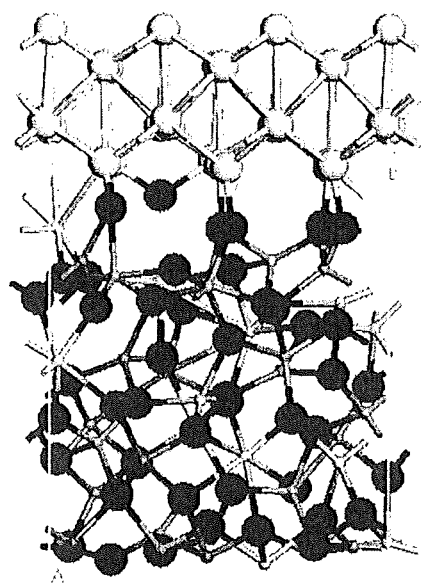
FIGS. 42A and 42B show structural models of metal atoms and oxygen atoms in the vicinity of an interface between a molybdenum film and an oxide semiconductor film.
Figure 42B:
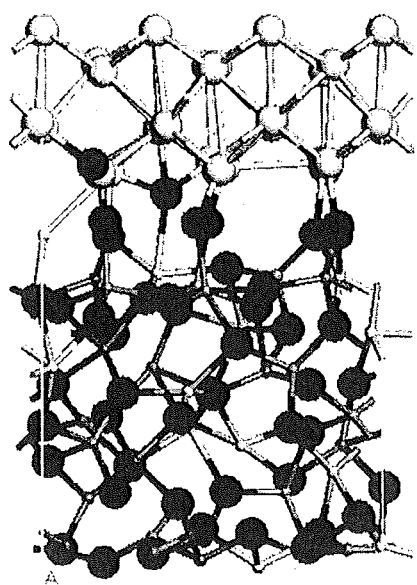
Figure 43A:
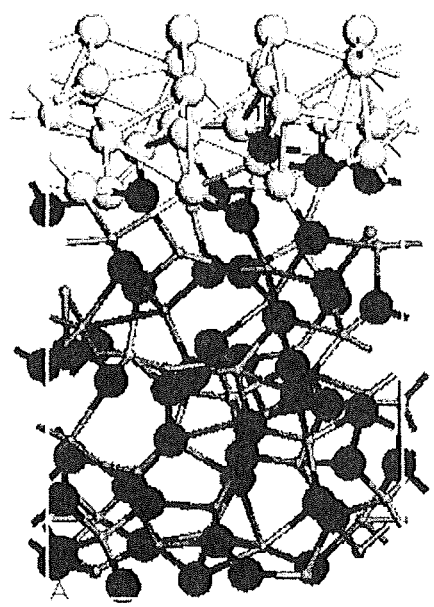
FIGS. 43A and 43B show structural models of metal atoms and oxygen atoms in the vicinity of an interface between a titanium film and an oxide semiconductor film.
Figure 43B:
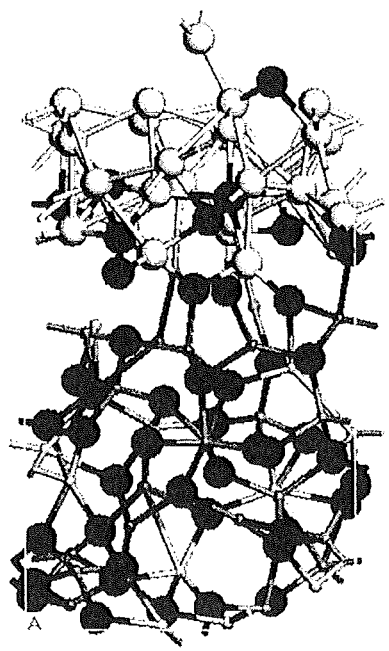

FIGS. 41A and 41B, FIGS. 42A and 42B, and FIGS. 43A and 43B show results of the above simulation. In FIGS. 41A and 41B, FIGS. 42A and 42B, and FIGS. 43A and 43B, a white sphere represents a metal atom of W, Mo, or Ti, and a black sphere represents an oxygen atom. FIGS. 41A and 41B show structures in the case of using a metal layer including W. FIG. 41A shows a structure before the QMD simulation, and FIG. 41B shows structure after the QMD simulation. FIGS. 42A and 42B show structures in the case of using a metal layer including Mo. FIG. 42A shows a structure before the QMD simulation, and FIG. 42B shows structure after the QMD simulation. FIGS. 43A and 43B show structures in the case of using a metal layer including Ti. FIG. 43A shows a structure before the QMD simulation, and FIG. 43B shows structure after the QMD simulation.

From FIG. 42A and FIG. 43A, in the cases of Mo and Ti, oxygen moved into the metal layers is already observed at the time of structural optimization. By comparing FIG. 41B, FIG. 42B, and FIG. 43B, it is found that oxygen moves most frequently in the case of Ti. Accordingly, Ti is considered to be suitable for an electrode that causes oxygen deficiency in a-IGZO.

It is assumed that oxygen extracted by titanium reacts with titanium and thus titanium oxide is formed. Therefore, whether a titanium oxide film formed between an oxide semiconductor film and a titanium film has conductivity was examined.

Figure 44:
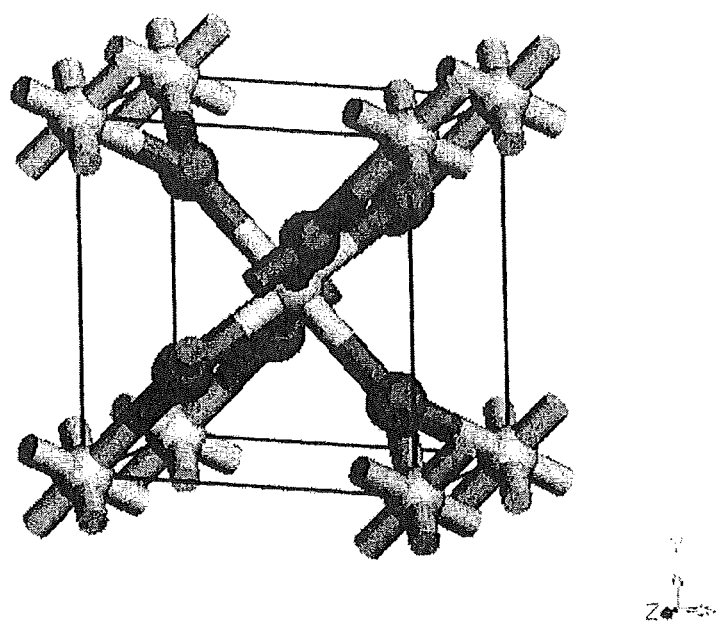
FIG. 44 shows a crystal structure of titanium dioxide having a rutile structure.

Titanium dioxide has several crystal structures such as a rutile structure (high temperature tetragonal crystal), an anatase structure (low temperature tetragonal crystal), and a brookite structure (orthorhombic crystal). Since both the anatase structure and the brookite structure are changed into the rutile structure by heating, which is the most stable structure, the above titanium dioxide was assumed to have a rutile structure. FIG. 44 shows a crystal structure of titanium dioxide having a rutile structure. The rutile structure is tetragonal crystal and the space group that represents symmetry of crystal is P4$_2$/mm.

Simulation for obtaining density of states was performed on the above structure of titanium dioxide by a density functional theory using a GGA-PBE functional. The structure of titanium dioxide including a cell structure was optimized with symmetry maintained, and the density of states was calculated. A plane-wave pseudopotential method introduced into a CASTEP code was employed for the density functional simulation. The cut-off energy was 380 eV.

Figure 45:
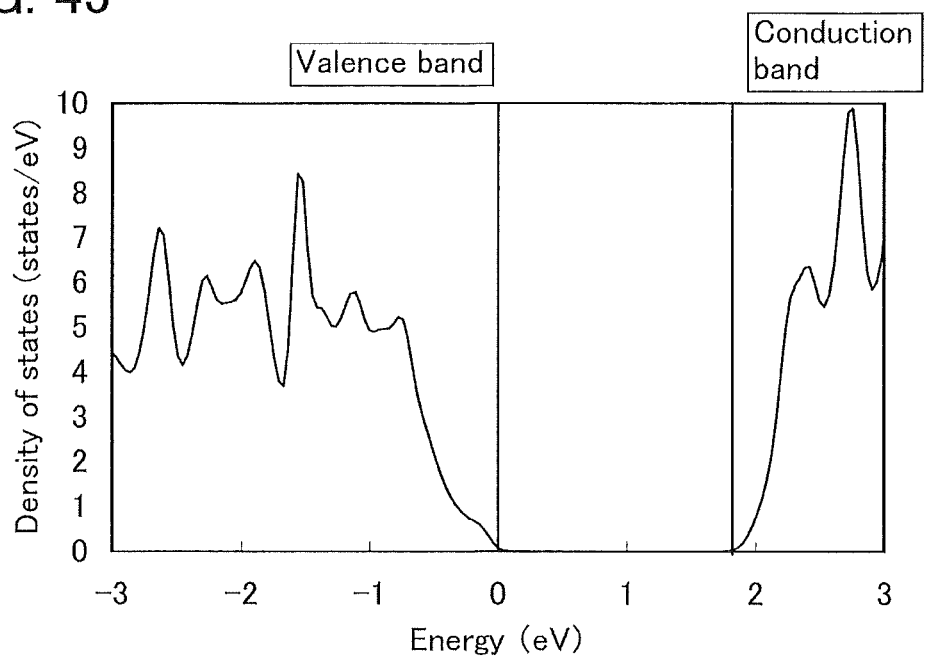
FIG. 45 shows a density of states of titanium dioxide having a rutile structure.

FIG. 45 shows the density of states of titanium dioxide having a rutile structure. As shown in FIG. 45, titanium dioxide having a rutile structure has a band gap and a density of states like that of an insulator or a semiconductor. Note that a narrower band gap tends to be estimated by the density functional theory; therefore, the actual band gap of titanium dioxide is approximately 3.0 eV, which is wider than the band gap in FIG. 45 showing the density of states.

Figure 46:
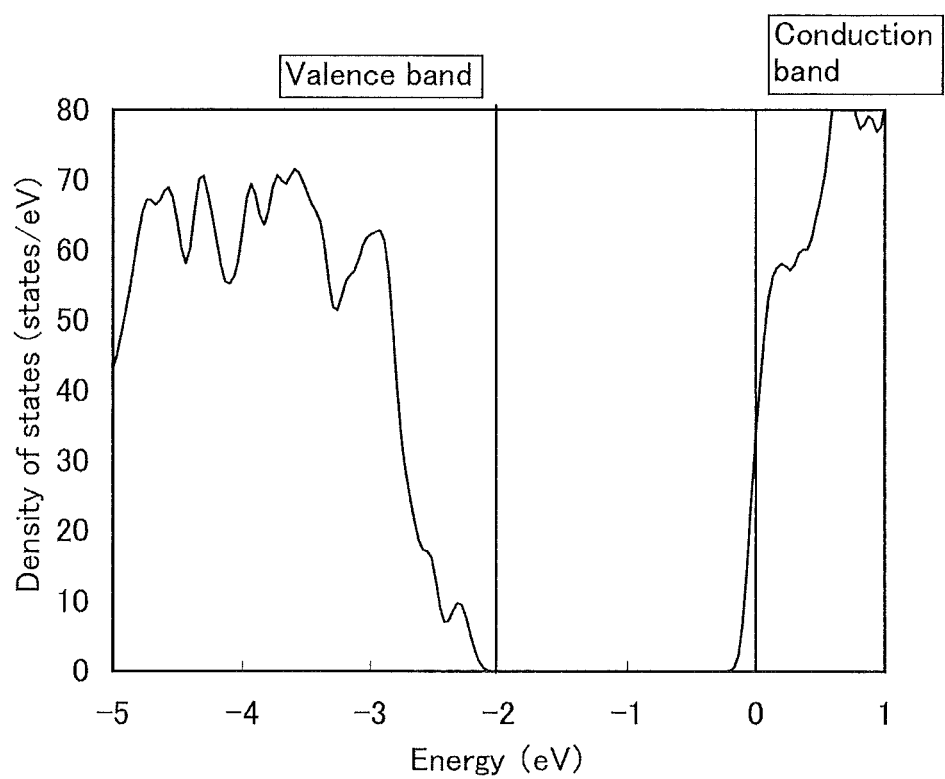
FIG. 46 shows a density of states of titanium dioxide in an oxygen-deficient state.

FIG. 46 shows the density of states of titanium dioxide having a rutile structure in the case of including oxygen deficiency. Specifically, titanium oxide including 24 Ti atoms and 47 O atoms, which was obtained by removing one O atom from titanium oxide including 24 Ti atoms and 48 O atoms, was used for the simulation as a model. The density of states shown in FIG. 46 indicates that the Fermi level is moved inside the conduction band, which is like that of metal, and that titanium dioxide has n-type conductivity in the case of including oxygen deficiency.

Figure 47:
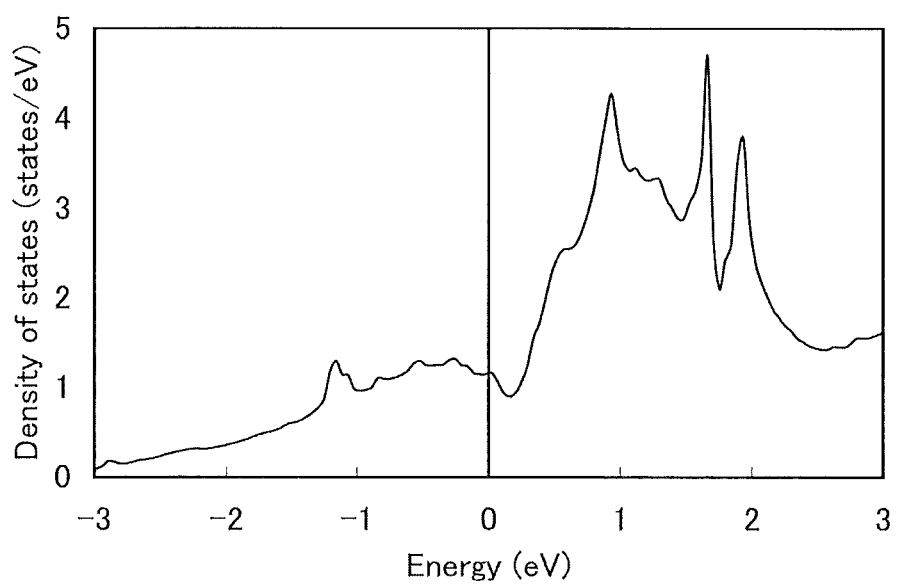
FIG. 47 shows a density of states of titanium monoxide.

FIG. 47 shows the density of states of titanium monoxide (TiO). From FIG. 47, it is found that titanium monoxide has a density of states like that of metal.

Therefore, from the density of states of titanium dioxide shown in FIG. 45, the density of states of titanium dioxide including oxygen deficiency shown in FIG. 46, and the density of states of titanium monoxide shown in FIG. 47, the following assumption can be made: titanium dioxide including oxygen deficiency ($TiO_{2-\delta}$) has n-type conductivity in the range of $0<\delta<1$. Accordingly, it is considered that, when titanium monoxide or titanium dioxide including oxygen deficiency is included in the composition of a titanium oxide film, the titanium oxide film is less likely to inhibit current flow between an In—Ga—Zn—O-based oxide semiconductor film and a titanium film.

Figure 48:
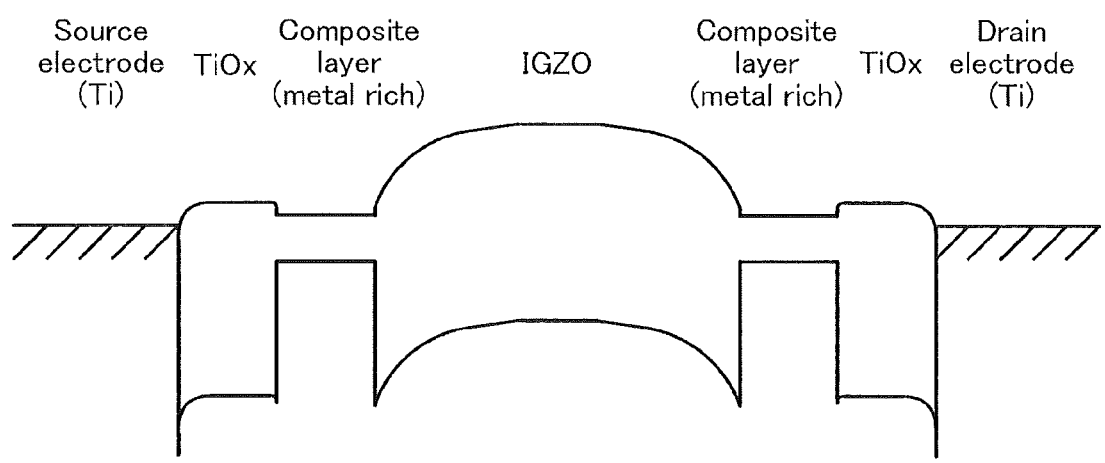
FIG. 48 is a band diagram illustrating an embodiment of the present invention.

FIG. 48 is a diagram showing an energy band between a source electrode and a drain electrode of a thin film transistor. Note that FIG. 48 is a diagram in the case of a thin film transistor where an In—Ga—Zn—O-based (IGZO) film is used as an oxide semiconductor film and $TiO_x$ films are provided between the oxide semiconductor film and the source electrode and between the oxide semiconductor film and the drain electrode. Note that the thickness of each of the $TiO_x$ films is greater than or equal to 0.1 nm and less than or equal to 10 nm. In addition, the above oxide semiconductor film includes much metal (such as In, Ga, and Zn) and is provided with a pair of composite layers which is in contact with the pair of $TiO_x$ films. The electron affinity of the In—Ga—Zn—O-based (IGZO) film in a region other than the composite layers is 4.3 eV, that of the $TiO_x$ film is 4.3 eV, that of Ti as the source electrode or the drain electrode is 4.1 eV, and that of the composite layer is 4.5 eV. Note that in FIG. 48, the position of the band of each substance is changed so that the positions of the Fermi levels are common among the substances. When gate voltage is not applied, the Fermi level in IGZO is in the vicinity of the center of the band gap because IGZO has a small number of carriers, whereas the Fermi levels in the $TiO_x$ film and the composite layer are positioned in the vicinity of the conduction band because the $TiO_x$ film and the composite layer have a large number of carriers. Therefore, in FIG. 48, the value at the position of the conduction band of each substance is different from the above relative value of the electron affinity. As shown in FIG. 48, the composite layer has little variation in the electron affinity; therefore, favorable connection structures can be realized between the oxide semiconductor film and the source electrode and between the oxide semiconductor film and the drain electrode.

This application is based on Japanese Patent Application serial no. 2009-235791 filed with Japan Patent Office on Oct. 9, 2009, the entire contents of which are hereby incorporated by reference.

The invention claimed is:

1. A semiconductor device comprising:
   a first conductive layer and a capacitor wiring over a substrate, wherein each of the first conductive layer and the capacitor wiring contains copper;
   a first insulating layer over the first conductive layer and the capacitor wiring, wherein the first insulating layer contains nitrogen;
   a second insulating layer over the first insulating layer, wherein the second insulating layer contains oxygen;
   an oxide semiconductor layer over the second insulating layer;
   a third insulating layer over the oxide semiconductor layer;
   an opening in the third insulating layer;
   a second conductive layer over the third insulating layer, wherein the second conductive layer is electrically connected to the oxide semiconductor layer through the opening, and wherein the second conductive layer contains at least one selected from the group consisting of W, Ta, Mo, Ti and Cr;
   a third conductive layer over the second conductive layer, wherein the third conductive layer is electrically connected to the oxide semiconductor layer, wherein the third conductive layer contains copper; and
   a fourth conductive layer electrically connected to the oxide semiconductor layer, wherein the fourth conductive layer contains a transparent conductive material, and wherein the fourth conductive layer overlaps the capacitor wiring.

2. The semiconductor device according to claim 1, wherein the first conductive layer further comprises at least one element selected the group consisting of tungsten, tantalum, molybdenum, titanium, chromium, zirconium, and calcium.

3. The semiconductor device according to claim 1, wherein the oxide semiconductor layer comprises at least one of indium, gallium, and zinc.

4. The semiconductor device according to claim 1, wherein the third conductive layer further comprises at least one element selected from the group consisting of tungsten, tantalum, molybdenum, titanium, chromium, zirconium, and calcium.

5. The semiconductor device according to claim 1, wherein the first conductive layer is not overlapped with the oxide semiconductor layer.

6. The semiconductor device according to claim 1, wherein the semiconductor device is incorporated in one selected from the group consisting of electronic paper, an advertisement, an electronic book reader, a television set, a digital photo frame, a portable amusement machine, a slot machine, a portable computer, and a cellular phone.

7. A semiconductor device comprising:
   a first conductive layer and a capacitor wiring over a substrate, wherein each of the first conductive layer and the capacitor wiring contains copper, and wherein each of the first conductive layer and the capacitor wiring has a tapered side surface;
   a first insulating layer over the first conductive layer and the capacitor wiring, wherein the first insulating layer contains nitrogen;
   a second insulating layer over the first insulating layer, wherein the second insulating layer contains oxygen;
   an oxide semiconductor layer over the second insulating layer;
   a third insulating layer over the oxide semiconductor layer;
   an opening in the third insulating layer;
   a second conductive layer over the third insulating layer, wherein the second conductive layer is electrically connected to the oxide semiconductor layer through the opening, and wherein the second conductive layer contains at least one selected from the group consisting of W, Ta, Mo, Ti and Cr;
   a third conductive layer over the second conductive layer, wherein the third conductive layer is electrically connected to the oxide semiconductor layer, wherein the third conductive layer contains copper; and a fourth conductive layer electrically connected to the oxide semiconductor layer, wherein the fourth conductive layer contains a transparent conductive material, and wherein the fourth conductive layer overlaps the capacitor wiring.

8. The semiconductor device according to claim 7, wherein the first conductive layer further comprises at least one element selected the group consisting of tungsten, tantalum, molybdenum, titanium, chromium, zirconium, and calcium.

9. The semiconductor device according to claim 7, wherein the oxide semiconductor layer comprises at least one of indium, gallium, and zinc.

10. The semiconductor device according to claim 7, wherein the third conductive layer further comprises at least one element selected from the group consisting of tungsten, tantalum, molybdenum, titanium, chromium, zirconium, and calcium.

11. The semiconductor device according to claim 7, wherein the first conductive layer is not overlapped with the oxide semiconductor layer.

12. The semiconductor device according to claim 7, wherein the semiconductor device is incorporated in one selected from the group consisting of electronic paper, an advertisement, an electronic book reader, a television set, a digital photo frame, a portable amusement machine, a slot machine, a portable computer, and a cellular phone.

* * * * *

UNITED STATES PATENT AND TRADEMARK OFFICE
CERTIFICATE OF CORRECTION

PATENT NO. : 9,601,635 B2
APPLICATION NO. : 14/924857
DATED : March 21, 2017
INVENTOR(S) : Shunpei Yamazaki et al.

Page 1 of 2

It is certified that error appears in the above-identified patent and that said Letters Patent is hereby corrected as shown below:

In the Specification

Column 1, Line 14, replace "HELD" with --FIELD--;

Column 7, Line 58, replace "202" with --20_2--;

Column 7, Line 60, replace "602" with --60_2--;

Column 23, Line 66, replace "aching" with --ashing--;

Column 27, Line 9, replace "faulted" with --formed--;

Column 27, Line 14, replace "re channel" with --n-channel--;

Column 28, Line 34, replace "in" with --m--;

Column 28, Line 37, replace "in" with --m--;

Column 32, Line 42, replace "faulted" with --formed--;

Column 36, Line 32, replace "56031" with --5603_1--;

Column 36, Line 39, replace "5603$k$" with --5603_k--;

Column 38, Line 52, replace "102" with --10_2--;

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,601,635 B2

Column 51, Line 6, replace "re channel" with --n-channel--; and

Column 73, Line 58, replace "Bom" with --Born--.